(12) United States Patent
Lee et al.

(10) Patent No.: US 9,590,184 B2
(45) Date of Patent: Mar. 7, 2017

(54) ORGANIC LIGHT-EMITTING DIODE

(71) Applicant: Samsung Display Co., Ltd., Yongin, Gyeonggi-Do (KR)

(72) Inventors: Sun-Young Lee, Yongin (KR); Yoon-Hyun Kwak, Yongin (KR); Bum-Woo Park, Yongin (KR); Jong-Won Choi, Yongin (KR); Wha-Il Choi, Yongin (KR); So-Yeon Kim, Yongin (KR); Ji-Youn Lee, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 721 days.

(21) Appl. No.: 14/021,022

(22) Filed: Sep. 9, 2013

(65) Prior Publication Data

US 2014/0183466 A1 Jul. 3, 2014

(30) Foreign Application Priority Data

Dec. 27, 2012 (KR) .................. 10-2012-0155316

(51) Int. Cl.
  *H01L 51/50* (2006.01)
  *H01L 51/00* (2006.01)
  *C09K 11/06* (2006.01)

(52) U.S. Cl.
  CPC ............ *H01L 51/006* (2013.01); *C09K 11/06* (2013.01); *H01L 51/0061* (2013.01); *H01L 51/0072* (2013.01); *C09K 2211/1044* (2013.01); *C09K 2211/1074* (2013.01); *H01L 51/0067* (2013.01); *H01L 51/0085* (2013.01);
  (Continued)

(58) Field of Classification Search
  None
  See application file for complete search history.

(56) References Cited

U.S. PATENT DOCUMENTS

| | | |
|---|---|---|
| 5,635,308 A | 6/1997 | Inoue et al. |
| 5,645,948 A | 7/1997 | Shi et al. |
| 5,972,247 A | 10/1999 | Shi et al. |

(Continued)

FOREIGN PATENT DOCUMENTS

| | | |
|---|---|---|
| JP | 1996-12600 A | 1/1996 |
| JP | 2000-003782 A | 1/2000 |

(Continued)

*Primary Examiner* — Gregory Clark
(74) *Attorney, Agent, or Firm* — Robert E. Bushnell, Esq.

(57) ABSTRACT

An organic light-emitting diode (OLED) is provided. The OLED comprises a substrate, a first electrode on the substrate, a second electrode disposed opposite to the first electrode, an emission layer disposed between the first electrode and the second electrode, a hole migration region disposed between the first electrode and the emission layer, and an electron migration region disposed between the emission layer and the second electrode. The hole migration region comprises a tertiary amine having one N-substituent comprising a substituted or unsubstituted carbazole moiety and another N-substituent comprising a substituted or unsubstituted fluorene moiety. At least one of the hole migration region and the emission layer comprises a substituted or unsubstituted compound comprising at least two carbazole moieties.

20 Claims, 3 Drawing Sheets

(52) U.S. Cl.
CPC .......... *H01L 51/0087* (2013.01); *H01L 51/50* (2013.01); *H01L 2251/308* (2013.01)

(56) References Cited

U.S. PATENT DOCUMENTS

| | | |
|---|---|---|
| 6,465,115 B2 | 10/2002 | Shi et al. |
| 6,596,415 B2 | 7/2003 | Shi et al. |
| 7,431,997 B2 | 10/2008 | Hwang et al. |
| 7,737,627 B2 | 6/2010 | Hwang et al. |
| 2005/0221124 A1 | 10/2005 | Hwang et al. |
| 2012/0043531 A1* | 2/2012 | Jung ................ H01L 51/006 257/40 |
| 2012/0211736 A1 | 8/2012 | Kim et al. |

FOREIGN PATENT DOCUMENTS

| | | | | |
|---|---|---|---|---|
| JP | 2008-135498 | * | 6/2008 | ............ H01L 51/50 |
| KR | 10-2005-0097670 A | | 10/2005 | |
| KR | 10-0573137 B1 | | 4/2006 | |
| KR | 10-2011-004840 A | | 5/2011 | |
| KR | 10-2011-0122051 A | | 11/2011 | |
| KR | 10-2012-0017382 A | | 2/2012 | |
| WO | 2011/139055 A2 | | 11/2011 | |

* cited by examiner

ORGANIC LIGHT-EMITTING DIODE

CLAIM OF PRIORITY

This application makes reference to, incorporates the same herein, and claims all benefits accruing under 35 U.S.C. §119 from an application for ORGANIC LIGHT-EMITTING DIODE, earlier filed in the Korean Intellectual Property Office on Dec. 27, 2012 and there duly assigned Serial No. 10-2012-0155316.

BACKGROUND OF THE INVENTION

Field of the Invention

One or more embodiments of the present invention relate to an organic light-emitting diode.

Description of the Related Art

Organic light-emitting diodes (OLEDs), which are self-emitting diodes, have advantages such as wide viewing angles, excellent contrast, quick response, high brightness and excellent driving voltage characteristics, and they can provide multicolored images.

A typical OLED has a structure including a substrate, and an anode, a hole transport layer (HTL), a second electrode (EML), an electron transport layer (ETL), and a cathode, which are sequentially stacked on the substrate. In this regard, the HTL, the EML, and the ETL are organic thin films formed of organic compounds.

An operating principle of an OLED having the above-described structure is as follows.

When a voltage is applied between the anode and the cathode, holes injected from the anode move to the EML via the HTL, and electrons injected from the cathode move to the EML via the ETL. The holes and electrons recombine in the EML to generate excitons. When the excitons drop from an excited state to a ground state, light is emitted.

SUMMARY OF THE INVENTION

One or more embodiments of the present invention include an organic light-emitting diode having a novel structure.

Additional aspects will be set forth in part in the description which follows and, in part, will be apparent from the description, or may be learned by practice of the presented embodiments.

According to one or more embodiments of the present invention, an organic light-emitting diode includes: a substrate; a first electrode on the substrate; a second electrode disposed opposite to the first electrode; an emission layer disposed between the first electrode and the second electrode; a hole migration region disposed between the first electrode and the emission layer; and an electron migration region disposed between the emission layer and the second electrode, wherein the hole migration region includes a first compound represented by Formula 1 below, and at least one of the hole migration region and the emission layer includes a second compound represented by Formula 2 below:

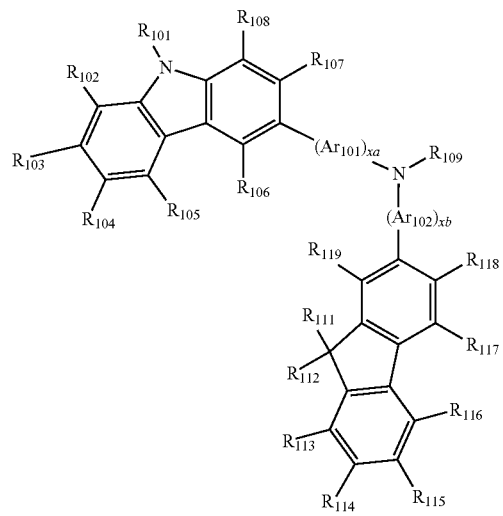

<Formula 1>

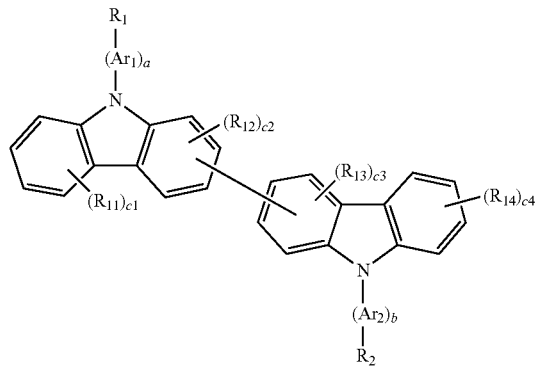

<Formula 2> wherein, in Formulae 1 and 2, $Ar_{101}$, $Ar_{102}$, $Ar_1$, and $Ar_2$ are each independently selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, and a substituted or unsubstituted $C_2$-$C_{60}$ heteroarylene group;

xa, xb, a, and b are each independently an integer from 0 to 5;

$R_{101}$, $R_{109}$, $R_1$, and $R_2$ are each independently selected from a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, and a substituted or unsubstituted $C_2$-$C_{60}$ heteroaryl group;

$R_{102}$ to $R_{108}$, $R_{111}$ to $R_{119}$, and $R_1$ to $R_4$ are each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, —N($Q_1$)($Q_2$) and —Si($Q_3$)($Q_4$)($Q_5$) (where $Q_1$ to $Q_5$ are each independently one of a $C_1$-$C_{60}$ alkyl group, a $C_1$-$C_{60}$ alkoxy group, a $C_6$-$C_{60}$ aryl group, and a $C_2$-$C_{60}$ heteroaryl group);

c1 and c4 are each independently an integer from 1 to 4; and c2 and c3 are each independently an integer from 1 to 3.

The hole migration region of the organic light-emitting diode may include i) a first hole transport layer, and ii) a second hole transport layer disposed between the first hole transport layer and the emission layer; and the first compound may be in the first hole transport layer, and the second compound may be in the second hole transport layer.

The hole migration region of the organic light-emitting diode may include a hole transport layer, the first compound may be in the hole transport layer, and the second compound may be in the emission layer.

BRIEF DESCRIPTION OF THE DRAWINGS

A more complete appreciation of the invention and many of the attendant advantages thereof will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
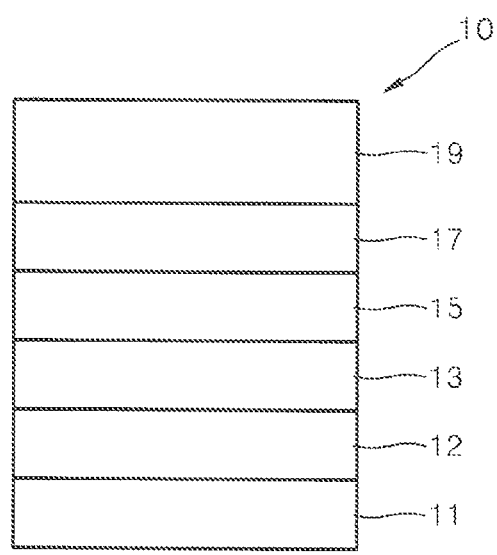
FIG. 1 is a schematic view of a structure of an organic light-emitting diode according to an embodiment of the present invention.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Referring to FIG. 1, an organic light emitting diode 10 according to an embodiment of the present invention may have a structure including a substrate 11, a first electrode 12, a hole migration region 13, an emission layer (EML) 15, an electron migration region 17, and a second electrode 19 that are sequentially stacked on one another.

The substrate 11 may be any substrate that is used in existing organic light-emitting diodes. In some embodiments, the substrate 11 may be a glass substrate or a transparent plastic substrate with strong mechanical strength, thermal stability, transparency, surface smoothness, ease of handling, and water resistance.

The first electrode 12 may be formed by depositing or sputtering a first electrode-forming material on the substrate 11. When the first electrode 12 is an anode, a material having a high work function may be used as the first electrode-forming material to facilitate hole injection. The first electrode 12 may be a reflective electrode or a transmission electrode. Transparent and conductive materials such as ITO, IZO, $SnO_2$, and ZnO may be used to form the first electrode 12. The first electrode 12 may be formed as a reflective electrode using one of magnesium (Mg), aluminum (Al), aluminum-lithium (Al—Li), calcium (Ca), magnesium-indium (Mg—In), magnesium-silver (Mg—Ag) and the like.

The first electrode 12 may have a single-layer structure or a multi-layer structure including at least two layers. For example, the first electrode 12 may have a three-layered structure of ITO/Ag/ITO, but is not limited thereto.

The first electrode 12 may be a hole-injecting electrode (anode).

The second electrode 19 may be disposed opposite to the first electrode 12. The second electrode 19 may be a cathode, which is an electron injecting electrode. A metal for forming the second electrode 9 may be one of a metal, an alloy, an electrically conductive compound, which has a low-work function, and a mixture thereof. In this regard, the second electrode 19 may be formed of one of lithium (Li), magnesium (Mg), aluminum (Al), aluminum (Al)-lithium (Li), calcium (Ca), magnesium (Mg)-indium (In), magnesium (Mg)-silver (Ag), and the like, and may be formed as a thin film type transmission electrode. In some embodiments, to manufacture a top-emission light-emitting diode, the transmission electrode may be formed of one of indium tin oxide (ITO) and indium zinc oxide (IZO).

The EML 15 may be disposed between the first electrode 12 and the second electrode 19, the hole migration region 13 may be disposed between the first electrode 12 and the EML 15, and the electron migration region 17 may be disposed between the EML 15 and the second electrode.

In the organic light-emitting diode 10, holes may be injected through the first electrode 12 to migrate to the EML 15 through the hole migration region 13, while electrons may be injected through second electrode 19 to migrate to the EML 15 through the electron migration region 17. The holes and electrons may recombine in the EML 15 to generate excitons. When the excitons drop from an excited state to a ground state, light is emitted.

The hole migration region 13 may include a first compound represented by Formula 1 below, and at least one of the hole migration region 13 and the EML 15 may include a second compound represented by Formula 2 below.

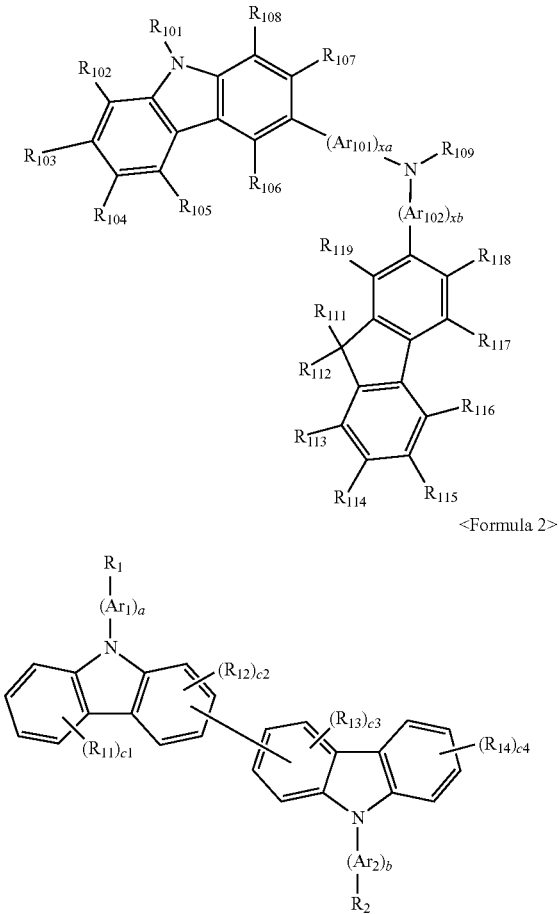

<Formula 1>

<Formula 2>

In Formulae 1 and 2, $Ar_{101}$, $Ar_{102}$, $Ar_1$, and $Ar_2$ may each independently be selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, and a substituted or unsubstituted $C_2$-$C_{60}$ heteroarylene group.

For example, in Formulae 1 and 2, $Ar_{101}$, $Ar_{102}$, $Ar_1$, and $Ar_2$ may be each independently one of a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted spiro-fluorenylene group, a substituted or unsubstituted phenalenylene group, a substituted or unsubstituted phenanthrenylene group, a substituted or unsubstituted anthrylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted imidazolylene group, a substituted or unsubstituted pyrazolylene group, a substituted or unsubstituted pyridinylene group, a substituted or unsubstituted pyrazinylene group, a substituted or unsubstituted pyrimidinylene group, a substituted or unsubstituted pyridazinylene group, a substituted or unsubstituted isoindolylene group, a substituted or unsubstituted indolylene group, a substituted or unsubstituted indazolylene group, a substituted or unsubstituted purinylene group, a substituted or unsubstituted quinolinylene group, a substituted or unsubstituted benzoquinolinylene group, a substituted or unsubstituted phthalazinylene group, a substituted or unsubstituted naphthyridinylene group, a substituted or unsubstituted quinoxalinylene group, a substituted or unsubstituted quinazolinylene group, a substituted or unsubstituted cinnolinylene group, a substituted or unsubstituted carbazolylene group, a substituted or unsubstituted phenanthridinylene group, a substituted or unsubstituted acridinylene group, a substituted or unsubstituted phenanthrolinylene group, a substituted or unsubstituted phenazinylene group, a substituted or unsubstituted benzooxazolylene group, a substituted or unsubstituted benzoimidazolylene group, a substituted or unsubstituted furanylene group, a substituted or unsubstituted benzofuranylene group, a substituted or unsubstituted thiophenylene group, a substituted or unsubstituted benzothiophenylene group, a substituted or unsubstituted thiazolylene group, a substituted or unsubstituted isothiazolylene group, a substituted or unsubstituted benzothiazolylene group, a substituted or unsubstituted isoxazolylene group, a substituted or unsubstituted oxazolylene group, a substituted or unsubstituted triazolylene group, a substituted or unsubstituted tetrazolylene group, a substituted or unsubstituted oxadiazolylene group, a substituted or unsubstituted triazinylene group, a substituted or unsubstituted benzooxazolylene group, a substituted or unsubstituted dibenzofuranylene group, a substituted or unsubstituted dibenzothiophenylene group, and a substituted or unsubstituted benzocarbazolyl group.

In some embodiments, $Ar_{101}$, $Ar_{102}$, $Ar_1$, and $Ar_2$ in Formulae 1 and 2 may be each independently a group represented by Formulae 3-1 to 3-24 below:

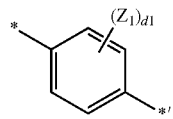

Formula 3-1

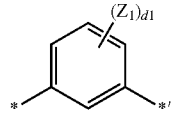

Formula 3-2

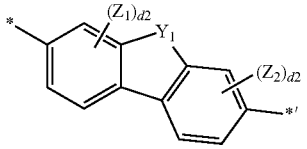

Formula 3-3

-continued

Formula 3-4
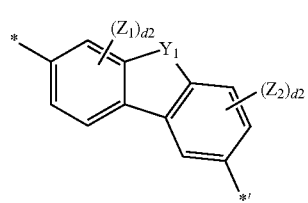

Formula 3-5
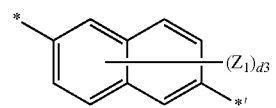

Formula 3-6
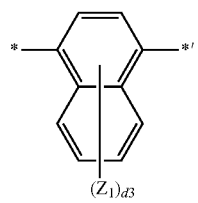

Formula 3-7
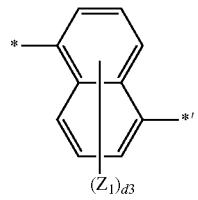

Formula 3-8
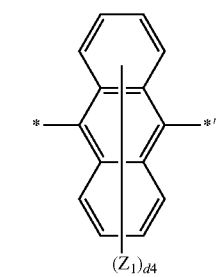

Formula 3-9
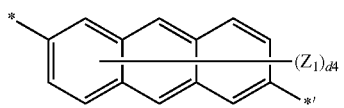

Formula 3-10
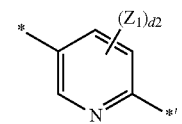

Formula 3-11
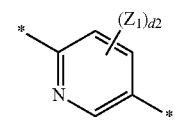

Formula 3-12
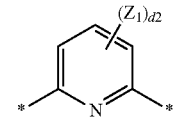

Formula 3-13
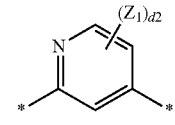

-continued

Formula 3-14

Formula 3-15
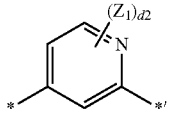

Formula 3-16
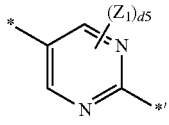

Formula 3-17
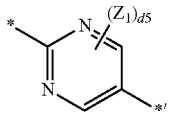

Formula 3-18
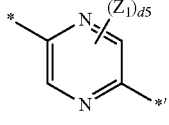

Formula 3-19
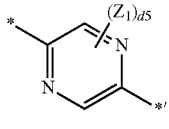

Formula 3-20
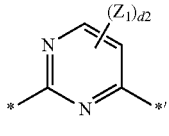

Formula 3-21
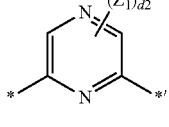

Formula 3-22
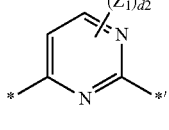

Formula 3-23
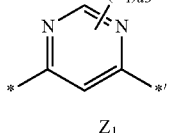

Formula 3-24
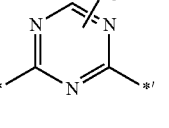

In Formulae 3-1 to 3-24, $Y_1$ may be O, S, $C(R_{21})(R_{22})$, or $N(R_{23})$.

In Formulae 3-1 to 3-24, $Z_1$, $Z_2$, and $R_{21}$ to $R_{23}$ may be each independently selected from among:

a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof;

a $C_6$-$C_{20}$ aryl group and a $C_2$-$C_{20}$ heteroaryl group;

a $C_6$-$C_{20}$ aryl group and a $C_2$-$C_{20}$ heteroaryl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfuorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and —N($Q_{11}$)($Q_{12}$) and —Si($Q_{13}$)($Q_{14}$)($Q_{15}$) (where $Q_{11}$ to $Q_{15}$ are each independently one of a $C_1$-$C_{20}$ alkyl group, a $C_1$-$C_{20}$ alkoxy group, a $C_6$-$C_{20}$ aryl group, and a $C_2$-$C_{20}$ heteroaryl group).

For example, $Z_1$, $Z_2$, and $R_{21}$ to $R_{23}$ may be each independently selected from among:

a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group, and a $C_1$-$C_{20}$ alkoxy group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and —N($Q_{11}$)($Q_{12}$) and —Si($Q_{13}$)($Q_{14}$)($Q_{15}$) (where $Q_{11}$ to $Q_{15}$ are each independently a $C_1$-$C_{20}$ alkyl group, a $C_1$-$C_{20}$ alkoxy group, a phenyl group, a naphthyl group, an anthryl group, a fluorenyl group, a dimethylfuorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group), but are not limited thereto.

In Formulae 2-1 to 2-24 above, d1 may be an integer from 1 to 4; d2 may be an integer from 1 to 3; d3 may be an integer from 1 to 6; d4 may be an integer from 1 to 8; and d5 may be an integer of 1 or 2.

In some embodiments, $Ar_{101}$, $Ar_{102}$, $Ar_1$, and $Ar_2$ in Formulae 1 and 2 may be each independently a group represented by one of Formulae 4-1 to 4-7 below, but are not limited thereto:

Formula 4-1

Formula 4-2

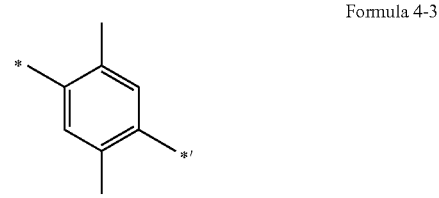

Formula 4-3

Formula 4-4

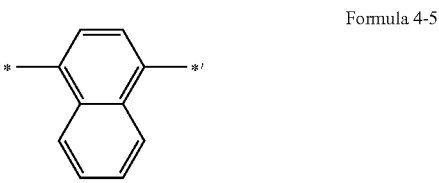

Formula 4-5

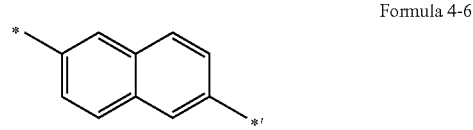

Formula 4-6

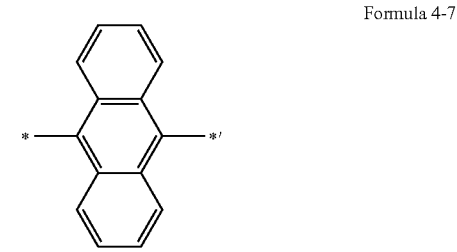

Formula 4-7

In Formula 1 above, xa indicates number of $Ar_{101}$s, and xb indicates number of $Ar_{102}$s, xa and xb each being independently an integer from 0 to 5. When xa and/or xb is 0, "carbazole" and/or "fluorene" in Formula 1 may be linked directly to "N". When xa is 2 or greater, the at least two of $Ar_{101}$s may be identical to or differ from each other. When xb is 2 or greater, the at least two of $Ar_{102}$s may be identical to or differ from each other.

In some embodiments, in Formula 1, i) xa=0 and xb=0; ii) xa=1 and xb=0; iii) xa=2 and xb=0; iv) xa=0 and xb=1; v) xa=0 and xb=2; or vi) xa=1 and xb=1, but they are not limited thereto.

In Formula 2, a indicates number of $Ar_1$s, and b indicates number of $Ar_2$s, a and b each being independently an integer from 0 to 5. When a and/or b is 0, "$R_1$" and/or "$R_2$" in Formula 2 may be linked directly to "N" of carbazole in Formula 2. When a is 2 or greater, the at least two of $Ar_1$s may be identical to or differ from each other. When b is 2 or greater, the at least two of $Ar_2$s may be identical to or differ from each other.

In some other embodiments, in Formula 2, i) a=0 and b=0; ii) a=1 and b=0; iii) a=0 and b=1; or iv) a=1 and b=1, but they are not limited thereto In Formulae 1 and 2 above, $R_{101}$, $R_{109}$, $R_1$, and $R_2$ may be each independently one of a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, and a substituted or unsubstituted $C_2$-$C_{60}$ heteroaryl group.

For example, in Formulae 1 and 2 above, $R_{101}$, $R_{109}$, $R_1$, and $R_2$ may be each independently one of a substituted or unsubstituted phenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted fluorenyl group, a substituted or unsubstituted spiro-fluorenyl group, a substituted or unsubstituted phenalenyl group, a substituted or unsubstituted phenanthrenyl group, a substituted or unsubstituted anthryl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted imidazolyl group, a substituted or unsubstituted pyrazolyl group, a substituted or unsubstituted pyridinyl group, a substituted or unsubstituted pyrazinyl group, a substituted or unsubstituted pyrimidinyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted carbazolyl group, a substituted or unsubstituted phenanthridinyl group, a substituted or unsubstituted acridinyl group, a substituted or unsubstituted phenanthrolinyl group, a substituted or unsubstituted phenazinyl group, a substituted or unsubstituted benzooxazolyl group, a substituted or unsubstituted benzoimidazolyl group, a substituted or unsubstituted furanyl group, a substituted or unsubstituted benzofuranyl group, a substituted or unsubstituted thiophenyl group, a substituted or unsubstituted benzothiophenyl group, a substituted or unsubstituted thiazolyl group, a substituted or unsubstituted isothiazolyl group, a substituted or unsubstituted benzothiazolyl group, a substituted or unsubstituted isoxazolyl group, a substituted or unsubstituted oxazolyl group, a substituted or unsubstituted triazolyl group, a substituted or unsubstituted tetrazolyl group, a substituted or unsubstituted oxadiazolyl group, a substituted or unsubstituted triazinyl group, a substituted or unsubstituted benzooxazolyl group, a substituted or unsubstituted dibenzopuranyl group, a substituted or unsubstituted dibenzothiophenyl group, and a substituted or unsubstituted benzocarbazolyl group.

In some other embodiments, $R_{101}$, $R_{109}$, $R_1$, and $R_2$ in Formulae 1 and 2 may be each independently a group represented by one of Formulae 5-1 to 5-22 below.

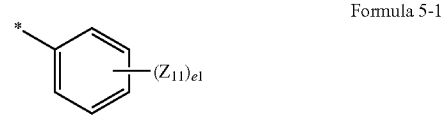

Formula 5-1

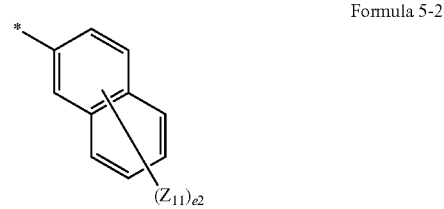

Formula 5-2

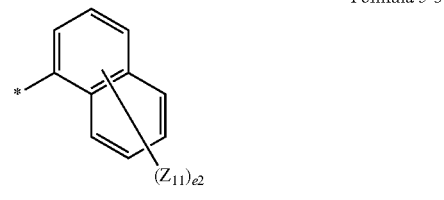

Formula 5-3

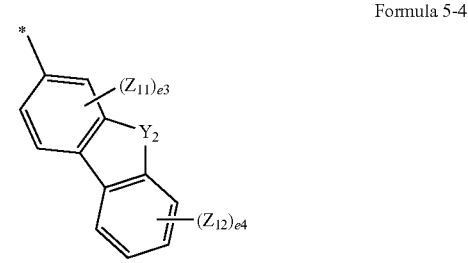

Formula 5-4

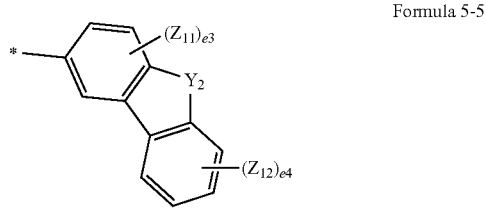

Formula 5-5

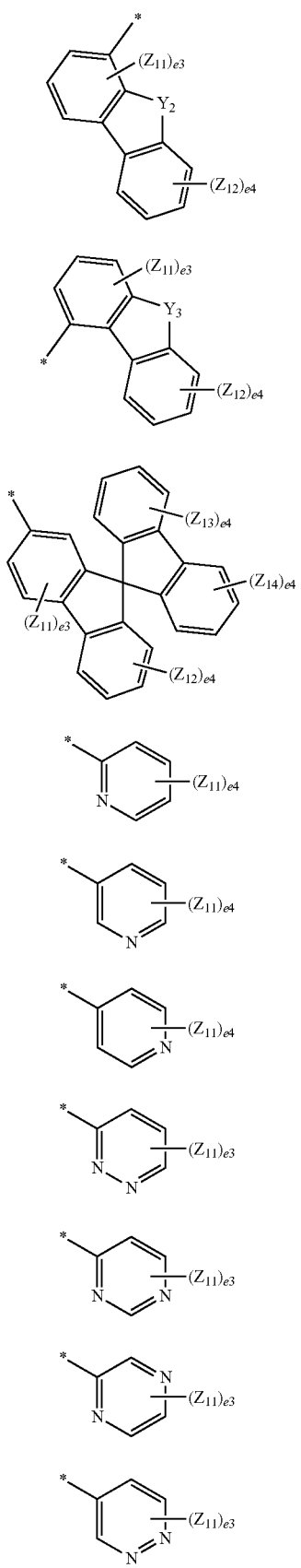
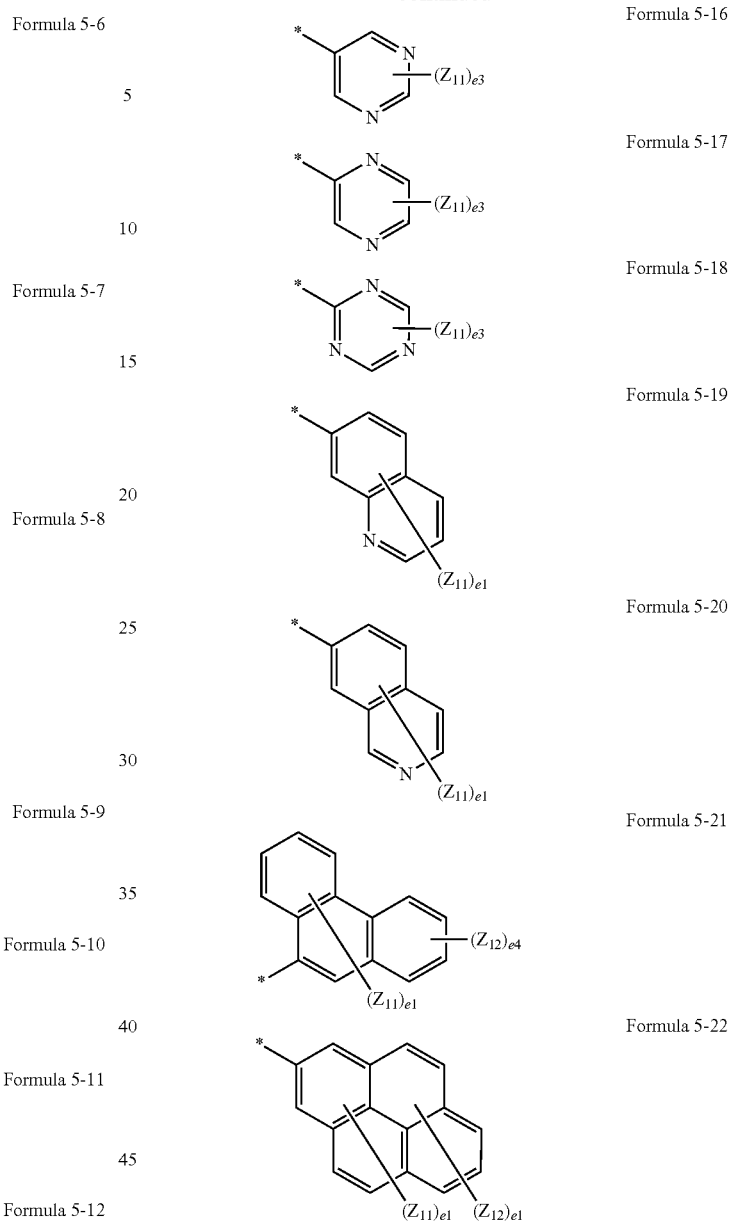

In Formulae 5-1 to 5-22, $Y_2$ and $Y_3$ may be one of O, S, $C(R_{25})(R_{26})$, and $N(R_{27})$.

In Formulae 5-1 to 5-22, $Z_{11}$ to $Z_{14}$, and $R_{25}$ to $R_{27}$ may be each independently selected from among:

a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof;

a $C_6$-$C_{20}$ aryl group, and a $C_2$-$C_{20}$ heteroaryl group;

a $C_6$-$C_{20}$ aryl group and a $C_2$-$C_{20}$ heteroaryl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and —N($Q_{11}$)($Q_{12}$) and —Si($Q_{13}$)($Q_{14}$)($Q_{15}$) (where $Q_{11}$ to $Q_{15}$ are each independently one of a $C_1$-$C_{20}$ alkyl group, a $C_1$-$C_{20}$ alkoxy group, a $C_6$-$C_{20}$ aryl group, and a $C_2$-$C_{20}$ heteroaryl group).

For example, $Z_{11}$ to $Z_{14}$, and $R_{25}$ to $R_{27}$ in Formulae 5-1 to 5-22 may be each independently selected from among:

a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and —N($Q_{11}$)($Q_{12}$) and —Si($Q_{13}$)($Q_{14}$)($Q_{15}$) (where $Q_{11}$ to $Q_{15}$ are each independently one of a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group, but are not limited thereto.

In Formulae 5-1 to 5-22, e1 may be an integer from 1 to 5; e2 may be an integer from 1 to 7; e3 may be an integer from 1 to 3; e4 may be an integer from 1 to 4; and e5 may be an integer from 1 or 2.

For example, $R_{101}$ in Formula 1 may be a group represented by one of Formulae 6-1 to 6-8 below, and $R_{109}$ in Formula 1 may be a group represented by one of Formulae Formula 6-1 to 6-11 below:

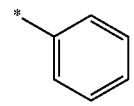

Formula 6-1

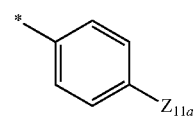

Formula 6-2

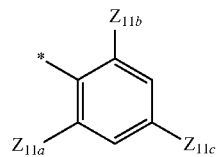

Formula 6-3

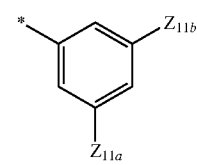

Formula 6-4

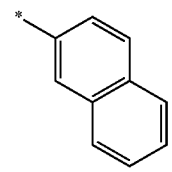

Formula 6-5

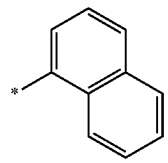

Formula 6-6

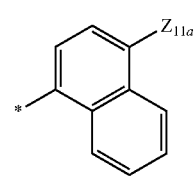

Formula 6-7

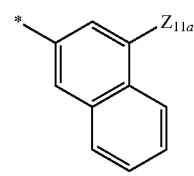

Formula 6-8

Formula 6-9

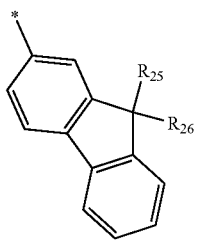

Formula 6-10

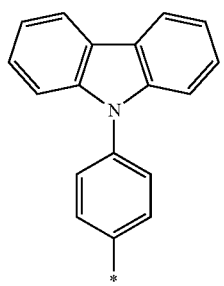

Formula 6-11

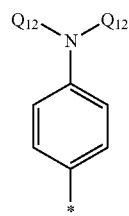

In Formulae 6-1 to 6-11, $Z_{11a}$ to $Z_{11c}$ may be defined the same as $Z_{11}$ described above, and $R_{25}$, $R_{26}$, $Q_{11}$, and $Q_{12}$ may be defined the same as described herein.

For example, in Formulae 6-1 to 6-11, $Z_{11a}$ to $Z_{11c}$, $R_{25}$, and $R_{26}$ may be each independently selected from among:

a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and $Q_{11}$ and $Q_{12}$ may be each independently one of a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group.

For example, $R_1$ and $R_2$ in Formula 2 may be each independently a group represented by one of Formulae 6-1 to 6-17 below:

Formula 6-1

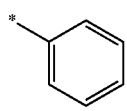

Formula 6-2

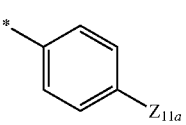

Formula 6-3

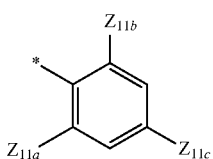

Formula 6-4

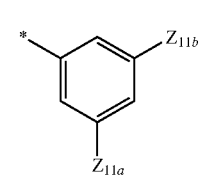

Formula 6-5

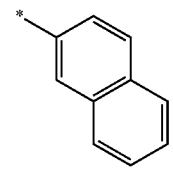

Formula 6-6

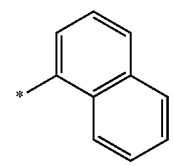

Formula 6-7

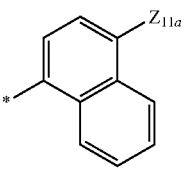

Formula 6-8

-continued

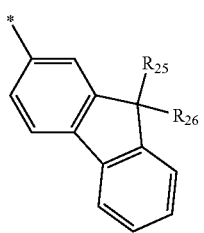

Formula 6-9

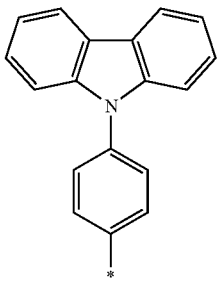

Formula 6-10

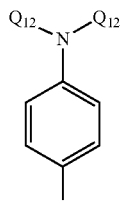

Formula 6-11

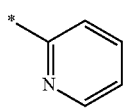

Formula 6-12

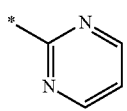

Formula 6-13

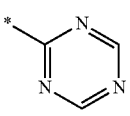

Formula 6-14

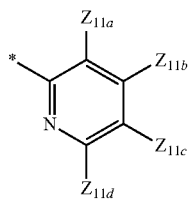

Formula 6-15

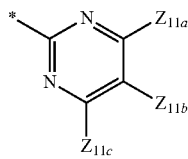

Formula 6-16

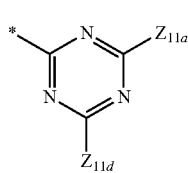

Formula 6-17

In Formulae 6-1 to 6-17, $Z_{11a}$ to $Z_{11d}$ may be defined the same as $Z_{11}$ described above, and $R_{25}$, $R_{26}$, $Q_{11}$, and $Q_{12}$ may be defined the same as described herein.

For example, in Formulae 6-1 to 6-17, $Z_{11a}$ to $Z_{11d}$, and $R_{25}$ and $R_{26}$ may be each independently selected from among:

a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group; and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and $Q_{11}$ and $Q_{12}$ may be each independently one of a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group.

In some other embodiments, $R_{102}$ to $R_{108}$, and $R_{113}$ to $R_{119}$ in Formula 1 above, and $R_{11}$ to $R_{14}$ in Formula 2 above may be each independently selected from among:

a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group; and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group, but they are not limited thereto.

For example, $R_{102}$ to $R_{108}$ and $R_{113}$ to $R_{119}$ in Formula 1 above, and $R_{11}$ to $R_{14}$ in Formula 2 above may be hydrogen atoms.

In some embodiments, the first compound may be a compound represented by one of Formulas 1A, 1B and 1C below, and the second compound may be a compound represented by one of Formulas 2A, 2B and 2C below:

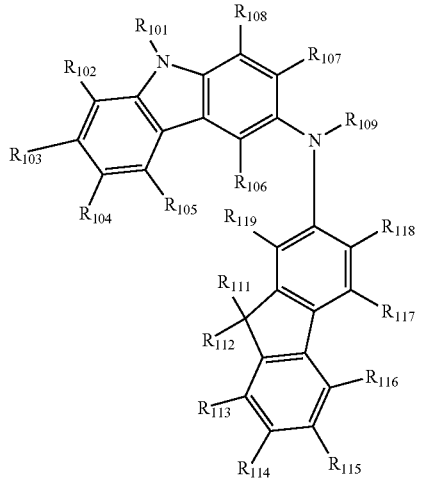
<Formula 1A>

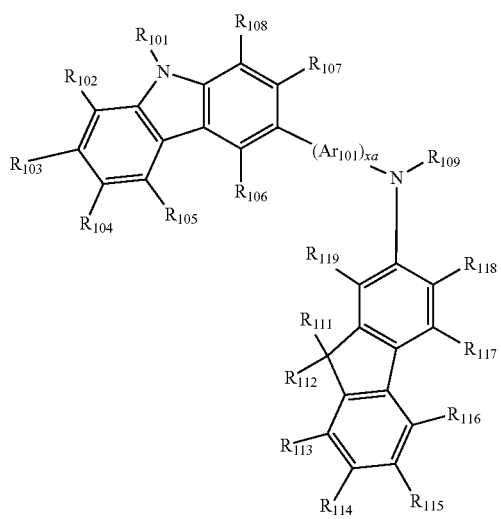
<Formula 1B>

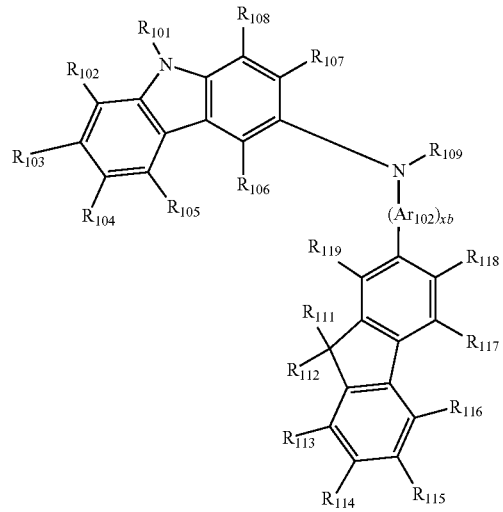
<Formula 1C>

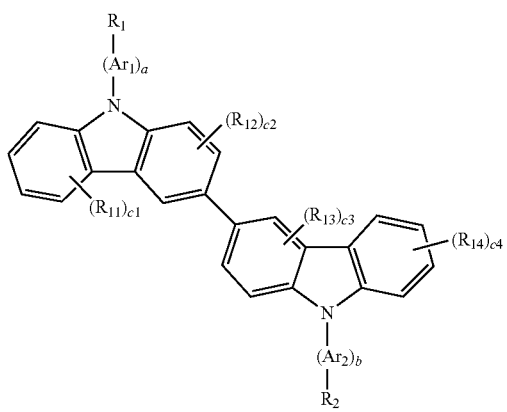
<Formula 2A>

<Formula 2B>

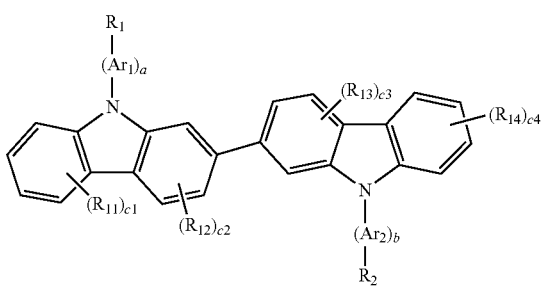
<Formula 2C>

In Formulae 1A, 1B, 1C, 2A, 2B, and 2C, $Ar_{101}$, $Ar_{102}$, xa, xb, $R_{101}$ to $R_{109}$, $R_{111}$ to $R_{119}$, $R_1$, $R_2$, $R_{11}$ to $R_{14}$, a, b, c1, c2, c3, and c4 may be defined the same as described herein.

For example, in Formulae 1A, 1B, and 1C, $Ar_{101}$ and $Ar_{102}$ may be each independently a group represented by one of Formulae 3-1 to 3-24;

xa and xb may be each independently 1 or 2;

$R_{101}$ and $R_{109}$ may be each independently a group represented by one of Formulae 5-1 to 5-22;

$R_{111}$ and $R_{112}$ may be each independently one of a $C_1$-$C_{20}$ alkyl group; a $C_1$-$C_{20}$ alkyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group; and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and $R_{102}$ to $R_{108}$ and $R_{113}$ to $R_{119}$ may be each independently selected from:

a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group; and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group, but are not limited thereto.

For example, in Formulae 1A, 1B, and 1C, $Ar_{101}$ and $Ar_{102}$ may be each independently a group represented by one of Formulae 4-1 to 4-7;

xa and xb may be each independently 1 or 2;

$R_{101}$ may be a group represented by one of Formulae 6-1 to 6-8;

$R_{109}$ may be a group represented by one of Formulae 6-1 to 6-11;

$R_{111}$ and $R_{112}$ may be each independently one of a $C_1$-$C_{20}$ alkyl group; a $C_1$-$C_{20}$ alkyl group that is substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group; and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group that are substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and $R_{102}$ to $R_{108}$ and $R_{113}$ to $R_{119}$ may be hydrogen atoms.

In some embodiments, in Formulae 2A, 2B, and 2C, $Ar_1$ and $Ar_2$ may be each independently a group represented by one of Formulae 3-1 to 3-24;

i) a=0 and b=0, ii) a=1 and b=0, iii) a=0 and b=1, or iv) a=1 and b=1;

$R_1$ and $R_2$ may be each independently a group represented by one of Formulae 5-1 to 5-22; and $R_{11}$ to $R_{14}$ may be each independently one of a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group; a $C_1$-$C_{20}$ alkyl group and a $C_1$-$C_{20}$ alkoxy group that are substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group; and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group, but they are not limited thereto.

In some other embodiments, in Formulae 2A, 2B, and 2C, $Ar_1$ and $Ar_e$ may be each independently a group represented by one of Formulae 4-1 to 4-7; i) a=0 and b=0, ii) a=1 and b=0, iii) a=0 and b=1, or iv) a=1 & b=1; $R_1$ and $R_2$ may be each independently a group represented by one of Formulae 6-1 to 6-17; and $R_{11}$ to $R_{14}$ may be hydrogen atoms, but they are not limited thereto.

In some embodiments, the first compound of Formula 1 above may include one of Compounds 1-1 to 1-19 below, but it is not limited thereto:

1-1
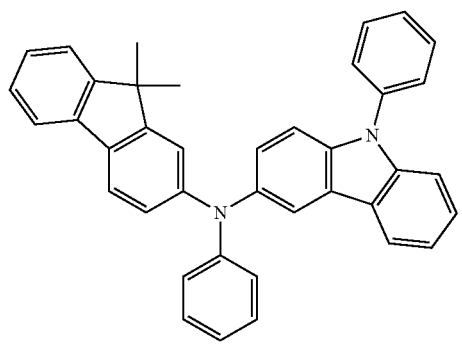

1-2
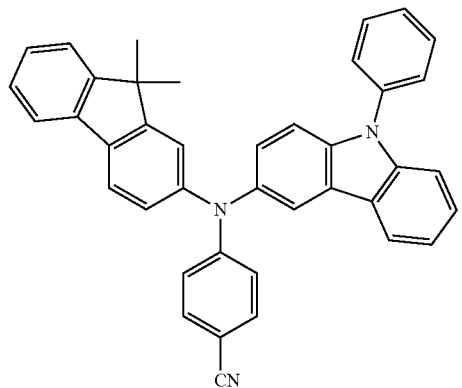

1-3
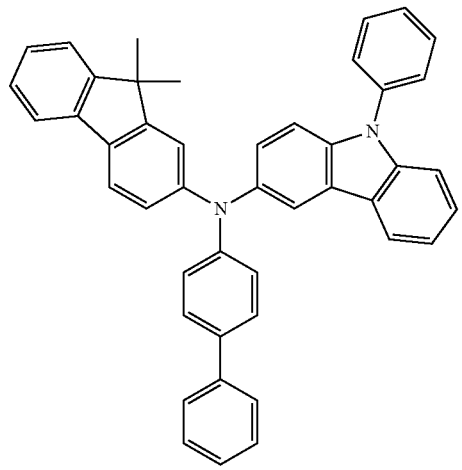

1-4
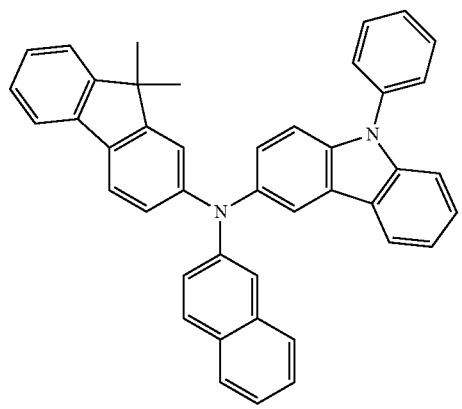

1-5
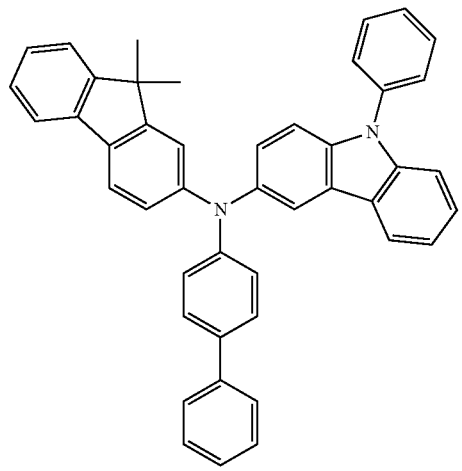

1-6
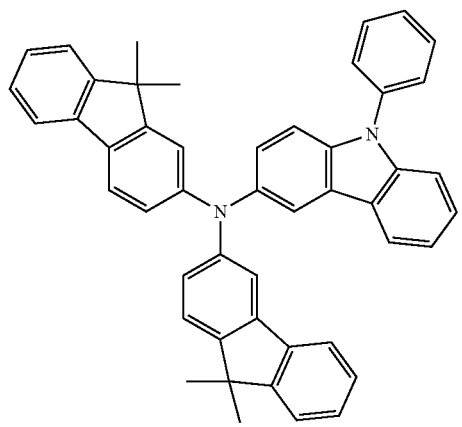
1-7
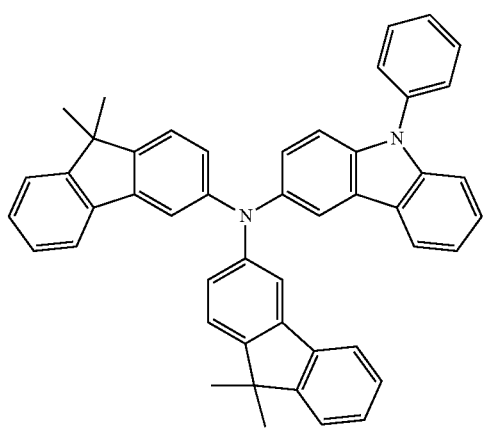
1-8
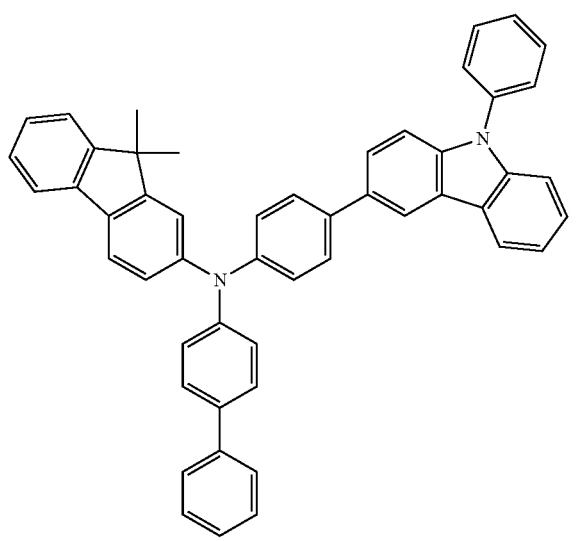
1-9
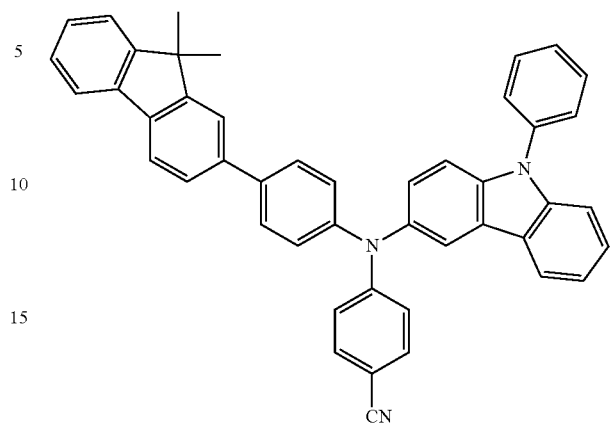
1-10
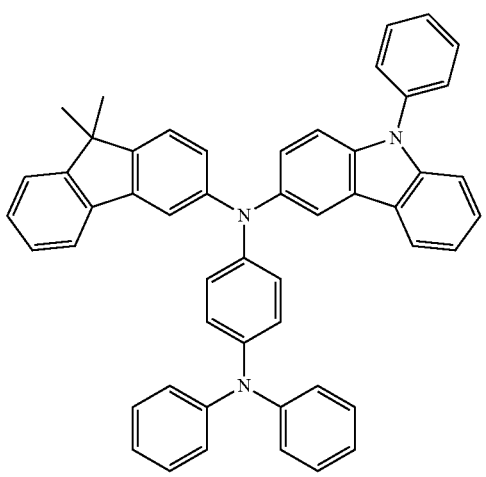
1-11
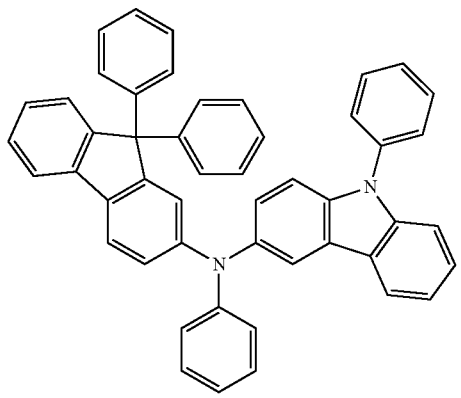

-continued
1-12
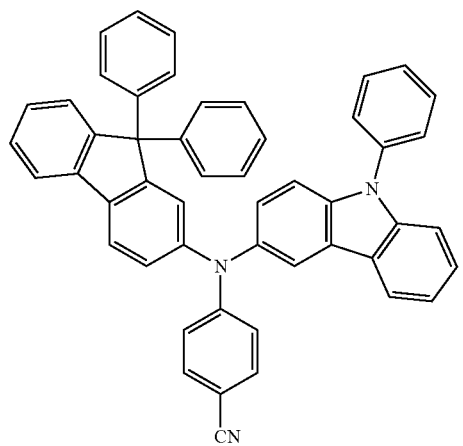
1-13
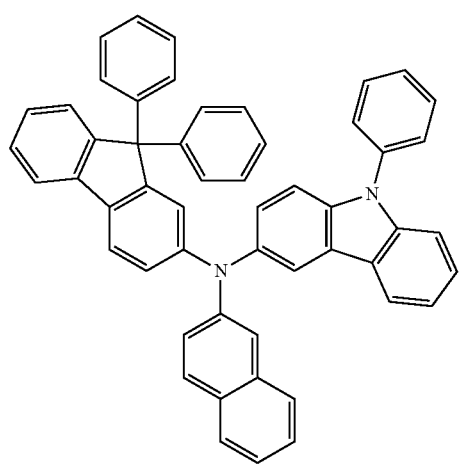
1-14
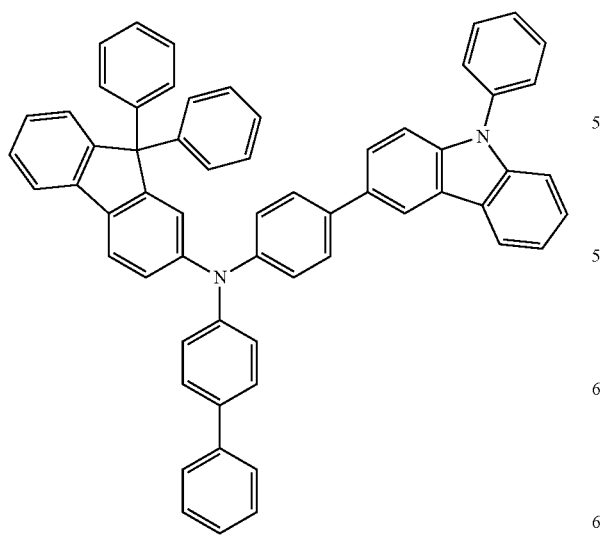
-continued
1-15
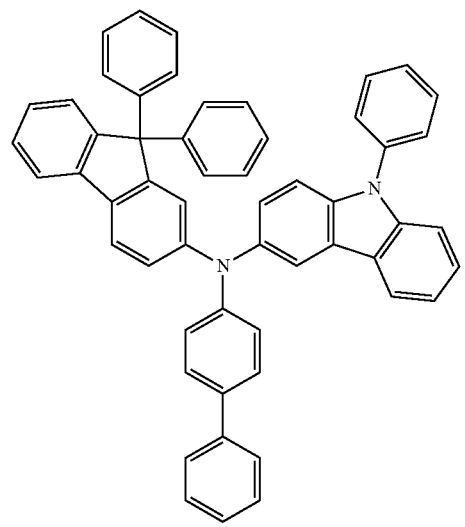
1-16
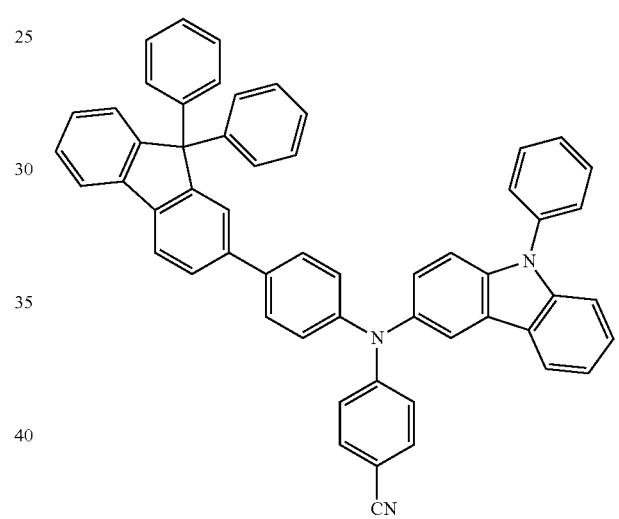
1-17
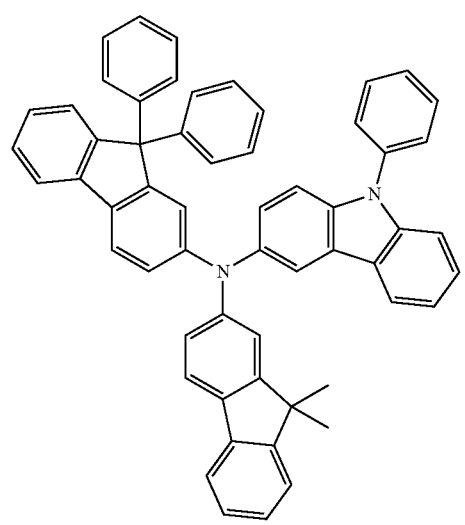

1-18
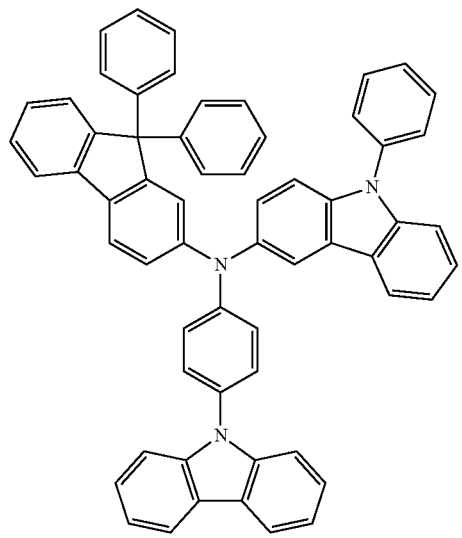
1-19
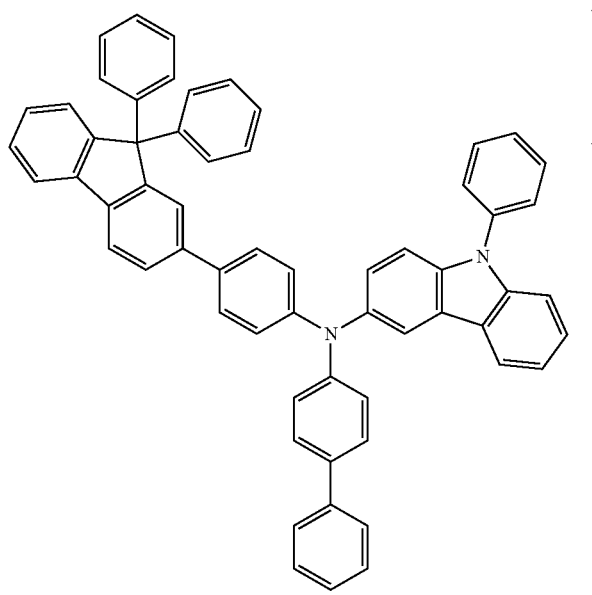
The second compound of Formula 2 above may include one of Compounds 2-1 to 2-25 below, but it is not limited thereto:
2-1
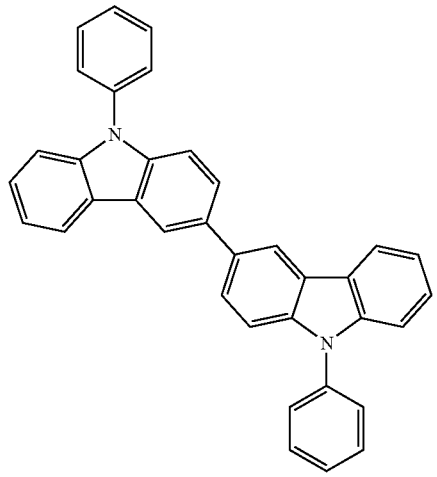
2-2
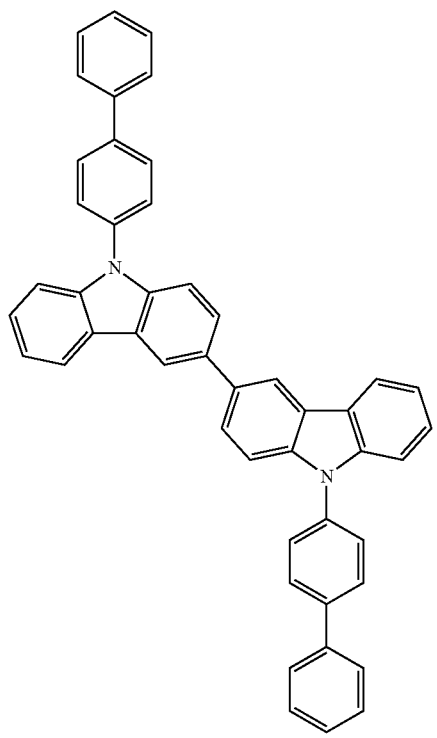

-continued
2-3
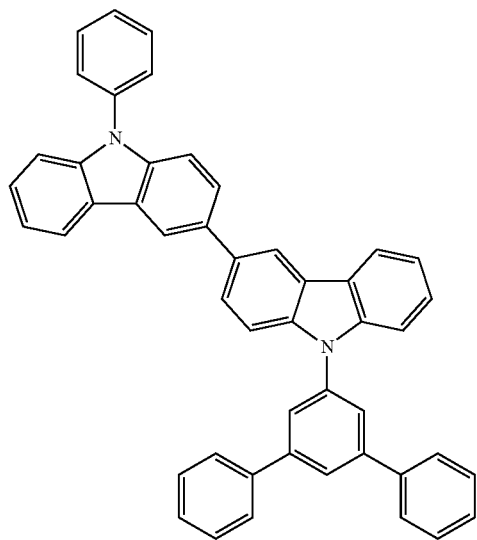
2-4
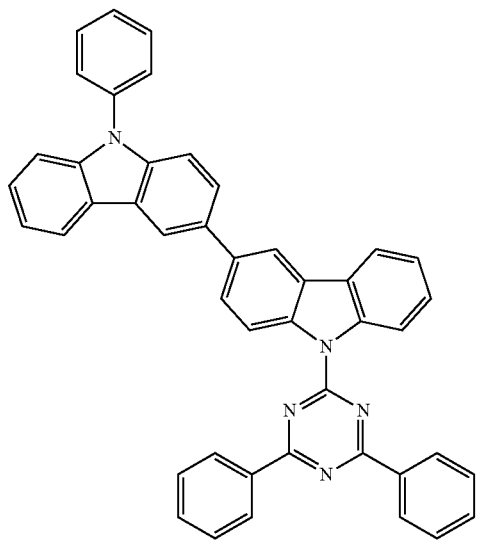
2-4
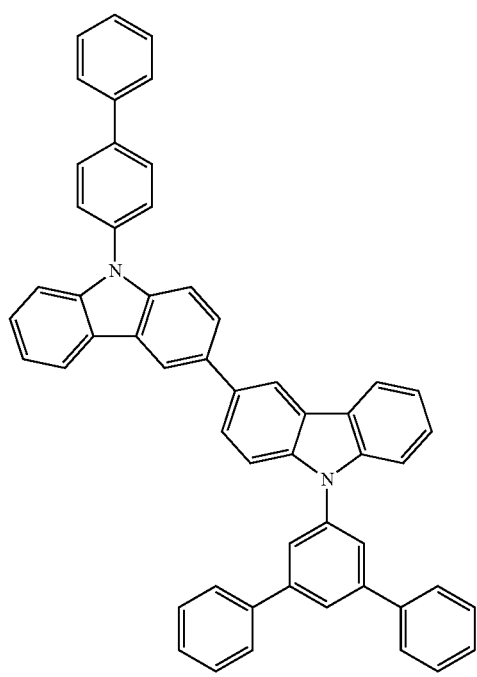
2-6
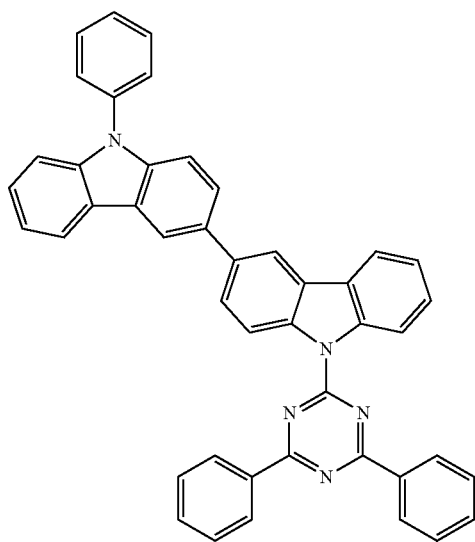

2-7
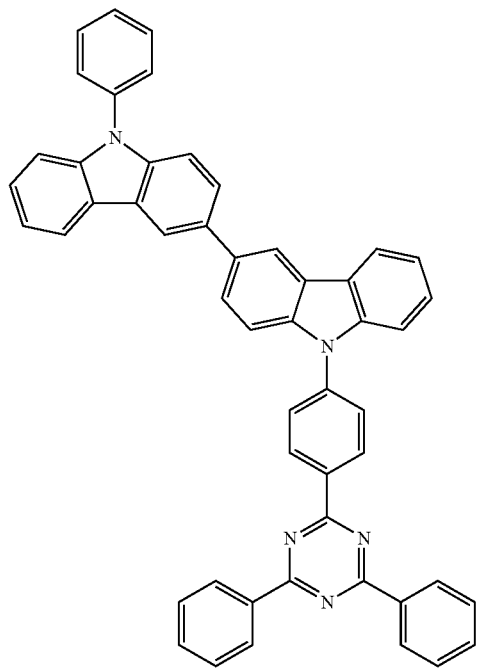
2-8
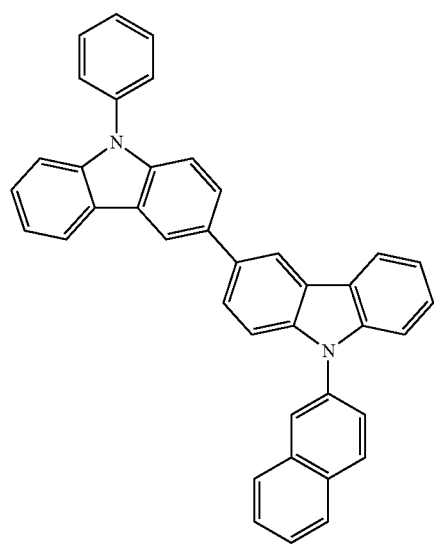
2-9
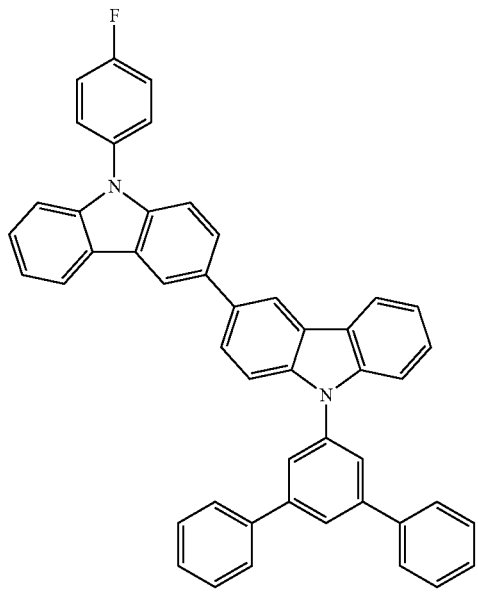
2-10
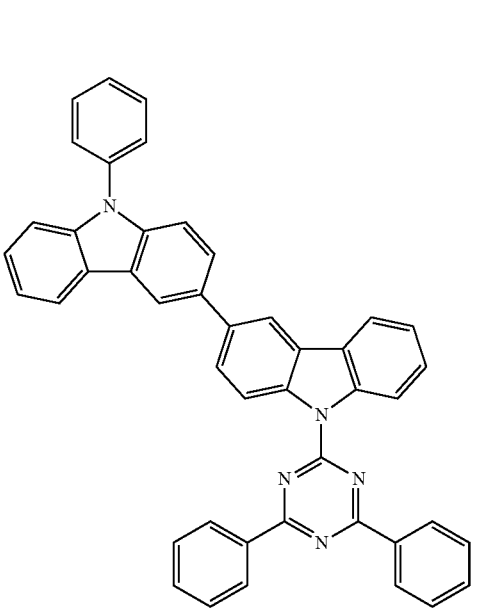
2-11
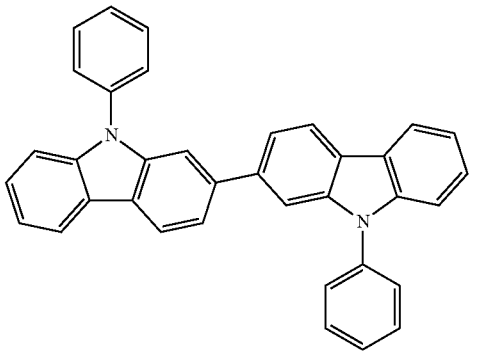

2-12
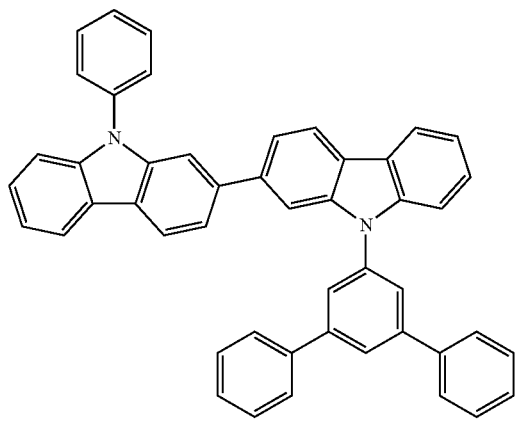
2-13
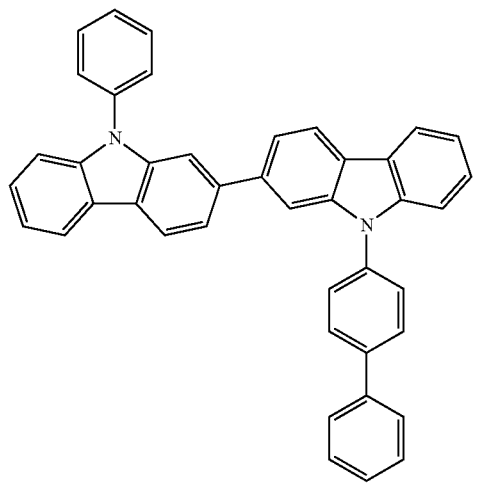
2-14
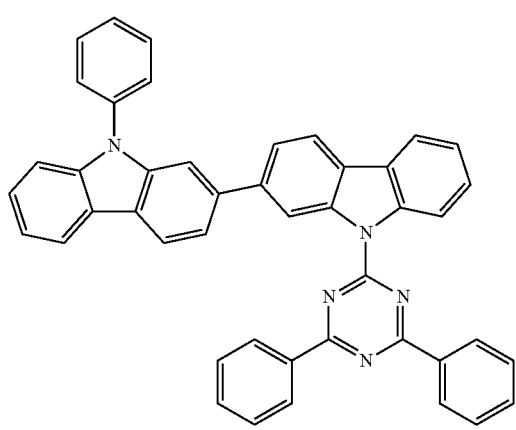
2-15
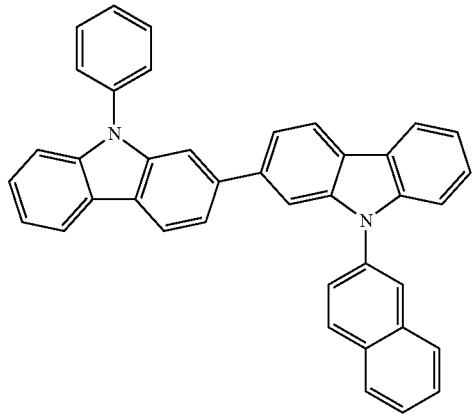
2-16
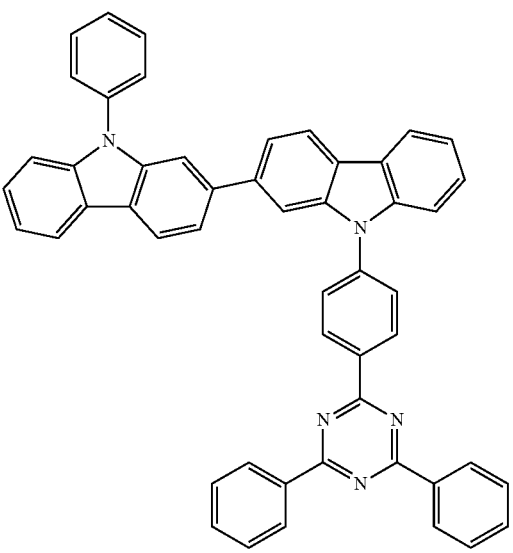
2-17
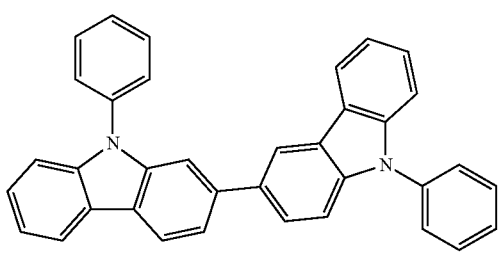
2-18
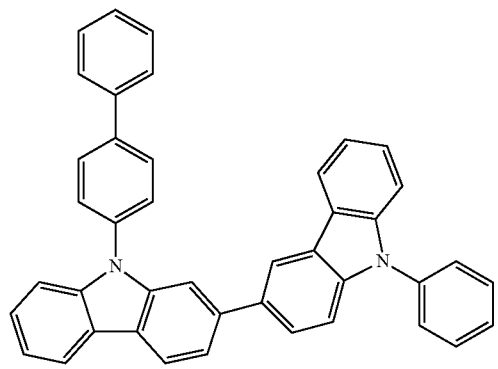

2-19
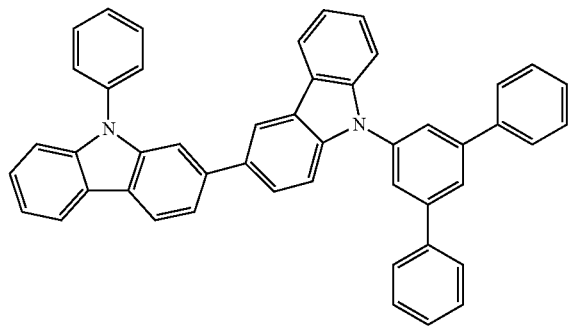

2-20
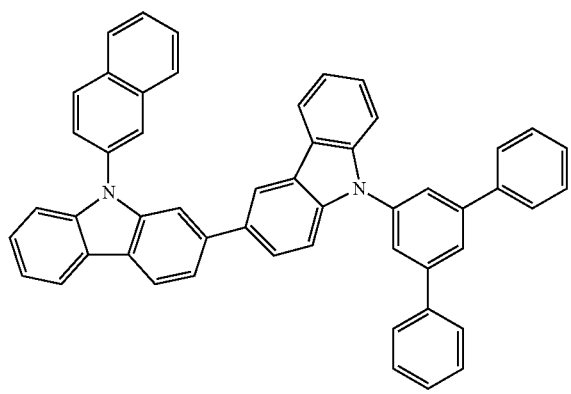

2-21
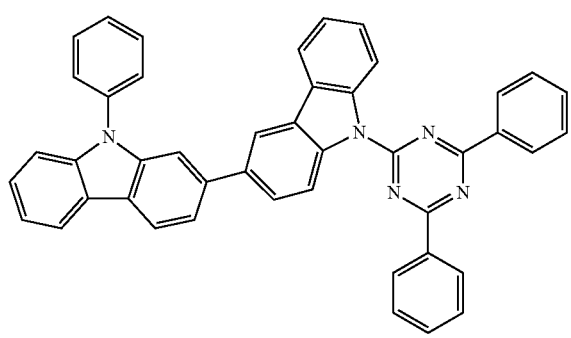

2-22

2-23
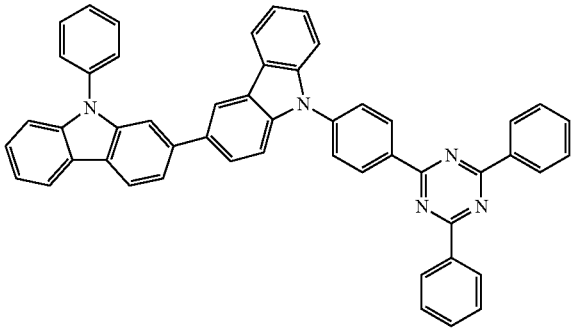

2-24
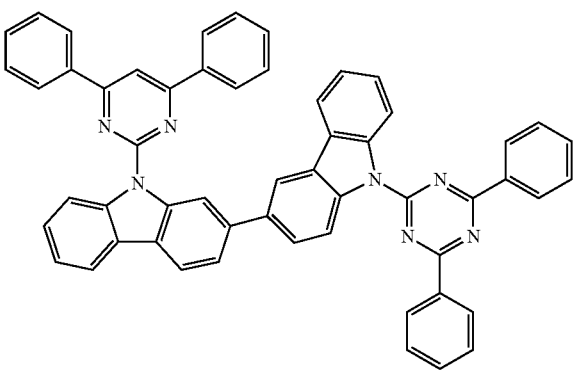

2-25

At least one substituent of the substituted $C_3$-$C_{10}$ cycloalkylene group, the substituted $C_2$-$C_{10}$ heterocycloalkylene group, the substituted $C_3$-$C_{10}$ cycloalkenylene group, the substituted $C_2$-$C_{10}$ heterocycloalkenylene group, the substituted $C_6$-$C_{60}$ arylene group, the substituted $C_2$-$C_{60}$ heteroarylene group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_2$-$C_{60}$ heteroaryl group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_6$-$C_{60}$ aryloxy group, and the substituted $C_6$-$C_{60}$ arylthio group may be selected from among:

a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, $C_1$-$C_{60}$ alkyl group, a $C_2$-$C_{60}$ alkenyl group $C_2$-$C_{60}$ alkynyl group, $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and —Si($Q_{13}$)($Q_{14}$)($Q_{15}$) (where $Q_{13}$ to $Q_{15}$ may be each independently one of a $C_1$-$C_{60}$ alkyl group, a $C_1$-$C_{60}$ alkoxy group, a $C_6$-$C_{60}$ aryl group, and a $C_2$-$C_{60}$ heteroaryl group), but they are not limited thereto.

The first compound of Formula 1 above may have good charge (hole) transporting ability. The second compound of Formula 2 above may have good charge (hole) transporting ability, good light-emitting ability, and may have a high band gap energy between the highest occupied molecular orbital (HOMO) and the lowest unoccupied molecular orbital (LUMO), and thus allows easy energy level adjustment. When the first compound is included in the hole migration region 13 and the second compound is included in at least one of the hole migration region 13 and the EML 15, the organic light-emitting diode 10 may have a low driving voltage, a high luminance, a high efficiency and a long lifetime.

In some embodiments, the first compound of Formula 1 and the second compound of Formula 2 may both be in the hole migration region 13.

In some other embodiments, the first compound of Formula 1 above may be in the hole migration region 13, and the second compound of Formula 2 above may be in the EML 15.

In some other embodiments, the first compound of Formula 1 above and the second compound of Formula 2 above may be both in the hole migration region 13, and only the second compound of Formula 2 above may be in the EML 15. In this regard, the second compound in the hole migration region 13 and the second compound in the EML 15 may be the same or differ from each other.

Figure 2:
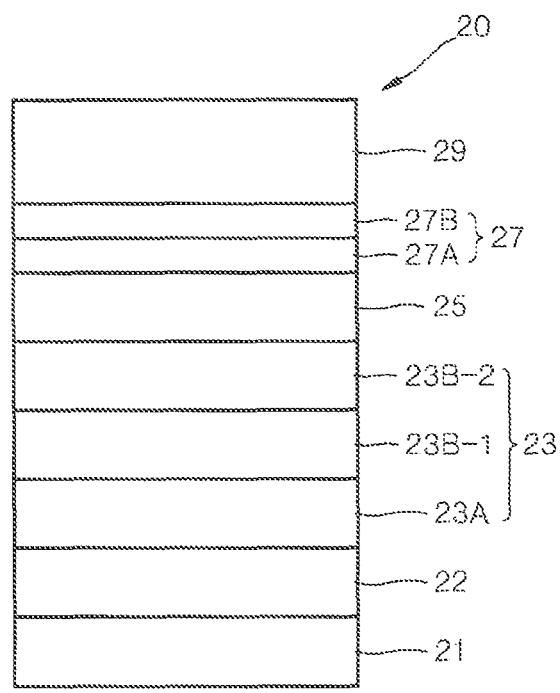
FIG. 2 is a schematic view of a structure of an organic light-emitting diode according to another embodiment of the present invention.

FIG. 2 is a schematic view of a structure of an organic light-emitting diode 20 according to another embodiment of the present invention. Referring to FIG. 2, the organic light emitting diode 20 has a structure including a substrate 21, a first electrode 22, a hole migration region 23, an emission layer (EML) 25, an electron migration region 27, and a second electrode 29 that are sequentially stacked on one another. The hole migration region 23 includes a hole injection layer (HIL) 23A, a first hole transport layer (HTL) 23B-1, and a second HTL 23B-2 that are sequentially stacked on the first electrode 22. The electron migration region 27 includes an electron transport layer (ELT) 27A and an electron injection layer (EIL) 27B that are sequentially stacked on the EML 25.

The above-detailed descriptions of the substrate 11, the first electrode 12 and the second electrode 19 may be referred to as detailed descriptions of the substrate 21, the first electrode 22 and the second electrode 29 of FIG. 2.

The HIL 23A may be formed on the first electrode 22 by any of a variety of methods, including vacuum deposition, spin coating, casting, and Langmuir-Blodgett (LB) deposition.

When the HIL 23A is formed using vacuum deposition, vacuum deposition conditions may vary according to the compound that is used to form the HIL 23A, and the desired structure and thermal properties of the HIL 23A to be formed. For example, vacuum deposition may be performed at a temperature of from about 100° C. to about 500° C., a pressure of from about $10^{-8}$ torr to about $10^{-3}$ torr, and a deposition rate of from about 0.01 to about 100 Å/sec. However, the deposition conditions are not limited thereto.

When the HIL 23A is formed using spin coating, the coating conditions may vary according to the compound that is used to form the HIL 23A, and the desired structure and thermal properties of the HIL 23A to be formed. For example, the coating rate may be in the range of from about 2000 rpm to about 5000 rpm, and a temperature at which heat treatment is performed to remove a solvent after coating may be in the range of from about 80° C. to about 200° C. However, the coating conditions are not limited thereto.

Non-limiting examples of materials for the HIL 23A are N,N'-diphenyl-N,N'-bis-[4-(phenyl-m-tolyl-amino)-phenyl]-biphenyl-4,4'-diamine, (DNTPD), a phthalocyanine compound such as copper phthalocyanine, 4,4',4''-tris(3-methylphenylphenylamino)triphenylamine (m-MTDATA), N,N'-di(1-naphthyl)-N,N'-diphenylbenzidine (NPB), 4,4',4''-tris(N,N-diphenylamino)tripheylamine (TDATA), 4,4',4''-tris(2-naphthylphenylamino)triphenylamine (2-TNATA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline/poly(4-styrenesulfonate (PANI/PSS).

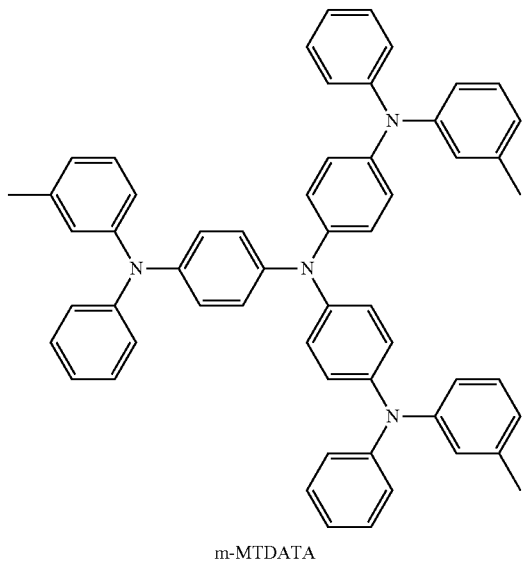

m-MTDATA

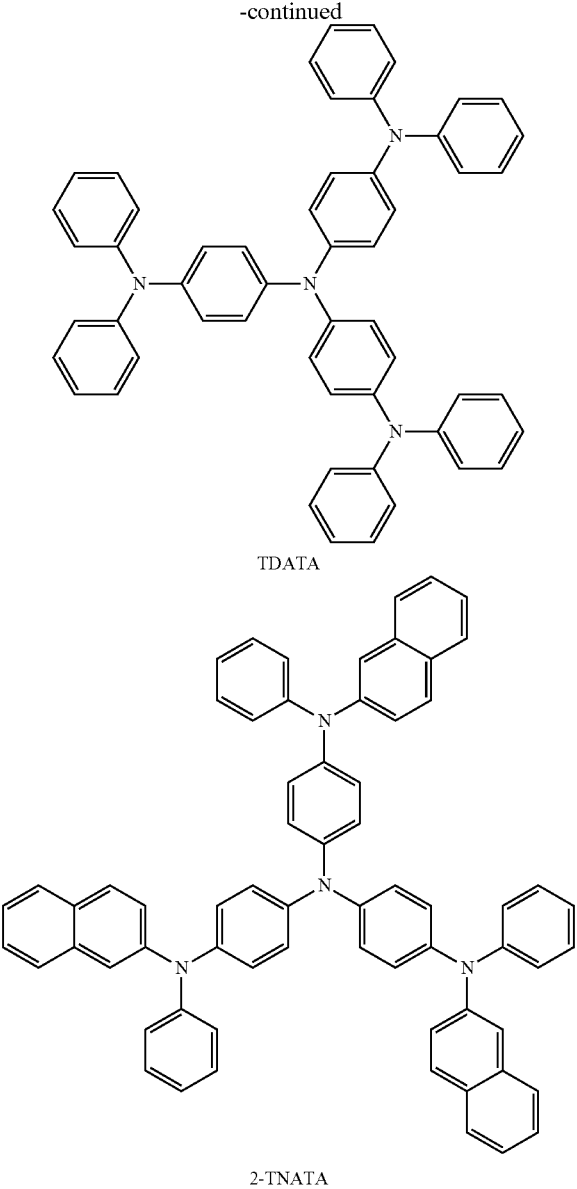

The thickness of the HIL 23A may be from about 100 Å to about 10000 Å, and, in some embodiments, may be from about 100 Å to about 1000 Å. When the thickness of the HIL 23A is within these ranges, the HIL 23A may have good hole injecting ability without imparting a substantial increase in driving voltage to an OLED including it.

Then, a first HTL 23B-1 may be formed on the HIL 23A by using any of a variety of methods, for example, one of vacuum deposition, spin coating, casting, Langmuir-Blodgett (LB) deposition, and the like. When the first HTL 23B-1 is formed using vacuum deposition or spin coating, the conditions for deposition and coating may be similar to those for the formation of the HIL 23A, although the conditions for the deposition and coating may vary depending on the material that is used to form the first HTL 23B-1.

The first HTL 23B-1 may be formed of the first compound represented by Formula 1 above. The above-detailed description of Formula 1A above may be referred to here. For example, the first HTL 23B-1 may include a first compound represented by Formula 1A, 1B, or 1C above, $Ar_{101}$ and $Ar_{102}$ in Formula 1A, 1B, and 1C each independently being a group represented by one of Formulae 4-1 to 4-7; xa and xb may be each independently 1 or 2; $R_{101}$ may be a group represented by one of Formulae 6-1 to 6-8; $R_{109}$ may be a group represented by one of Formulae 6-1 to 6-11; $R_{111}$ and $R_{112}$ may be each independently one of a $C_1$-$C_{20}$ alkyl group; a $C_1$-$C_{20}$ alkyl group that is substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group; and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and $R_{102}$ to $R_{108}$ and $R_{113}$ to $R_{119}$ may be hydrogen atoms.

In some other embodiments, a material for the first HTL 23B-1 may be one of Compounds 1-1 to 1-19 above.

Then, a second HTL 23B-2 may be formed on the first HIL 23B-1 by using any of a variety of methods, for example, one of vacuum deposition, spin coating, casting, Langmuir-Blodgett (LB) deposition, and the like. When the second HTL 23B-2 is formed using vacuum deposition or spin coating, the conditions for deposition and coating may be similar to those for the formation of the HIL 23A, although the conditions for the deposition and coating may vary depending on the material that is used to form the second HTL 23B-2.

A material for the second HTL 23B-2 may be a second compound represented by Formula 2 above. The above-detailed description of Formula 2 above may be referred to here. For example, the second HTL 23B-2 may include a second compound represented by one of Formulas 2A, 2B and 2C, $Ar_1$ and $Ar_2$ in Formulas 2A, 2B and 2C each being independently a group represented by one of Formulae 4-1 to 4-7; i) a=0 and b=0, ii) a=1 and b=0, iii) a=0 and b=1, or iv) a=1 and b=1; $R_1$ and $R_2$ may be each independently a group represented by one of Formulae 6-1 to 6-17; and $R_{11}$ to $R_{14}$ may be hydrogen atoms.

In some other embodiments, the second HTL 23B-2 may include one of Compounds 2-1 to 2-25 above, but it is not limited thereto.

A total of thicknesses of the first HTL 23B-1 and the second HTL 23B-2 may be from about 50 Å to about 2000 Å, and in some embodiments, from about 100 Å to about 1500 Å. When the total of thicknesses of the first HTL 23B-1 and the second HTL 23B-2 is within these ranges, the first HTL 23B-1 and second HTL 23B-2 may have satisfactory hole transporting ability without imparting a substantial increase in driving voltage to an OLED including them.

A thickness ratio of the first HTL 23B-1 to the second HTL 23B-2 may be from about 1:9 to about 9:1, and, in some embodiments, from about 3:7 to about 7:3, but it is not limited thereto.

At least one of the HIL 23A, the first HTL 23B-1, and the second HTL 23B-2 may further include a charge-generating material, in addition to the above-described materials, to improve conductivity of the layers.

The charge-generating material may be, for example, a p-dopant. The p-dopant may be one of quinine derivatives, metal oxides, and compounds with a cyano group, but are not limited thereto. Non-limiting examples of the p-dopant are quinone derivatives such as tetracyanoquinonedimethane (TCNQ), 2,3,5,6-tetrafluoro-tetracyano-1,4-benzoquinonedimethane (F4-TCNQ), and the like; metal oxides such as tungsten oxide, molybdenum oxide, and the like; and cyano-containing compounds such as Compound 200 below.

<Compound 200>

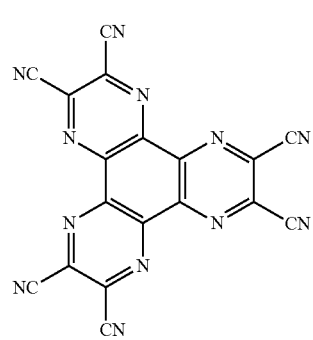

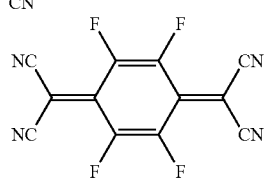

<F4-TCNQ>

The charge-generating material may be homogeneously dispersed or inhomogeneously distributed in at least one of the HIL 23A, the first HTL 23B-1 and the second HTL 23B-2. The charge-generating material may be present in any form.

Then, the EML 25 may be formed on the second HTL 23B-2 by using one of vacuum deposition, spin coating, casting, LB deposition, and the like. When the EML 25 is formed using vacuum deposition or spin coating, the deposition and coating conditions may be similar to those for the formation of the HIL 23A, though the conditions for deposition and coating may vary depending on the material that is used to form the EML 25.

The EML 25 may include a host and a dopant.

Non-limiting examples of the host are tris(8-hydroxyquinolinato)aluminum (Alq$_3$), 4,4'-N,N'-dicarbazole-biphenyl (CBP), poly(n-vinylcarbazole) (PVK), 9,10-di(naphthalene-2-yl)anthracene (ADN), 4,4',4''-tris(N-carbazolyl)triphenylamine (TCTA), 1,3,5-tris(N-phenylbenzimidazole-2-yl)benzene (TPBI), 3-tert-butyl-9,10-di-2-naphthylanthracene (TBADN), 2,7-bis(9,9-diethylfluoren-2-yl)-9,9-diethylfluorene (E3), distyrylarylene (DSA), 2,2'-dimethyl-4,4'-bis(N-carbazolyl)biphenyl (dmCBP), and Compounds 501 to 509 below.

TPBI

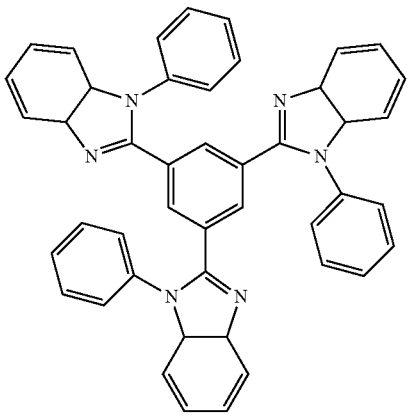

TBADN

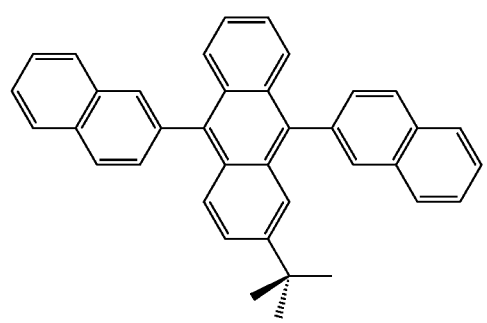

E3

PVK

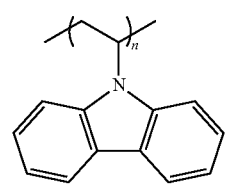

ADN

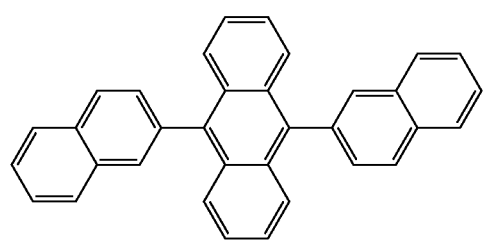

CBP

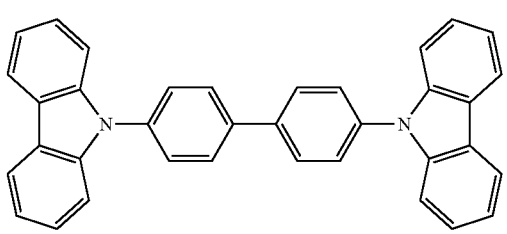

dmCBP
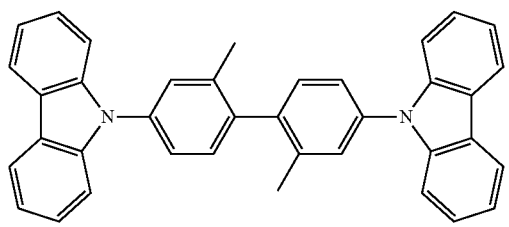
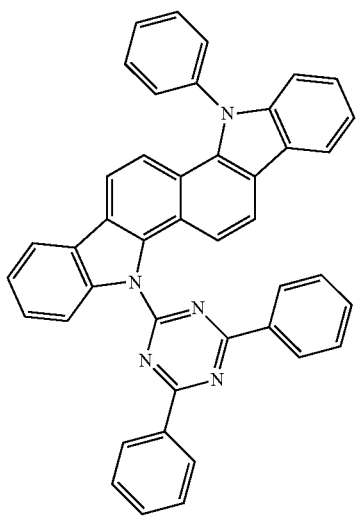
504
501
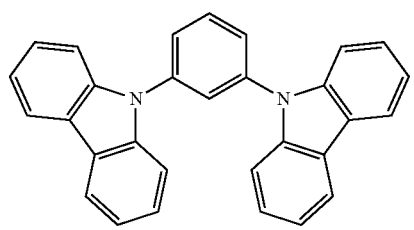
502
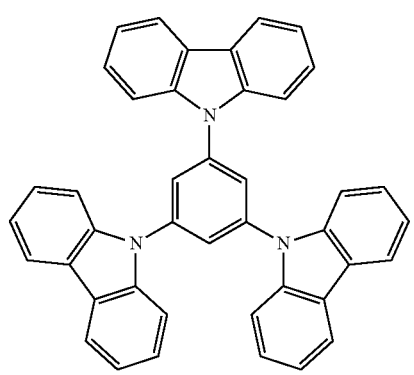
505
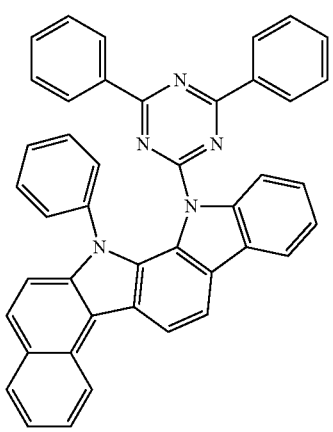
503
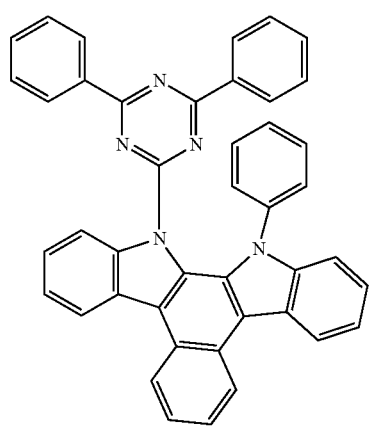
506
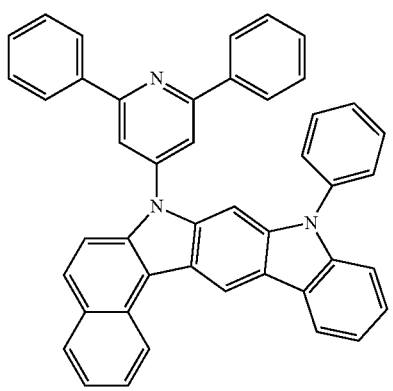

-continued

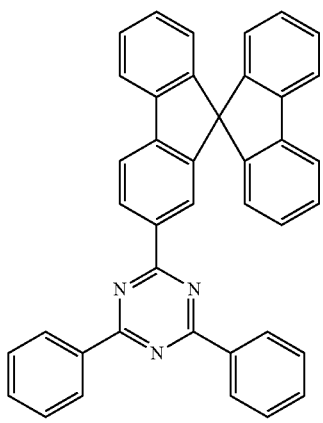
507

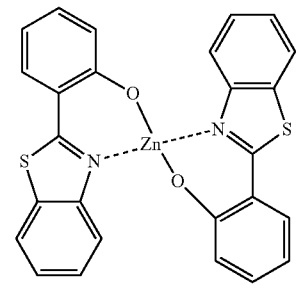
508

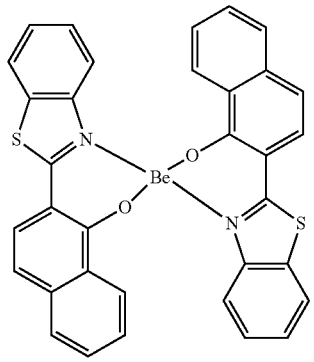
509

In some embodiments, an anthracene-based compound represented by Formula 400 below may be used as the host.

<Formula 400>

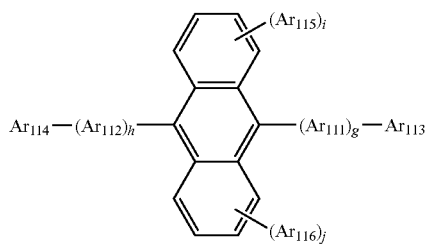

In Formula 400, $Ar_{111}$ and $Ar_{112}$ may be each independently a substituted or unsubstituted $C_6$-$C_{60}$ arylene group; $Ar_{113}$ to $Ar_{116}$ may be each independently a substituted or unsubstituted $C_1$-$C_{10}$ alkyl group or a substituted or unsubstituted $C_6$-$C_{60}$ aryl group; and g, h, I, and j may be each independently an integer from 0 to 4.

In some embodiments, $Ar_{111}$ and $Ar_{112}$ in Formula 400 may be each independently selected from a phenylene group, a naphthylene group, a phenanthrenylene group, and a pyrenylene group; and a phenylene group, a naphthylene group, a phenanthrenylene group, a fluorenyl group, and a pyrenylene group, substituted with at least one of a phenyl group, a naphthyl group, and an anthryl group.

In Formula 400 above, g, h, I, and j may be each independently 0, 1, or 2.

In some embodiments, $Ar_{113}$ to $Ar_{116}$ in Formula 400 may be each independently one of a $C_1$-$C_{10}$ alkyl group substituted with at least one of a phenyl group, a naphthyl group, and an anthryl group; a phenyl group; a naphthyl group; an anthryl group; a pyrenyl group; a phenanthrenyl group; a fluorenyl group; a phenyl group, a naphthyl group, an anthryl group, a pyrenyl group, a phenanthrenyl group, and a fluorenyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, and a fluorenyl group; and

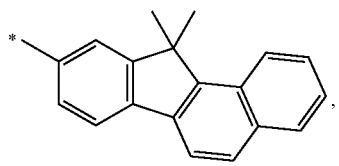 [SMILES: Cc1ccc2c(c1)C(C)(C)c1c-2ccc2ccccc12]

but are not limited thereto.

For example, the anthracene-based compound of Formula 400 above may be one of the compounds represented by the following formulae, but is not limited thereto:

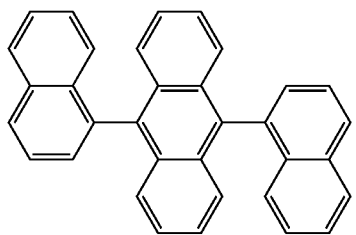

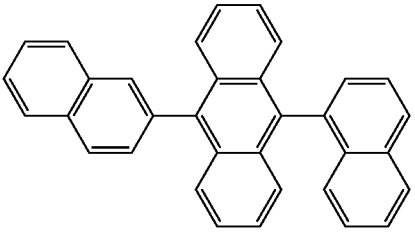

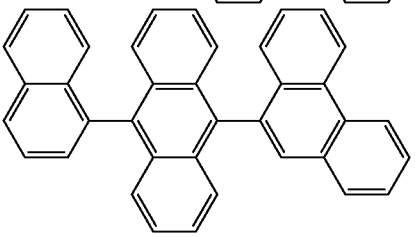

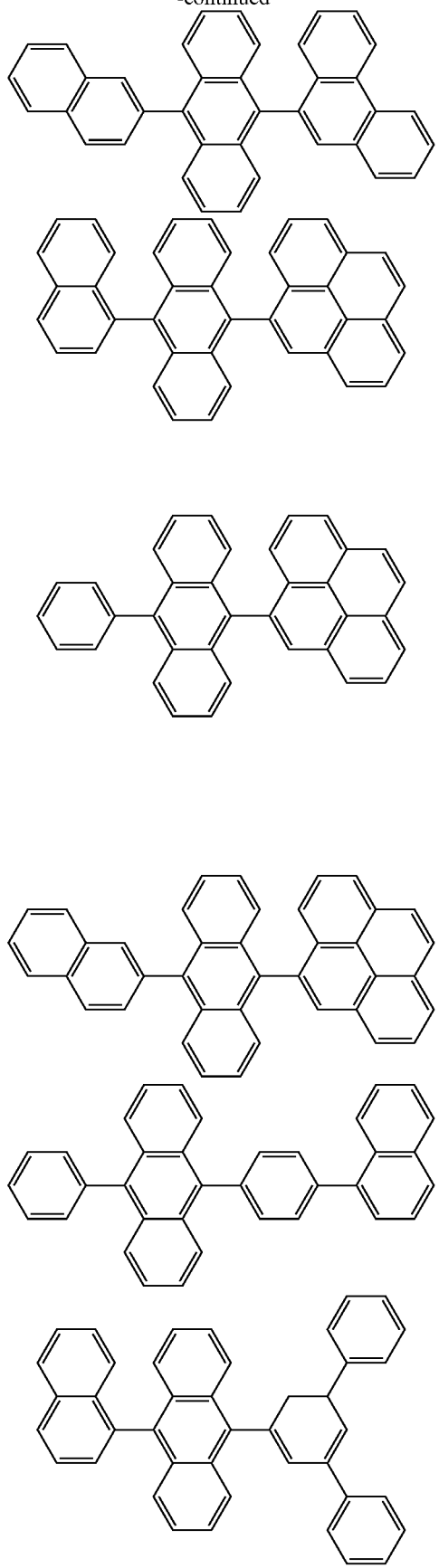
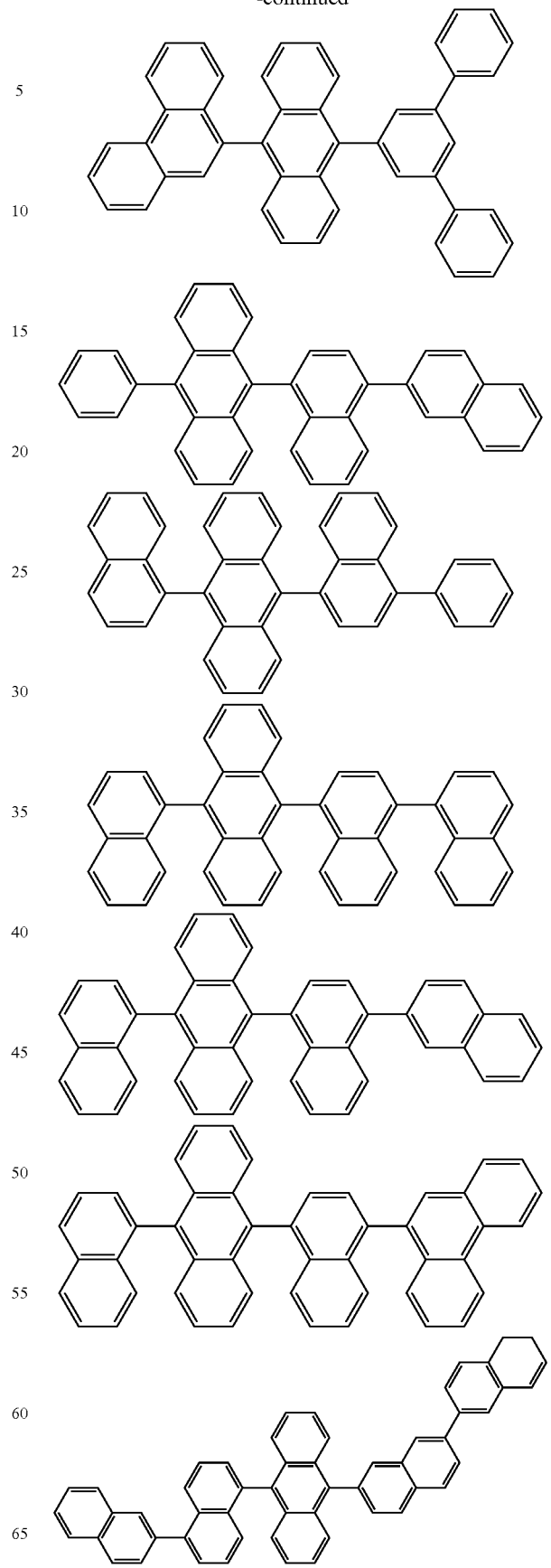

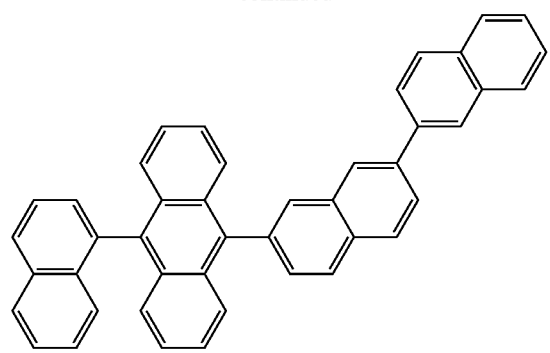
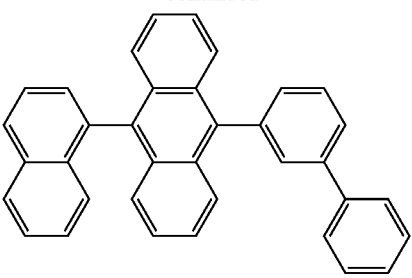
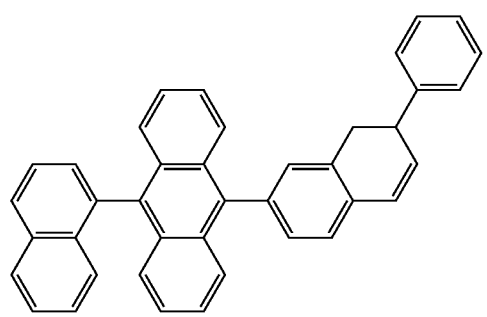
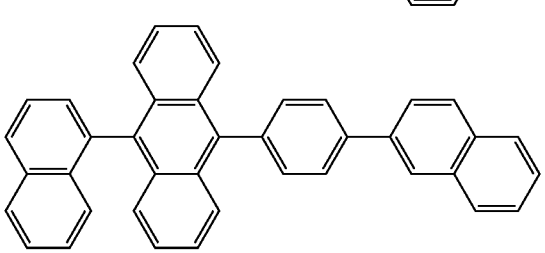
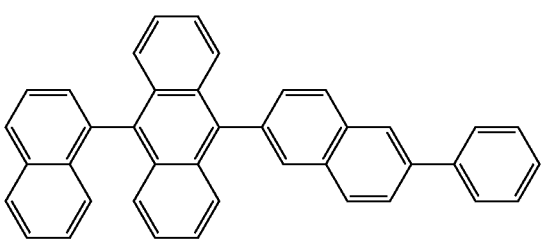
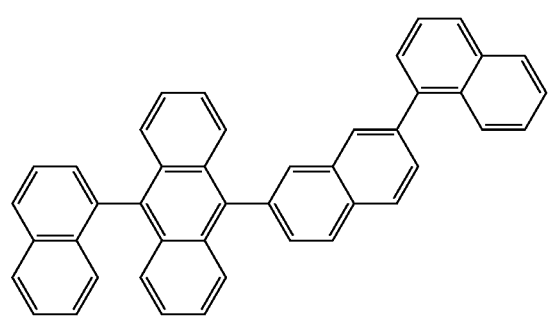
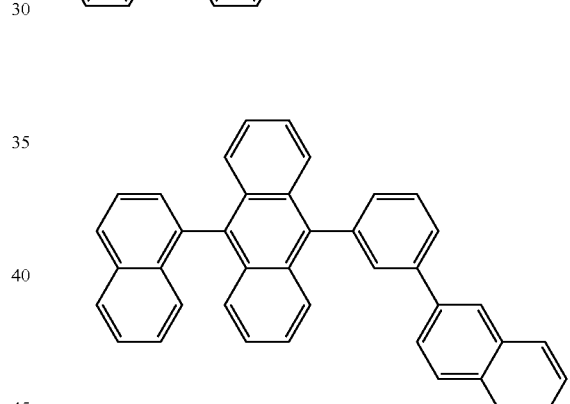
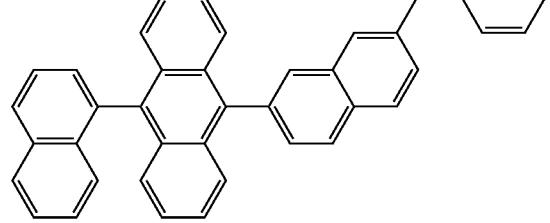
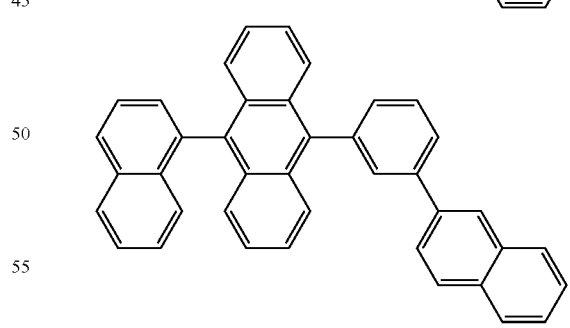
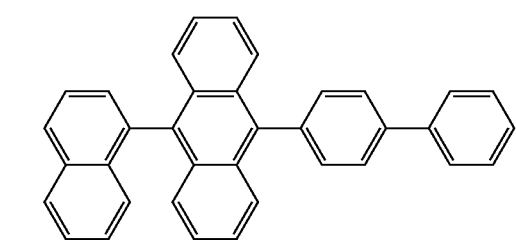
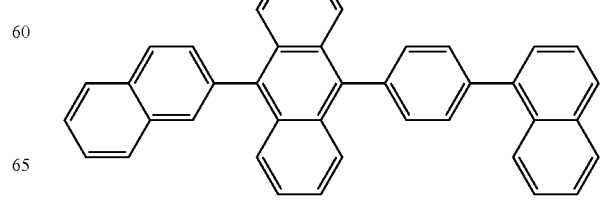

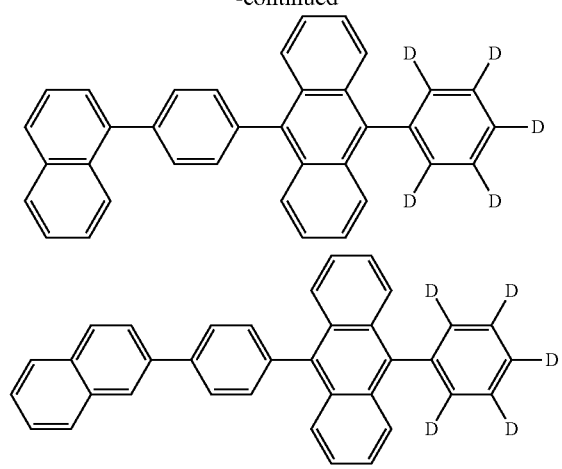
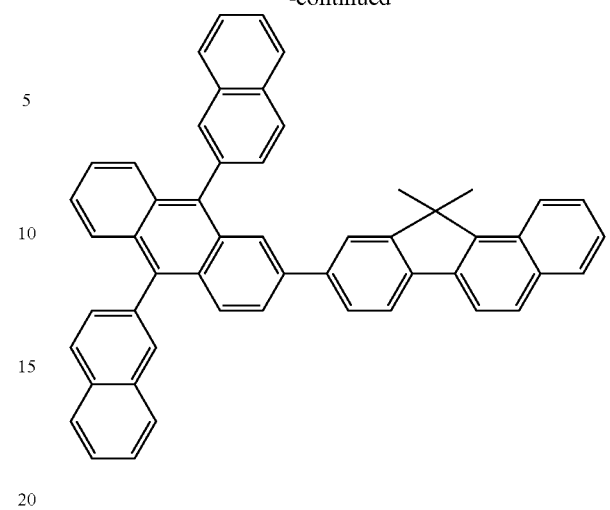
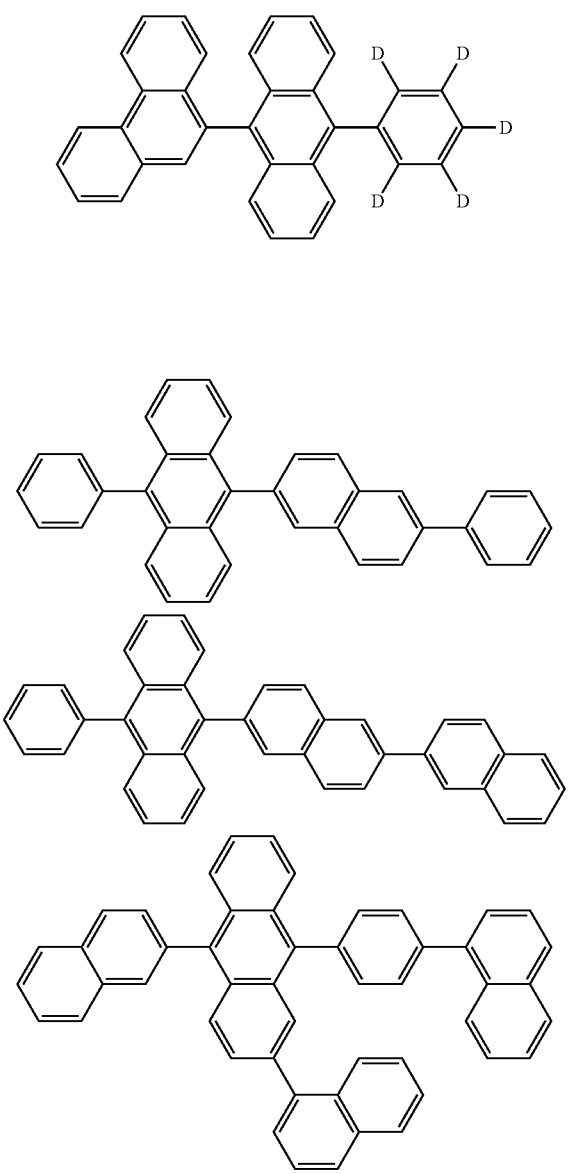
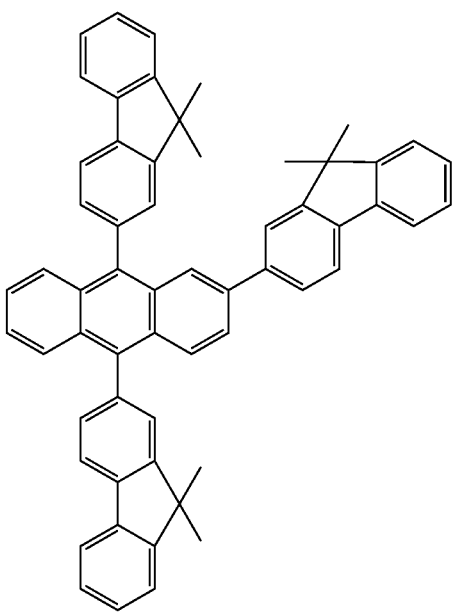

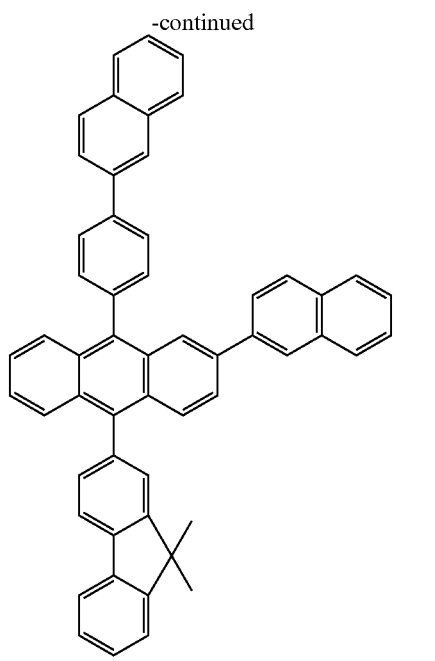

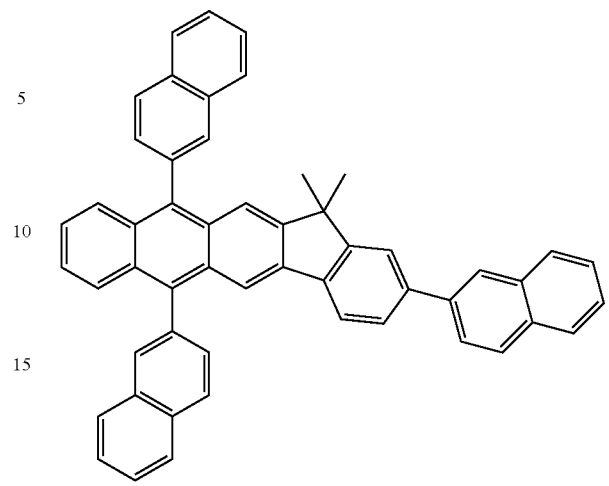

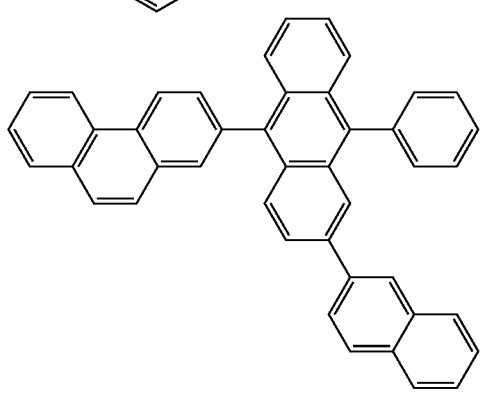

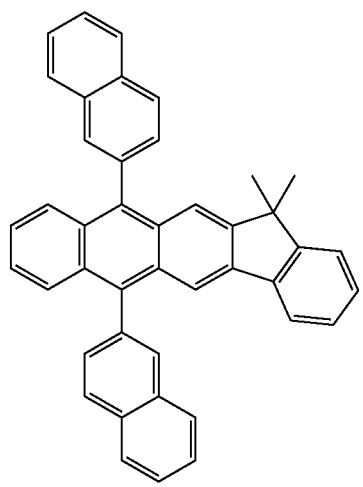

In some embodiments, an anthracene-based compound represented by Formula 401 below may be used as the host.

<Formula 401>

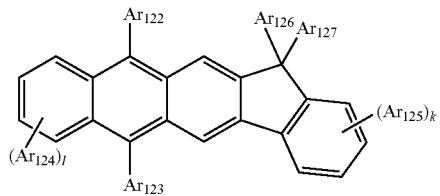

$Ar_{122}$ to $Ar_{125}$ in Formula 401 above may be defined as described above in conjunction with $Ar_{113}$ of Formula 400, and thus detailed descriptions thereof will not be provided here.

$Ar_{126}$ and $Ar_{127}$ in Formula 401 above may be each independently a $C_1$-$C_{10}$ alkyl group, for example, one of a methyl group, an ethyl group, and a propyl group.

In Formula 401, k and l may be each independently an integer from 0 to 4, for example, 0, 1, or 2.

For example, the anthracene compound of Formula 401 above may be one of the compounds represented by the following formulae, but is not limited thereto:

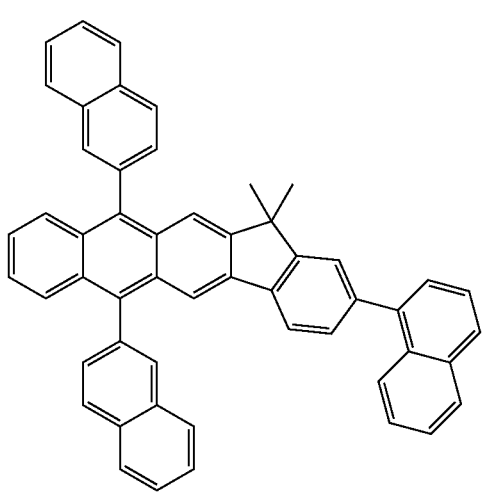

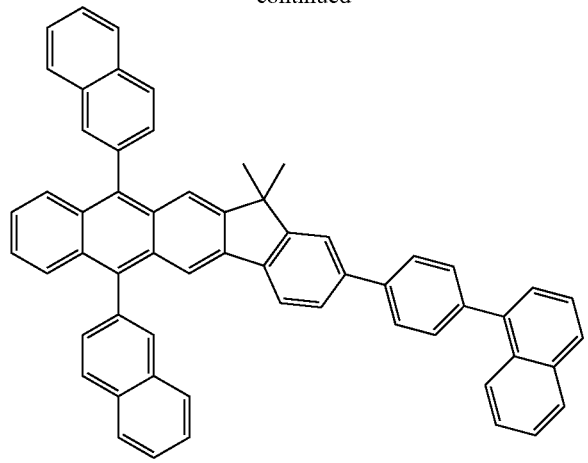

The EML 25 may include the second compound represented by Formula 2 above as a host. When the EML 25 includes the second compound of Formula 2 as a host, the host in the EML 25 and the material of the second HTL 23B-2 may be the same or differ from each other.

When the organic light-emitting diode is a full color organic light-emitting diode, the second electrode may be patterned into a red second electrode, a green second electrode, and a blue second electrode. In some embodiments, the EML 23 may include a red second electrode, a green second electrode, and/or a blue second electrode that are stacked upon one another to emit white light, but is not limited thereto.

The dopant in the EML 25 may be a known dopant.

Non-limiting examples of the blue dopant are compounds represented by the following formulae.

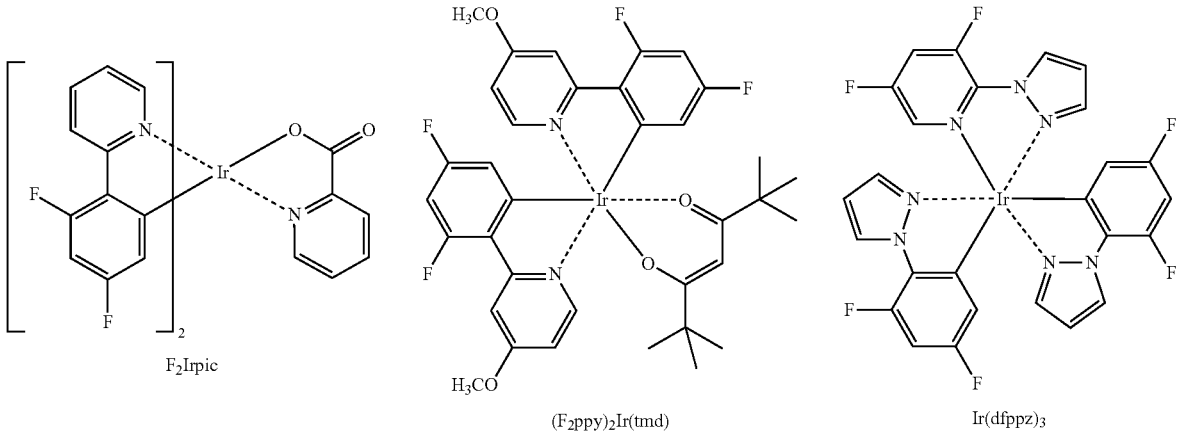

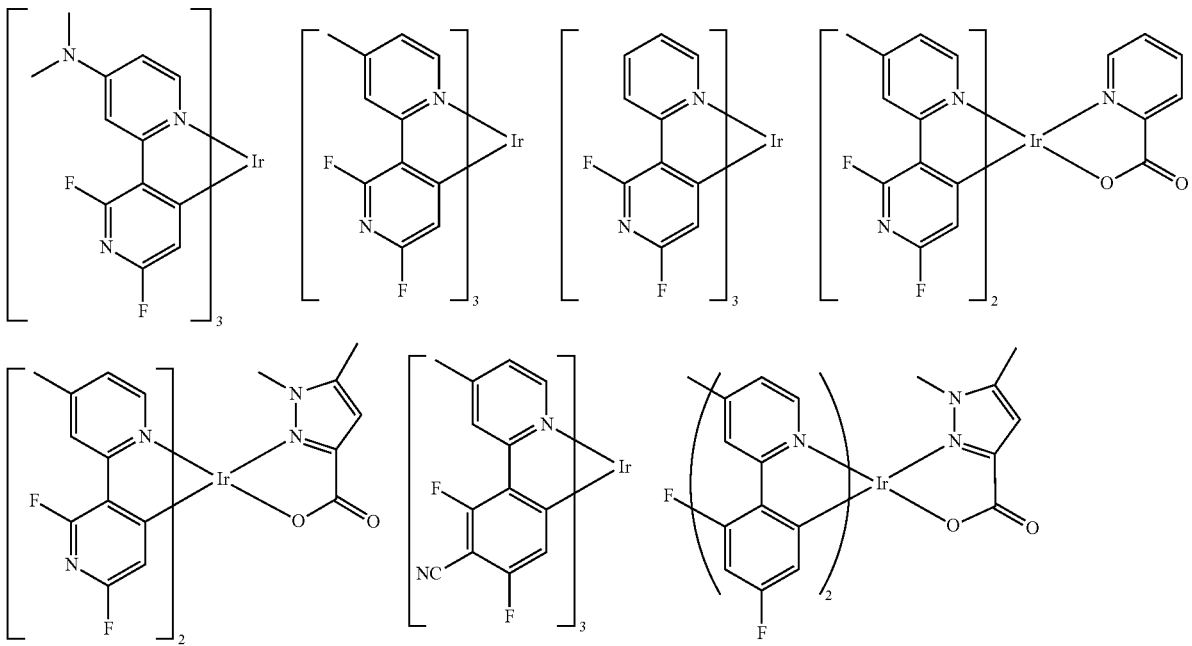

-continued
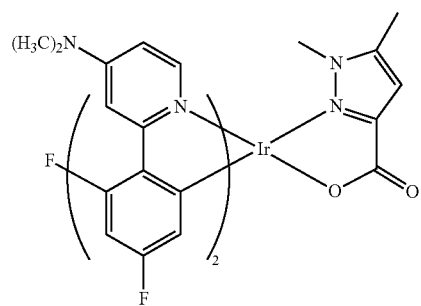
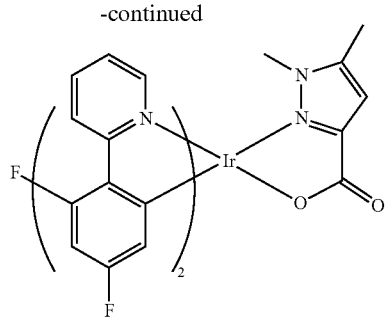
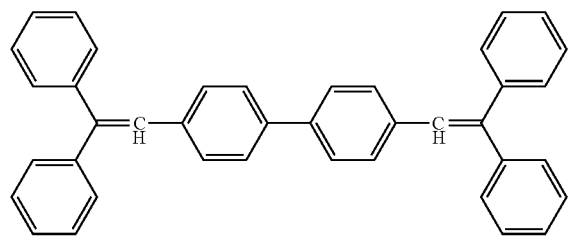
DPVBi
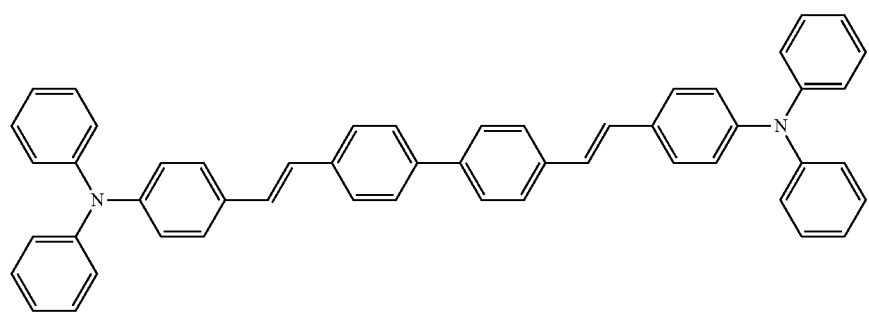
DPAVBi
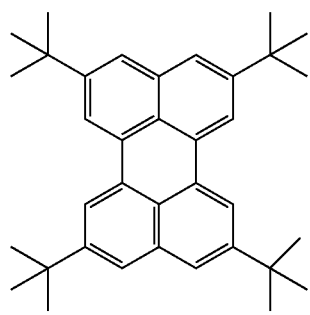
TBPe Non-limiting examples of red dopant are compounds represented by the following formulae. In some embodiments, the red dopant may be DCM or DCJTB, which will be described later.
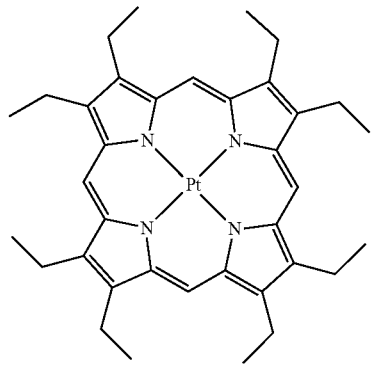
PtOEP
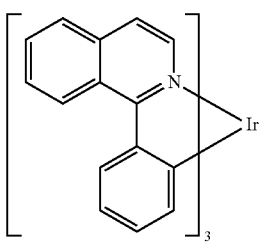
Ir(piq)₃
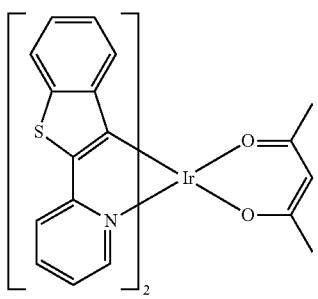
Btp₂Ir(acac)
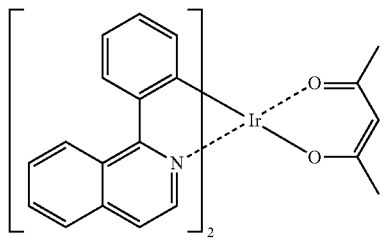
Ir(pq)₂(acac)
-continued
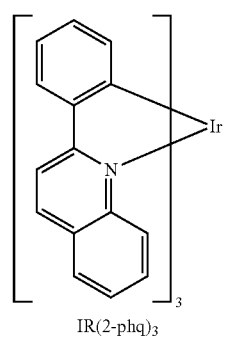
IR(2-phq)₃
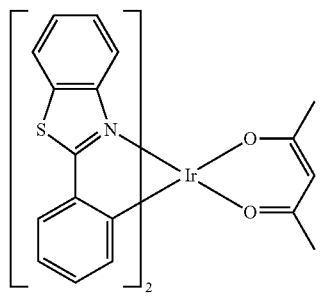
Ir(BT)₂(acac)
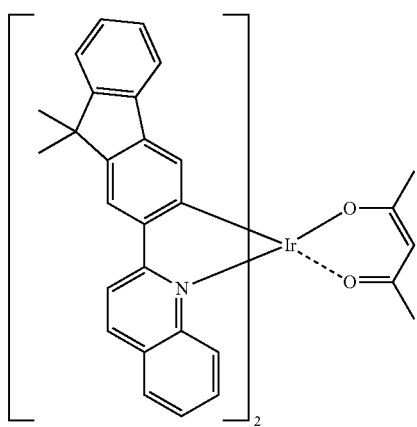
Ir(flq)₂(acac)
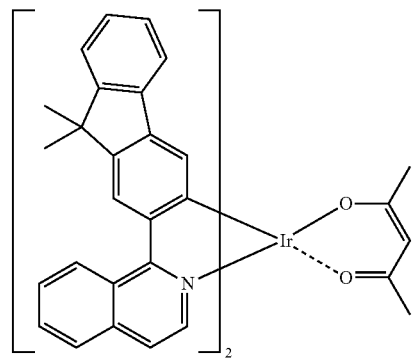
It(fliq)₂(acac)

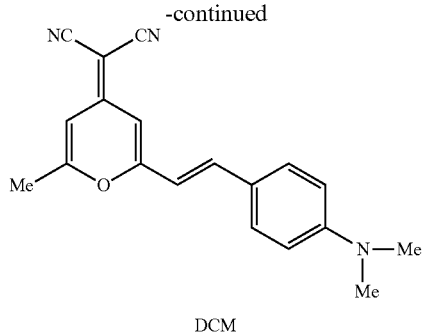
DCM
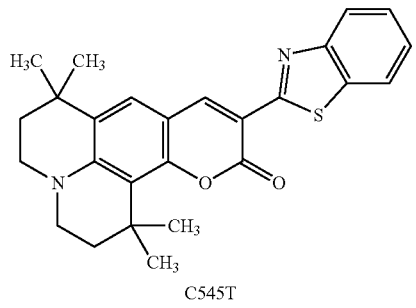
C545T
Non-limiting examples of the dopant that may be used in the EML are complexes represented by the following formulae:
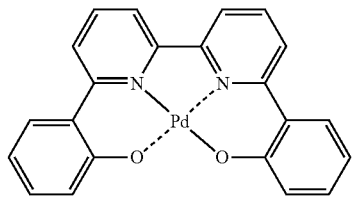
D1
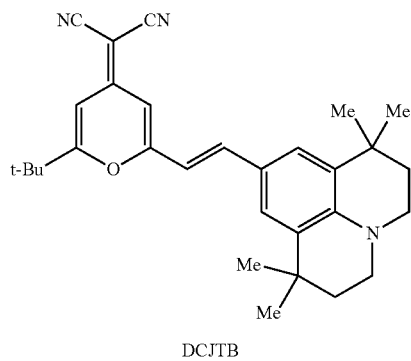
DCJTB
Non-limiting examples of green dopant are compounds represented by the following formulae. In an embodiment, the green dopant may be C545T represented below.
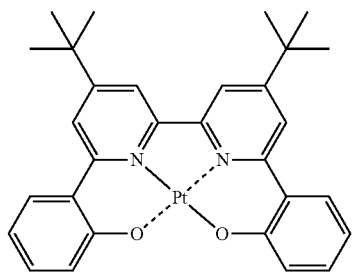
D2
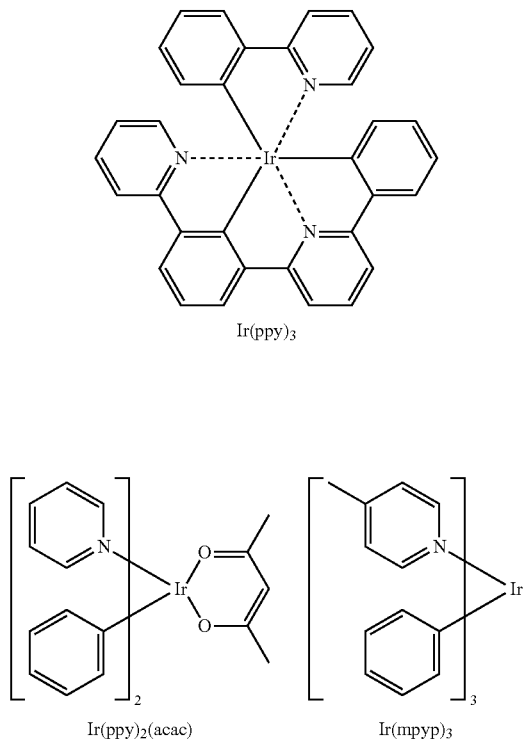
Ir(ppy)$_3$
Ir(ppy)$_2$(acac)   Ir(mpyp)$_3$
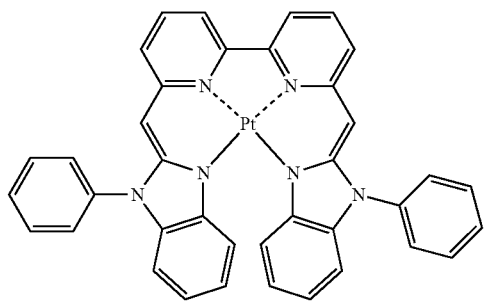
D3
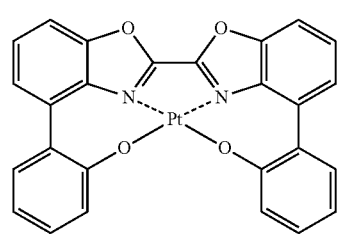
D4

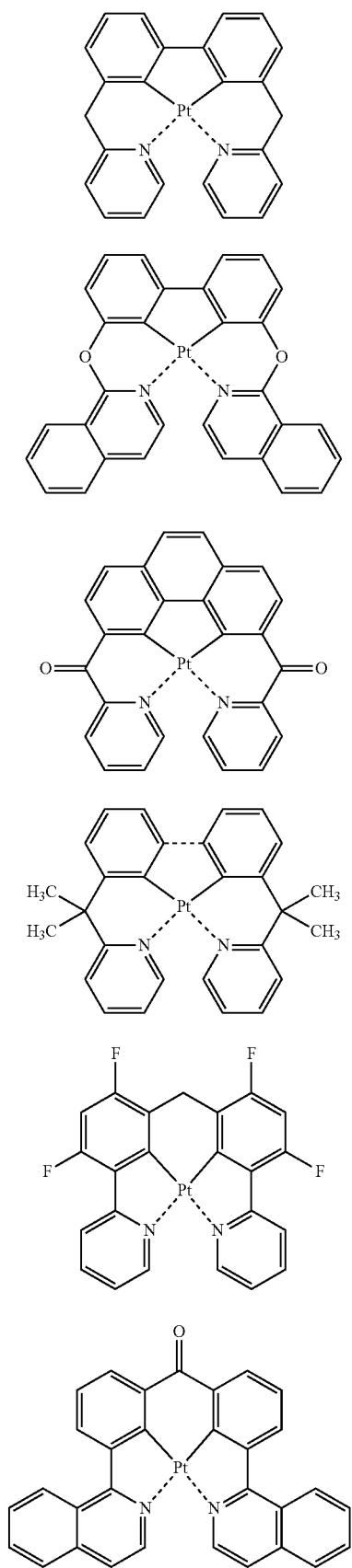
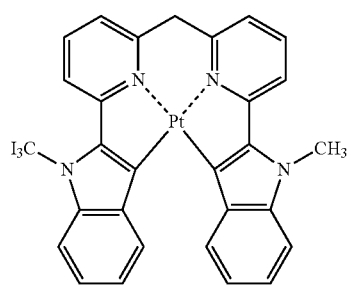
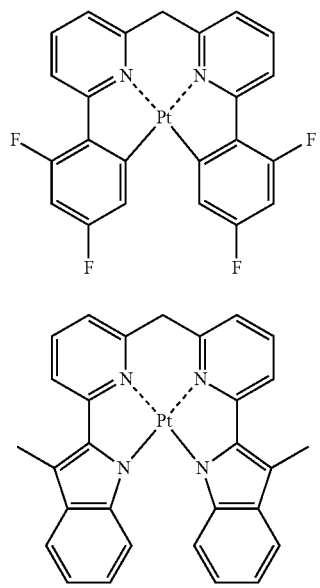
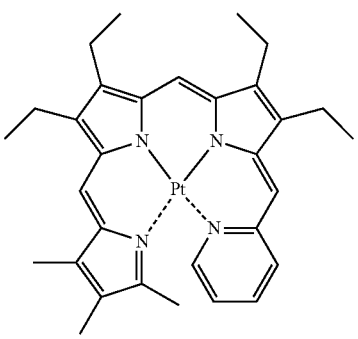

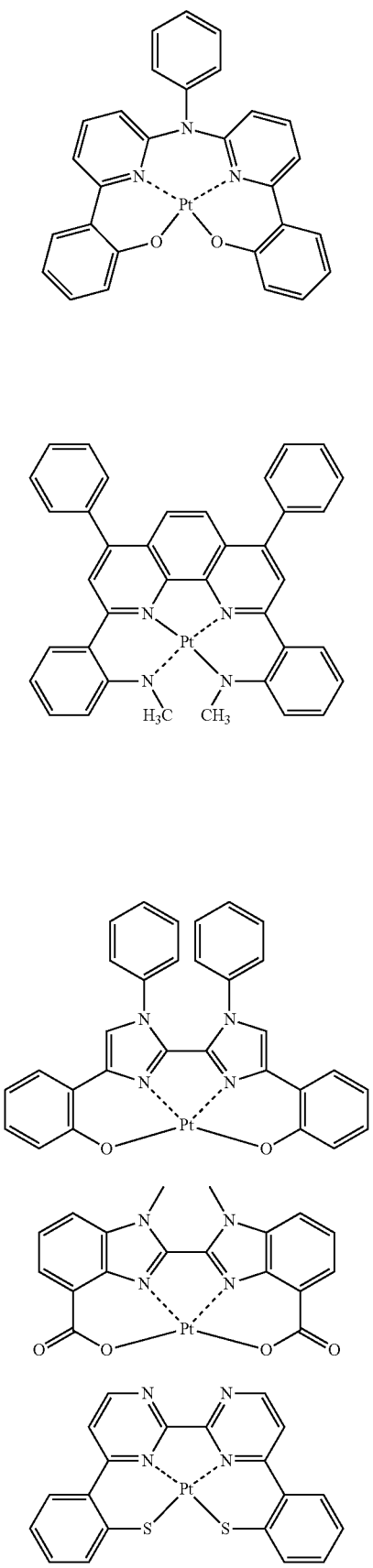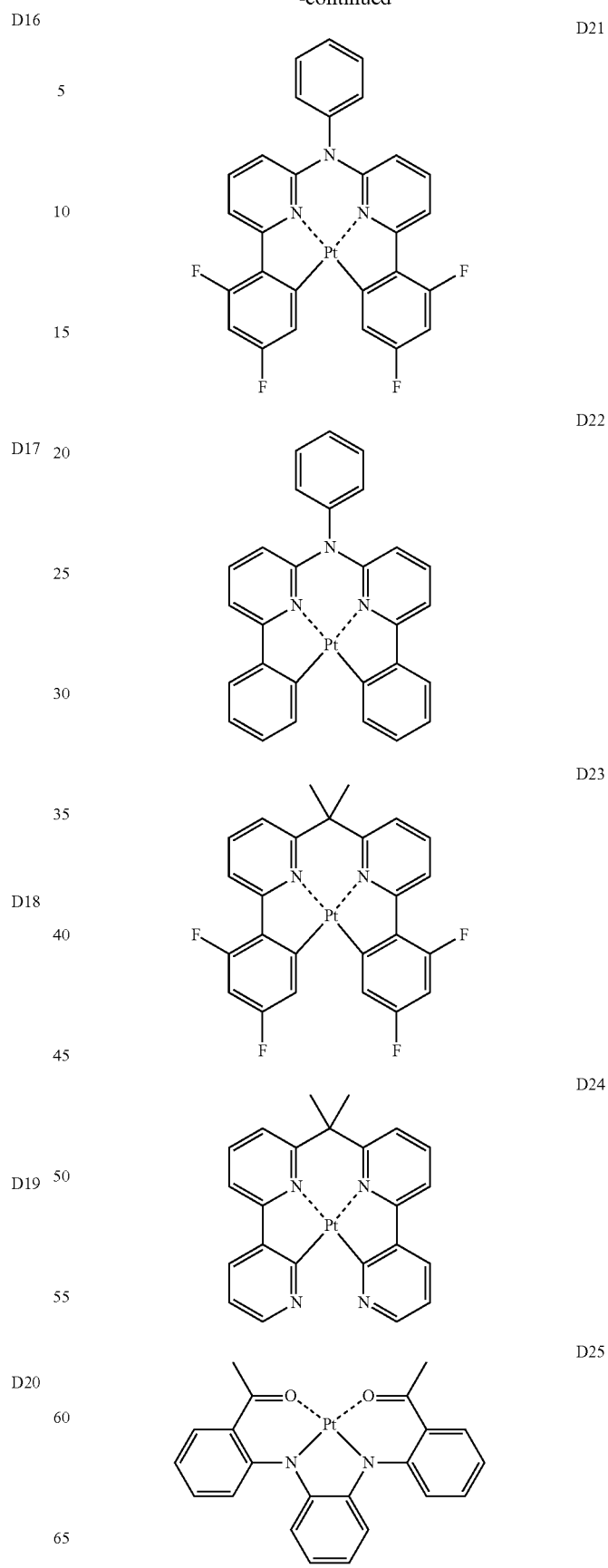

D26 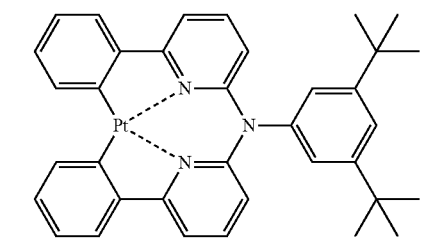
D27 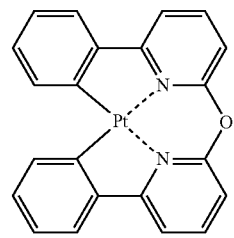
D28 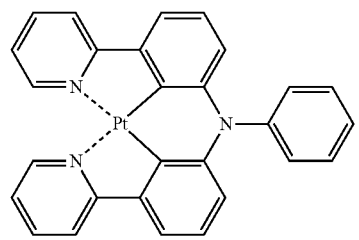
D29 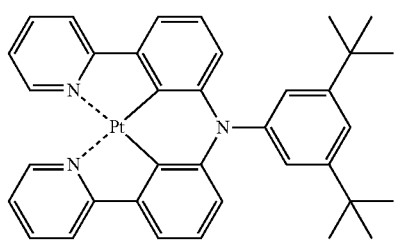
D30 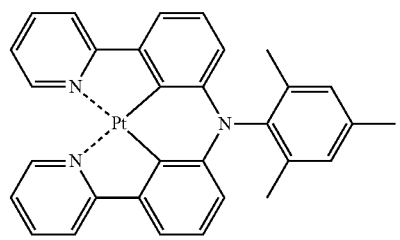
D31 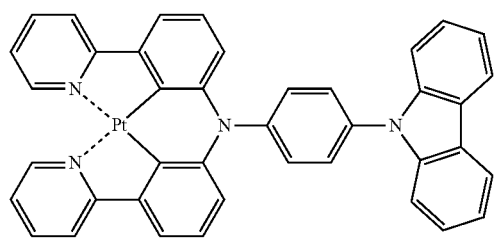
D32 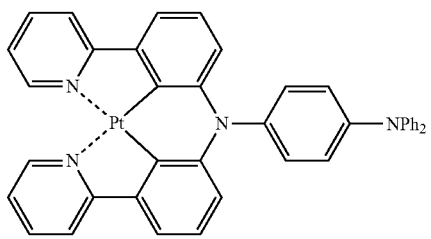
D33 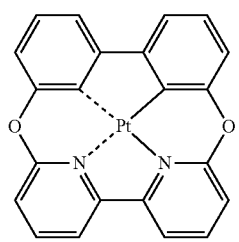
D34 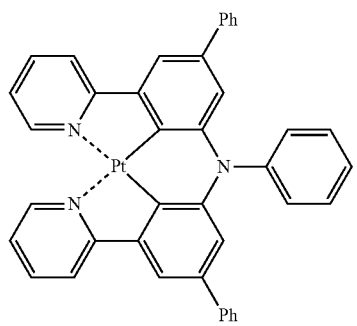
D35 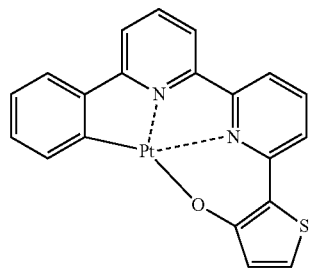
D36 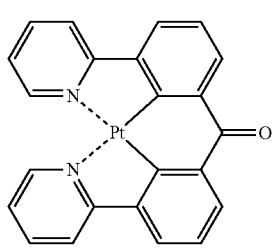

-continued
D37 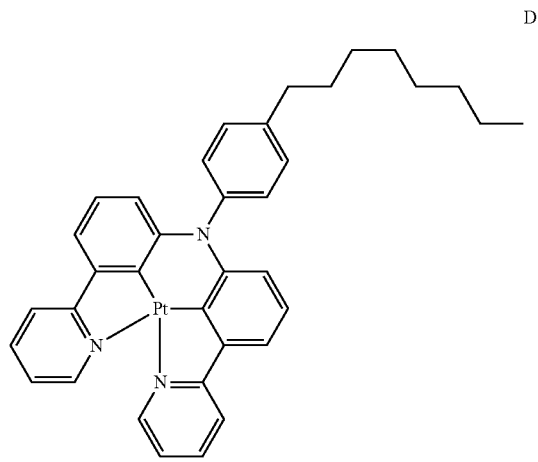
D38 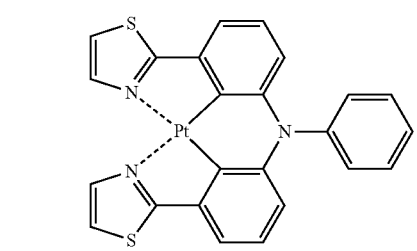
D39 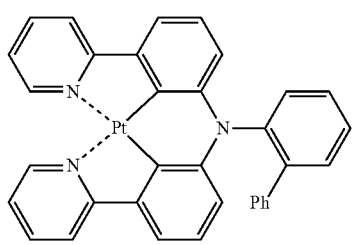
D40 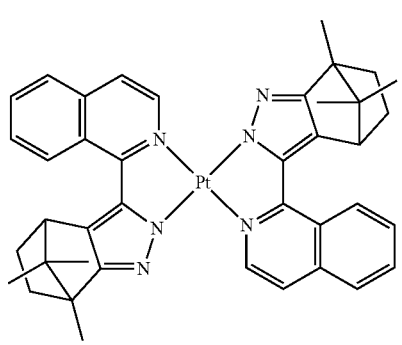
D41 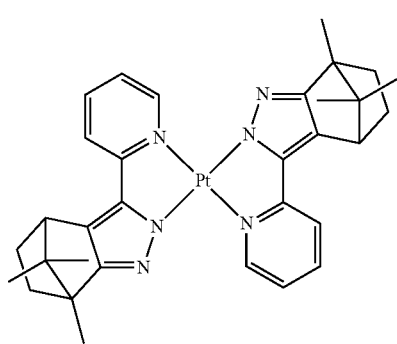
-continued
D42 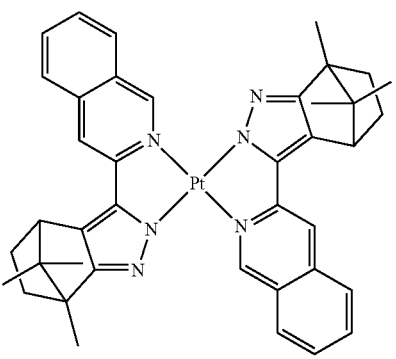
D43 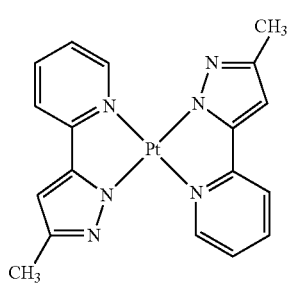
D44 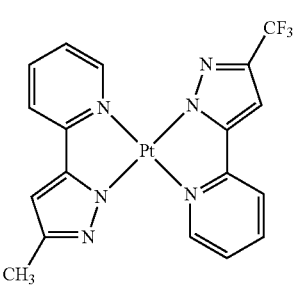
D45 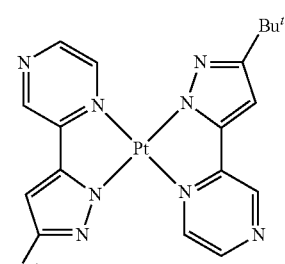
D46 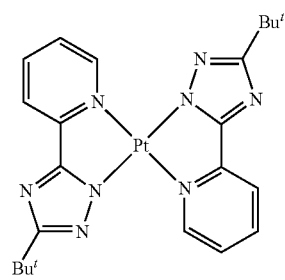

-continued

D47
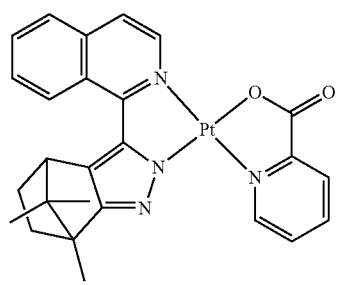

D48
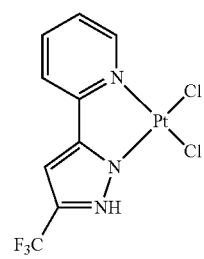

D49
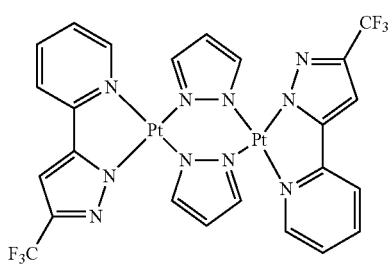

D50
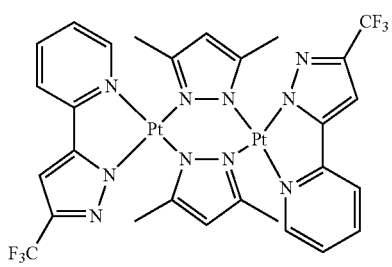

Non-limiting examples of the dopant that may be used in the EML 25 are Os complexes represented by the following formulae:

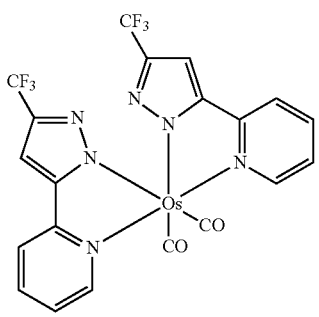

Os(fppz)₂(CO)₂

-continued

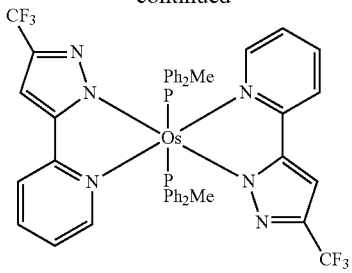

OS(fppz)₂(PPh₂Me)₂

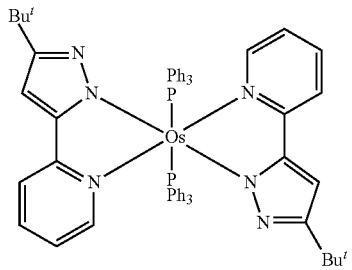

Os(bppz)₂(PPh₃)₂

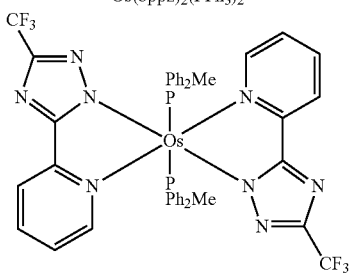

Os(fptz)₂(PPh₂Me)₂

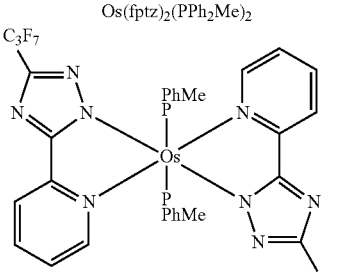

Os(hptz)₂(PPhMe₂)₂

When the EML 25 includes both a host and a dopant, the amount of the dopant may be, but is not limited to, from about 0.01 to about 15 parts by weight based on 100 parts by weight of the host.

A thickness of the EML 25 may be from about 100 Å to about 1000 Å, and, in some embodiments, may be from about 200 Å to about 600 Å. When the thickness of the EML 25 is within these ranges, the EML 25 may have improved light-emitting ability without imparting a substantial increase in driving voltage to an OLED including it.

Then, an ETL 27A may be formed on the EML 25 using any of a variety of methods, such as one of vacuum deposition, spin coating, casting, and the like. When the ETL 27A is formed using vacuum deposition or spin coating, the deposition and coating conditions may be similar to those used for the formation of the HIL 23A, though the deposition and coating conditions may vary depending on the material that is used to form the ETL 23A. A material for forming the ETL 27A may be any known material that can stably transport electrons injected from the second electrode 29. Non-limiting examples of materials for forming the ETL are a quinoline derivative, such as tris(8-hydroxyquinolinato) aluminum (Alq3), 3-(4-biphenylyl)-4-phenyl-5-(4-tert-butylphenyl)-1,2,4-triazole TAZ, bis(2-methyl-8-quinolinato)-4-phenylphenolate aluminum (BAlq), beryllium bis (benzoquinolin-10-olate (Bebq$_2$), 9,10-di(naphthalene-2-yl) anthracene (ADN), Compound 201, and Compound 202, but they are not limited thereto.

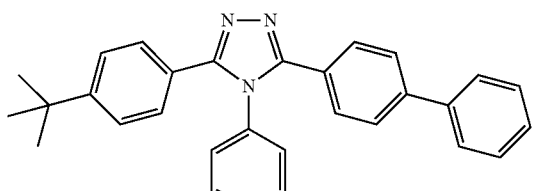

TAZ

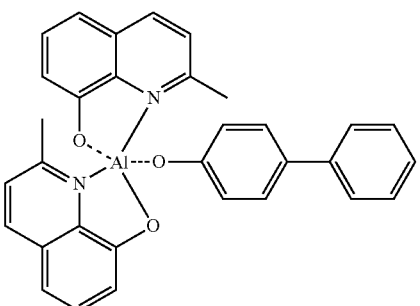

BAlq

<Compound 201>

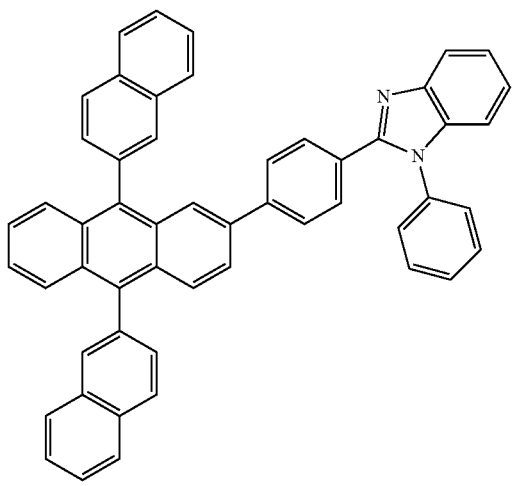

<Compound 202>

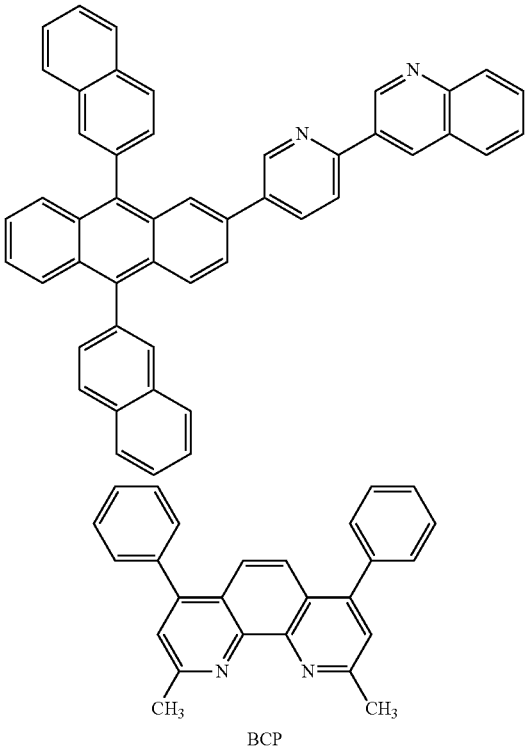

BCP

The thickness of the ETL 27A may be from about 100 Å to about 1,000 Å, and, in some embodiments, may be from about 150 Å to about 500 Å. When the thickness of the ETL 27A is within these ranges, the ETL 237A may have satisfactory electron transporting ability without imparting a substantial increase in driving voltage to an OLED including it.

The ETL 27A may further include a metal-containing material, in addition to such an electron transporting organic material as described above.

The metal-containing material may include a lithium (Li) complex. Non-limiting examples of the Li complex are lithium quinolate (LiQ) and Compound 203 below:

<Compound 203>

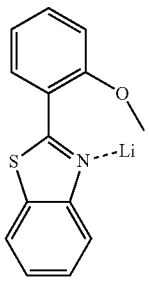

Then, an EIL 27B, which facilitates injection of electrons from the anode, may be formed on the ETL 27A. Any suitable electron-injecting material may be used to form the EIL 27B.

Non-limiting examples of materials for forming the EIL 27B are LiF, NaCl, CsF, Li$_2$O, and BaO, which are known in the art. The deposition and coating conditions for forming the EIL 27B may be similar to those for the formation of the HIL 23A, though the deposition and coating conditions may vary according to the material that is used to form the EIL 27B.

The thickness of the EIL 28B may be from about 1 Å to about 100 Å, and in some embodiments, may be from about 3 Å to about 90 Å. When the thickness of the EIL 27B is within these ranges, the EIL 27B may have satisfactory electron injection ability without imparting a substantial increase in driving voltage to an OLED including it.

Figure 3:
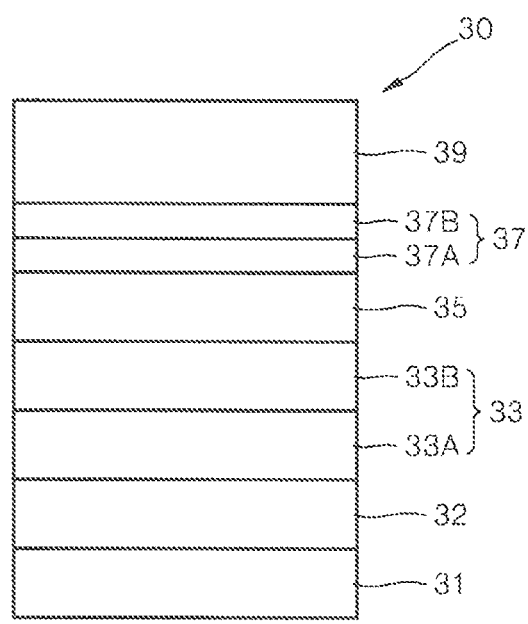
FIG. 3 is a schematic view of a structure of an organic light-emitting diode according to another embodiment of the present invention.

FIG. 3 is a schematic view of a structure of an organic light-emitting diode 30 according to another embodiment of the present invention. Referring to FIG. 3, the organic light emitting diode 30 has a structure including a substrate 31, a first electrode 32, a hole migration region 33, an EML 35, an electron migration region 37, and a second electrode 39 that are sequentially stacked on one another. The hole migration region 33 includes a HIL 33A and a HTL 33B that are sequentially stacked on the first electrode 32. The electron migration region 37 includes an ETL 37A and an EIL 37B that are sequentially stacked on the EML 35.

The above-detailed descriptions of the substrate 21, the first electrode 22, the HIL 23A, the ETL 27A, the EIL 27B, and the second electrode 29 may be referred to as detailed descriptions of the substrate 31, the first electrode 32, the HIL 33A, the ETL 37A, the EIL 38B, and the second electrode 39 of FIG. 3, respectively.

A material for the HTL 33B may be a first compound represented by Formula 1 above. The above-detailed description of Formula 1 above may be referred to here. For example, the HTL 33B may include a first compound of the Formula 1A, 1B, or 1C, $Ar_{101}$ and $Ar_{102}$ in Formulae 1A, 1B and 1C each being independently a group represented by one of Formulae 4-1 to 4-7; xa and xb each being independently 1 or 2; $R_{101}$ being a group represented by one of Formulae 6-1 to 6-8; $R_{109}$ being a group represented by one of Formulae 6-1 to 6-11; $R_{111}$ and $R_{112}$ being each independently one of a $C_1$-$C_{20}$ alkyl group; a $C_1$-$C_{20}$ alkyl group that is substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group that are substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and $R_{102}$ to $R_{108}$ and $R_{113}$ to $R_{119}$ may be hydrogen atoms.

In some embodiments, a material for the HTL 33B may be one of Compounds 1-1 to 1-19 above.

The thickness of the HTL 33B may be from about 50 Å to about 2000 Å, and in some embodiments, may be from about 100 Å to about 1500 Å. When the thickness of the HTL 33B is within these ranges, the HTL 33B may have satisfactory hole transporting ability without imparting a substantial increase in driving voltage to an OLED including it.

At least one of the HIL 33A and the HTL 33B may further include a charge-generating material as described above.

The EML 35 may include a host and a dopant, the dopant including a second compound represented by Formula 2 above. The above-detailed description of Formula 2 above may be referred to here. For example, the EML 35 may include a second compound of Formula 2A, 2B, or 2C as the host, $Ar_1$ and $Ar_2$ in Formulae 2A, 2B, and 2C each being independently a group represented by one of Formulae 4-1 to 4-7; a and b in Formulae 2A, 2B, and 2C being defined as one of i) a=0 and b=0, ii) a=1 and b=0, iii) a=0 and b=1 and iv) a=1 and b=1; $R_1$ and $R_2$ in Formulae 2A, 2B, and 2C each being independently a group represented by one of Formulae 6-1 to 6-17; and $R_{11}$ to $R_{14}$ in Formulae 2A, 2B, and 2C being hydrogen atoms.

In some embodiments, the EML 35 may include one of Compounds 2-1 to 2-25 above as the host, but it is not limited thereto.

The above-detailed descriptions of the dopant and thickness of the EML 25 of FIG. 2 may be referred to here as descriptions of the dopant and thickness of the EML 35 of FIG. 3.

Although described with reference to the organic light-emitting diodes 10, 20, and 30 of FIGS. 1, 2, and 3, the embodiments of the present invention are not limited thereto. Although not shown in FIGS. 2 and 3, a buffer layer may be further disposed between the second HTL 23B-2 and the EML 25 of FIG. 2, or between the HTL 33B and the EML 35 of FIG. 3 in order to compensate for an optical resonance distance according to the wavelength of light emitted from the EML 25 or 35 and thus to achieve higher efficiency. The buffer layer may include one of a hole injection material, a hole transporting material, the first compound of Formula 1 above and the second compound of Formula 2 above.

When the EML 25 or 35 includes a phosphorescent dopant, a hole blocking layer (HBL) may be disposed between the EML 25 and the ETL (27A) of FIG. 2, or between the EML 35 and the ETL 37A of FIG. 3, in order to prevent diffusion of triplet exitons or holes into the ETL 27A or 37A. When the HBL is formed using vacuum deposition or spin coating, the conditions for deposition and coating may be similar to those for the formation of the HIL, although the conditions for deposition and coating may vary according to the material that is used to form the HBL. Any known hole-blocking material may be used. Non-limiting examples of hole-blocking materials are oxadiazole derivatives, triazole derivatives, and phenanthroline derivatives. For example, bathocuproine (BCP) represented by the following formula may be used as a material for forming the HBL.

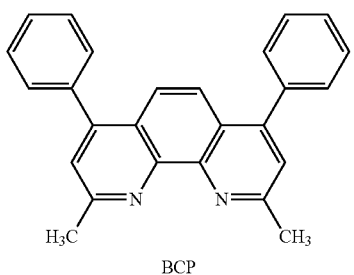

BCP

The thickness of the HBL may be from about 20 Å to about 1000 Å, and in some embodiments, may be from about 30 Å to about 300 Å. When the thickness of the HBL is within these ranges, the HBL may have improved hole blocking ability without imparting a substantial increase in driving voltage to an OLED including it.

In some embodiments, the HIL 23A of FIG. 2 and/or the HIL 33A of FIG. 3 may not be included. However, embodiments of the present invention are not limited thereto, and may include any of a variety of structures.

As used herein, the unsubstituted $C_1$-$C_{60}$ alkyl group (or a $C_1$-$C_{60}$ alkyl group) may be a linear or branched $C_1$-$C_{60}$ alkyl group, including a methyl group, an ethyl group, a propyl group, an isobutyl group, a sec-butyl group, a pentyl group, an iso-amyl group, and a hexyl group. The substituted $C_1$-$C_{60}$ alkyl group may include at least one substituent selected from among a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group; a $C_1$-$C_{60}$ alkyl group, a $C_2$-$C_{60}$ alkenyl group, a $C_2$-$C_{60}$ alkynyl group, and a $C_1$-$C_{60}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof; a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group; a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group that are substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and —N($Q_{11}$)($Q_{12}$) and —Si($Q_{11}$)($Q_{12}$)($Q_{13}$) (where $Q_{11}$ and $Q_{12}$ may be each independently a $C_6$-$C_{60}$ aryl group, or a $C_2$-$C_{60}$ heteroaryl group, and $Q_{13}$ to $Q_{15}$ may be each independently a $C_1$-$C_{60}$ alkyl group, a $C_1$-$C_{60}$ alkoxy group, a $C_6$-$C_{60}$ aryl group, or a $C_2$-$C_{60}$ heteroaryl group), but it is not limited thereto.

As used herein, the unsubstituted $C_1$-$C_{60}$ alkoxy group (or a $C_1$-$C_{60}$ alkoxy group) is represented by —OA (where A indicates a $C_1$-$C_{60}$ alkyl group as described above), and may be, for example, a methoxy group, an ethoxy group, or an isopropoxy group. At least one hydrogen atoms of these alkyl groups may be substituted with those substituents described above in conduction with the substituted $C_1$-$C_{60}$ alkyl group.

As used herein, the unsubstituted $C_2$-$C_{60}$ alkenyl group (or a $C_2$-$C_{60}$ alkenyl group) means as a $C_2$-$C_{60}$ alkyl group as described above with at least one carbon double bond in the middle or terminal thereof. Examples of the alkenyl group are an ethenyl group, a propenyl group, a butenyl group, and the like. At least one hydrogen atom in the unsubstituted $C_2$-$C_{60}$ alkenyl group may be substituted with those substituents described above in conjunction with the substituted $C_1$-$C_{60}$ alkyl group.

The unsubstituted $C_2$-$C_{60}$ alkynyl group is a $C_2$-$C_{60}$ alkyl group having at least one carbon-carbon triple bond in the center or at a terminal thereof. Examples of the unsubstituted $C_2$-$C_{60}$ alkynyl group are an ethenyl group, a propynyl group, and the like. At least one hydrogen atom in the alkynyl group may be substituted with those substituents described above in conjunction with the substituted $C_1$-$C_{60}$ alkyl group.

The unsubstituted $C_6$-$C_{60}$ aryl group is a monovalent carbocyclic aromatic system having 6 to 60 carbon atoms and including at least one aromatic ring. The unsubstituted $C_6$-$C_{60}$ arylene group is a divalent group having a divalent carbocyclic aromatic system having 6 to 60 carbon atoms including at least one aromatic ring. When the aryl group and the arylene group have at least two rings, they may be fused to each other via a single bond. At least one hydrogen atom in the aryl group and the arylene group may be substituted with those substituents described above in conjunction with the $C_1$-$C_{60}$ alkyl group.

Examples of the substituted or unsubstituted $C_6$-$C_{60}$ aryl group are a phenyl group, a $C_1$-$C_{10}$ alkylphenyl group (e.g., an ethylphenyl group), a $C_1$-$C_{10}$ alkylbiphenyl group (e.g., an ethylbiphenyl group), a halophenyl group (e.g., an o-, m- or p-fluorophenyl group and a dichlorophenyl group), a dicyanophenyl group, a trifluoromethoxyphenyl group, an o-, m- or p-tolyl group, an o-, m- or p-cumenyl group, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, a halonaphthyl group (e.g., a fluoronaphthyl group), a $C_1$-$C_{10}$ alkylnaphthyl group (e.g., a methylnaphthyl group), a $C_1$-$C_{10}$ alkoxynaphthyl group (e.g., a methoxynaphthyl group), an anthracenyl group, an azulenyl group, a heptalenyl group, an acenaphthylenyl group, a phenalenyl group, a fluorenyl group, an anthraquinolyl group, a methylanthryl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, hexacenyl group, a rubicenyl group, a coronenyl group, a trinaphthylenyl group, a heptaphenyl group, a heptacenyl group, a pyranthrenyl group, and an ovalenyl group. Examples of the substituted $C_6$-$C_{60}$ aryl group may be inferred based on those of the unsubstituted $C_6$-$C_{60}$ aryl group and the substituted $C_1$-$C_{30}$ alkyl group described above. Examples of the substituted or unsubstituted $C_6$-$C_{60}$ arylene group may be inferred based on those examples of the substituted or unsubstituted $C_6$-$C_{60}$ aryl group described above.

The unsubstituted $C_2$-$C_{60}$ heteroaryl group is a monovalent group having at least one aromatic ring having at least one of the heteroatoms selected from the group consisting of N, O, P, and S. The unsubstituted $C_2$-$C_{60}$ heteroarylene group is a divalent group having at least one aromatic ring having at least one of the heteroatoms selected from the group consisting of N, O, P, and S. In this regard, when the heteroaryl group and the heteroarylene group have at least two rings, they may be fused to each other via a single bond. At least one hydrogen atom in the heteroaryl group and the heteroarylene group may be substituted with those substituents described with reference to the $C_1$-$C_{60}$ alkyl group.

Examples of the unsubstituted $C_2$-$C_{60}$ heteroaryl group are a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group and an imidazopyrimidinyl group. Examples of the substituted or unsubstituted $C_2$-$C_{60}$ heteroarylene group may be inferred based on those examples of the substituted or unsubstituted $C_2$-$C_{60}$ arylene group described above.

The substituted or unsubstituted $C_6$-$C_{60}$ aryloxy group indicates —$SA_2$ (where $A_2$ is a substituted or unsubstituted $C_6$-$C_{60}$ aryl group described above). The substituted or unsubstituted $C_5$-$C_{60}$ arylthiol group indicates —$SA_3$ (where $A_3$ is a substituted or unsubstituted $C_6$-$C_{60}$ aryl group described above).

Hereinafter, the present invention will be described in detail with reference to the following synthesis examples and other examples. However, these examples are for illustrative purposes only and are not intended to limit the scope of the present invention.

EXAMPLES

Example 1

To manufacture an anode, a glass substrate with deposited ITO/Ag/ITO layers (70/1000/70 Å) was cut to a size of 50 mm×50 mm×0.5 mm and then ultrasonicated in isopropyl alcohol and pure water each for five minutes, and then cleaned by irradiation of ultraviolet rays for 30 minutes and exposure to ozone. The resulting glass substrate was loaded into a vacuum deposition device.

After 2-TNATA was vacuum-deposited on the anode to form an HIL having a thickness of about 600 Å, Compound 1-8 was vacuum-deposited on the HIL to form a first HTL having a thickness of about 600 Å, and Compound 2-1 was deposited on the first HTL to form a second HTL having a thickness of about 400 Å.

After CBP (host) and tris[2-phenylpyridinato-$C^2$,N] iridium(III) (Ir(ppy)$_3$) were co-deposited in a weight ratio of about 91:9 on the second HTL to form an EML having a thickness of about 250 Å, BCP was deposited on the EML to form a hole-blocking layer having a thickness of about 50 Å. After deposition of Alq$_3$ on the hole-blocking layer to form an electron transport layer having a thickness of about 350 Å, LiF was deposited on the electron transport layer to form an electron injecting layer having a thickness of about 10 Å, and this was followed by depositing Mg and Al in a weight ratio of about 90:10 on the electron injection layer to form a cathode having a thickness of about 120 Å, thereby completing the manufacture of the organic light-emitting diode (emitting green light).

Example 2

An organic light-emitting diode was manufactured in the same manner as in Example 1, except that Compound 1-19, instead of Compound 1-8, was used to form the first HTL, and Compound 2-19, instead of Compound 2-1, was used to form the second HTL.

Example 3

To manufacture an anode, a glass substrate with deposited ITO/Ag/ITO layers (70/1000/70 Å) was cut to a size of 50 mm×50 mm×0.5 mm and then ultrasonicated in isopropyl alcohol and pure water each for five minutes, and then cleaned by irradiation of ultraviolet rays for 30 minutes and exposure to ozone. The resulting glass substrate was loaded into a vacuum deposition device.

After 2-TNATA was vacuum-deposited on the anode to form a HIL having a thickness of 600 Å, Compound 1-8 was vacuum-deposited on the HIL to form a first HTL having a thickness of 600 Å, and Compound 2-7 was deposited on the first HTL to form a second HTL having a thickness of about 750 Å.

CBP (host) and platinum octaethylporphyrin (PtOEP) were co-deposited in a weight ratio of about 91:9 on the second HTL to form an EML having a thickness of about 400 Å, followed by depositing BCP on the EML to form a hole-blocking layer having a thickness of about 50 Å. After deposition of Alq$_3$ on the hole-blocking layer to form an ETL having a thickness of about 350 Å, LiF was deposited on the ETL to form an EIL having a thickness of about 10 Å, and this was followed by depositing Mg and Al in a weight ratio of about 90:10 on the EIL to form a cathode having a thickness of about 120 Å, thereby completing the manufacture of the organic light-emitting diode (emitting red light).

Example 4

An organic light-emitting diode was manufactured in the same manner as in Example 3, except that Compound 1-17, instead of Compound 1-8, was used to form the first HTL, and Compound 2-19, instead of Compound 2-7, was used to form the second HTL.

Example 5

An organic light-emitting diode (emitting green light) was manufactured in the same manner as in Example 1, except that, instead of forming the first HTL and the second HTL on the HIL, Compound 1-8 was deposited to form a HTL having a thickness of about 1000 Å, and Compound 2-7 (host) and Ir(ppy)$_3$ were co-deposited on the HTL in a weight ratio of 91:9 to form an EML having a thickness of about 250 Å.

Example 6

An organic light-emitting diode was manufactured in the same manner as in Example 5, except that Compound 1-17, instead of Compound 1-8, was used to form the HTL, and Compound 2-10, instead of Compound 2-7, was used as a host in forming the EML.

Example 7

An organic light-emitting diode was manufactured in the same manner as in Example 3, except that, instead of forming the first HTL and the second HTL on the HIL, Compound 1-8 was deposited to form a HTL having a thickness of about 1350 Å, and Compound 2-10 (host) and PtOEP were co-deposited on the HTL in a weight ratio of 91:9 to form an EML having a thickness of about 400 Å.

Example 8

An organic light-emitting diode was manufactured in the same manner as in Example 7, except that Compound 1-19, instead of Compound 1-8, was used to form the HTL, and Compound 2-19, instead of Compound 2-10, was used as a host in forming the EML.

Comparative Example 1

An organic light-emitting diode was manufactured in the same manner as in Example 5, except that Compound A represented by Formula A below, instead of Compound 1-8, was used to form the HTL, and CBP, instead of Compound 2-7, was used as a host in forming the EML.

<Formula A>

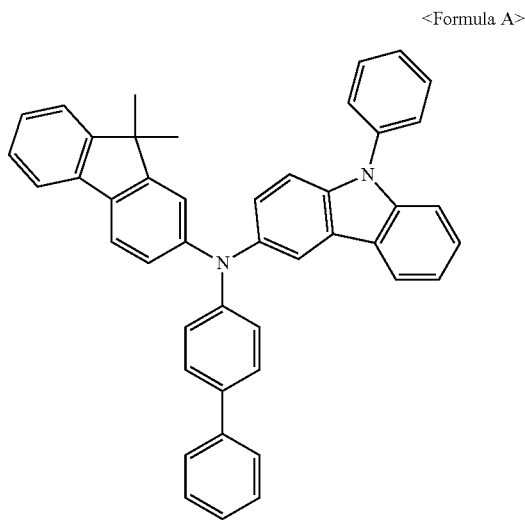 [SMILES: CC1(C)c2ccccc2-c2ccc(N(c3ccc(-c4ccccc4)cc3)c3ccc4c(c3)c3ccccc3n4-c3ccccc3)cc21]

Comparative Example 2

An organic light-emitting diode was manufactured in the same manner as in Example 7, except that Compound A of Formula A above, instead of Compound 1-8, was used to form the HTL, and CBP, instead of Compound 2-10, was used as a host in forming the EML.

Evaluation Example 1

Driving voltages, luminances, emitting-light colors, efficiencies, and half-life spans (@10 mA/cm$^2$) of the organic light-emitting diodes of Examples 1 to 8 and Comparative Examples 1 and 2 were measured using a PR650 (Spectroscan) Source Measurement Unit (available from Photo Research, Inc.). The results are shown in Tables 1 and 2 below. LT$_{97}$ lifetime indicates the time taken until a measured initial luminosity (assumed as 100%) is reduced to 97%.

TABLE 1

| Example | HTL First HTL | Second HTL | Host | Dopant | Driving voltage (V) | Current density (mA/cm$^2$) | Luminance (cd/m$^2$) |
|---|---|---|---|---|---|---|---|
| Example 1 | Compound 1-8 | Compound 2-1 | CBP | Ir(ppy)$_3$ | 6.0 | 10 | 6,369 |
| Example 2 | Compound 1-19 | Compound 2-19 | CBP | Ir(ppy)$_3$ | 5.9 | 10 | 6,592 |
| Example 3 | Compound 1-8 | Compound 2-7 | CBP | PtOEP | 6.3 | 10 | 3,351 |
| Example 4 | Compound 1-17 | Compound 2-19 | CBP | PtOEP | 6.2 | 10 | 3,207 |
| Example 5 | Compound 1-8 | | Compound 2-7 | Ir(ppy)$_3$ | 5.8 | 10 | 6,824 |
| Example 6 | Compound 1-17 | | Compound 2-10 | Ir(ppy)$_3$ | 5.9 | 10 | 6,482 |
| Example 7 | Compound 1-8 | | Compound 2-10 | PtOEP | 6.3 | 10 | 3,637 |
| Example 8 | Compound 1-19 | | Compound 2-19 | PtOEP | 6.4 | 10 | 3,408 |
| Comparative Example 1 | Compound A | | CBP | Ir(ppy)$_3$ | 6.7 | 10 | 4,551 |
| Comparative Example 2 | Compound A | | CBP | PtOEP | 7.1 | 10 | 2,009 |

TABLE 2

| Example | HTL First HTL | HTL Second HTL | Host | Dopant | Efficiency (cd/A) | Emission color | LT$_{97}$ (hr) |
|---|---|---|---|---|---|---|---|
| Example 1 | Compound 1-8 | Compound 2-1 | CBP | Ir(ppy)$_3$ | 63.7 | Green | 83 |
| Example 2 | Compound 1-19 | Compound 2-19 | CBP | Ir(ppy)$_3$ | 65.9 | Green | 87 |
| Example 3 | Compound 1-8 | Compound 2-7 | CBP | PtOEP | 33.5 | Red | 133 |
| Example 4 | Compound 1-17 | Compound 2-19 | CBP | PtOEP | 32.1 | Red | 137 |
| Example 5 | Compound 1-8 | | Compound 2-7 | Ir(ppy)$_3$ | 68.2 | Green | 81 |
| Example 6 | Compound 1-17 | | Compound 2-10 | Ir(ppy)$_3$ | 64.8 | Green | 80 |
| Example 7 | Compound 1-8 | | Compound 2-10 | PtOEP | 36.4 | Red | 146 |
| Example 8 | Compound 1-19 | | Compound 2-19 | PtOEP | 34.1 | Red | 140 |
| Comparative Example 1 | Compound A | | CBP | Ir(ppy)$_3$ | 45.5 | Green | 60 |
| Comparative Example 2 | Compound A | | CBP | PtOEP | 20.1 | Red | 102 |

Referring to Tables 1 and 2, the organic light-emitting diodes of Examples 1 to 8 were found to have lower driving voltages, higher luminance, higher efficiencies, higher color purity, and better lifetime characteristics, as compared to the organic light-emitting diodes of Comparative Examples 1 and 2.

As described above, according to one or more of the above embodiments of the present invention, an organic light-emitting diode may have a low driving voltage, a high efficiency, and a long lifetime.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. An organic light-emitting diode comprising:
a substrate; a first electrode on the substrate; a second electrode disposed opposite to the first electrode; an emission layer disposed between the first electrode and the second electrode; a hole migration region disposed between the first electrode and the emission layer; and an electron migration region disposed between the emission layer and the second electrode,
the hole migration region comprising a first compound represented by Formula 1 below, at least one of the hole migration region and the emission layer comprising a second compound represented by Formula 2 below:

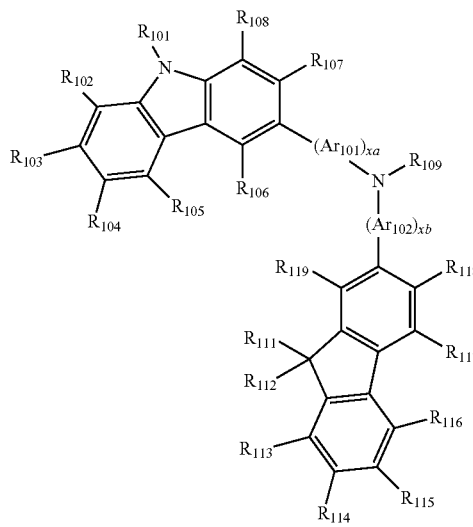

<Formula 1>

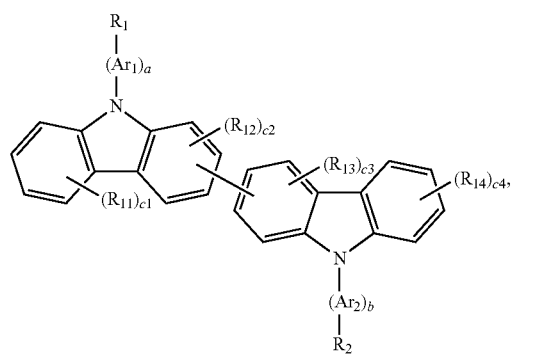

<Formula 2>

$Ar_{101}$, $Ar_{102}$, $Ar_1$, and $Ar_2$ in Formulae 1 and 2 each being independently selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, and a substituted or unsubstituted $C_2$-$C_{60}$ heteroarylene group;

xa, xb, a, and b in Formulae 1 and 2 each being independently an integer from 0 to 5;

$R_{101}$, $R_{109}$, $R_1$, and $R_2$ in Formulae 1 and 2 each being independently selected from a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, and a substituted or unsubstituted $C_2$-$C_{60}$ heteroaryl group;

$R_{102}$ to $R_{108}$, $R_{111}$ to $R_{119}$, and $R_{11}$ to $R_{14}$ in Formulae 1 and 2 each being independently selected from: a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, —N($Q_1$)($Q_2$), and —Si($Q_3$)($Q_4$)($Q_5$) (where $Q_1$ to $Q_5$ are each independently one of a $C_1$-$C_{60}$ alkyl group, a $C_1$-$C_{60}$ alkoxy group, a $C_6$-$C_{60}$ aryl group, and a $C_2$-$C_{60}$ heteroaryl group);

c1 and c4 in Formula 2 each being independently an integer from 1 to 4; and c2 and c3 in Formula 2 each being independently an integer from 1 to 3.

2. The organic light-emitting diode of claim 1, $Ar_{101}$, $Ar_{102}$, $Ar_1$, and $Ar_2$ in Formulae 1 and 2 each being independently a group represented by one of Formulae 3-1 to 3-24 below:

Formula 3-1

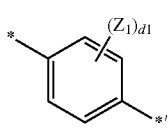

Formula 3-2

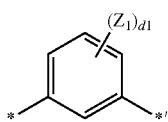

Formula 3-3

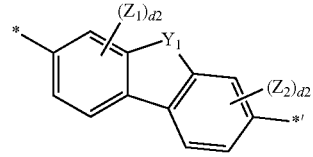

Formula 3-4

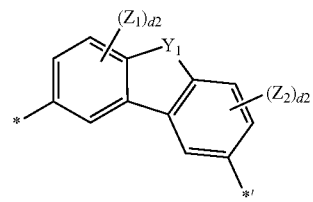

Formula 3-5

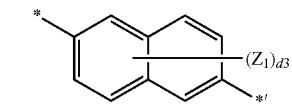

Formula 3-6

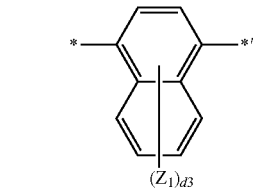

Formula 3-7

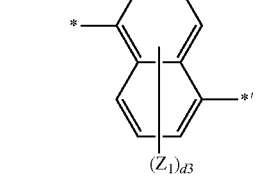

Formula 3-8

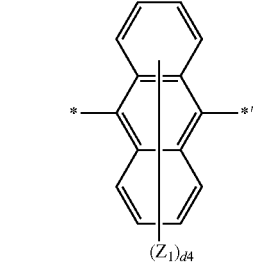

Formula 3-9

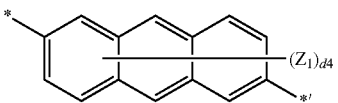

Formula 3-10

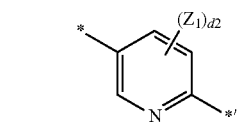

Formula 3-11

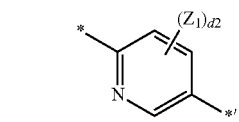

-continued

Formula 3-12 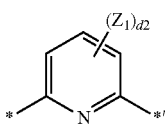

Formula 3-13 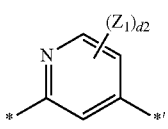

Formula 3-14 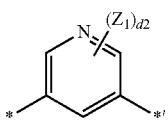

Formula 3-15 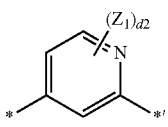

Formula 3-16 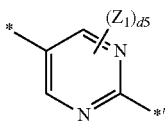

Formula 3-17 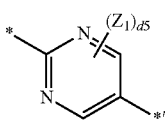

Formula 3-18 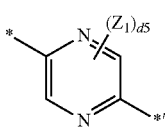

Formula 3-19 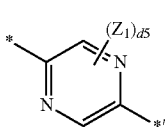

Formula 3-20 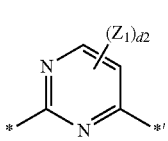

Formula 3-21 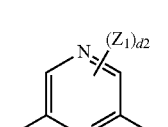

Formula 3-22 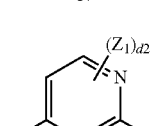

Formula 3-23 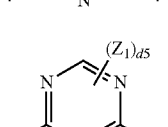

-continued

Formula 3-24 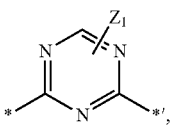

$Y_1$ in Formulae 3-3 and 3-4 being one of O, S, $C(R_{21})(R_{22})$ and $N(R_{23})$;

$Z_1$, $Z_2$, and $R_{21}$ to $R_{23}$ in Formula 3-1 to 3-24 each being independently selected from among:

a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof;

a $C_6$-$C_{20}$ aryl group and a $C_2$-$C_{20}$ heteroaryl group;

a $C_6$-$C_{20}$ aryl group and a $C_2$-$C_{20}$ heteroaryl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and —$N(Q_{11})(Q_{12})$ and —$Si(Q_{13})(Q_{14})(Q_{15})$ (where $Q_{11}$ to $Q_{15}$ are each independently one of a $C_1$-$C_{20}$ alkyl group, a $C_1$-$C_{20}$ alkoxy group, a $C_6$-$C_{20}$ aryl group and a $C_2$-$C_{20}$ heteroaryl group);

d1 in Formula 3-1 to 3-24 being an integer from 1 to 4;
d2 in Formula 3-1 to 3-24 being an integer from 1 to 3;
d3 in Formula 3-1 to 3-24 being an integer from 1 to 6;
d4 in Formula 3-1 to 3-24 being an integer from 1 to 8; and
d5 in Formula 3-1 to 3-24 being an integer of 1 or 2.

3. The organic light-emitting diode of claim 2, $Z_1$, $Z_2$, and $R_{21}$ to $R_{23}$ each being independently selected from among:

a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group, and a $C_1$-$C_{20}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phoshoric acid group or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and —$N(Q_{11})(Q_{12})$ and —$Si(Q_{13})(Q_{14})(Q_{15})$ (where $Q_{11}$ to $Q_{15}$ are each independently one of a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group).

4. The organic light-emitting diode of claim 1, $Ar_{101}$, $Ar_{102}$, $Ar_1$, and $Ar_2$ in Formulae 1 and 2 each being independently a group represented by one of Formulae 4-1 to 4-7 below:

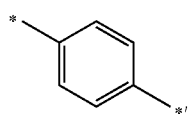

Formula 4-1

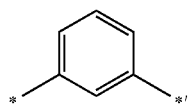

Formula 4-2

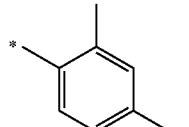

Formula 4-3

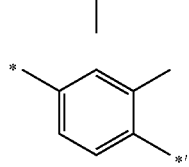

Formula 4-4

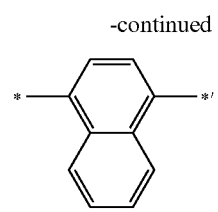

Formula 4-5

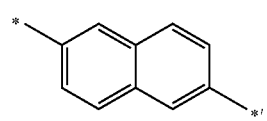

Formula 4-6

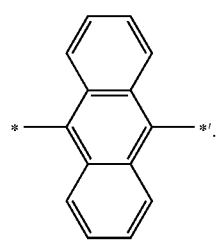

Formula 4-7

5. The organic light-emitting diode of claim 1, Formula 1 being further defined by one of: i) xa=0 and xb=0; ii) xa=1 and xb=0; iii) xa=2 and xb=0; iv) xa=0 and xb=1; v) xa=0 and xb=2; and vi) xa=1 and xb=1.

6. The organic light-emitting diode of claim 1, Formula 2 being further defined by one of: i) a=0 and b=0; ii) a=1 and b=0; iii) a=0 and b=1; and iv) a=1 and b=1.

7. The organic light-emitting diode of claim 1, $R_{101}$, $R_{109}$, $R_1$, and $R_2$ in Formulae 1 and 2 each being independently a group represented by one of Formulae 5-1 to 5-22 below:

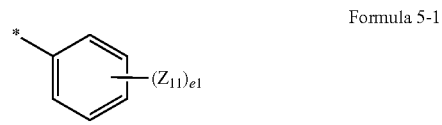

Formula 5-1

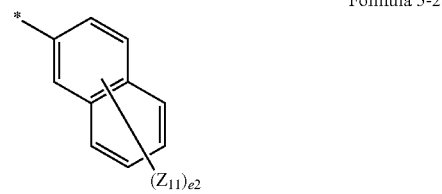

Formula 5-2

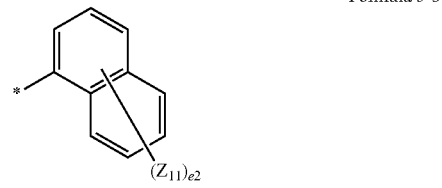

Formula 5-3

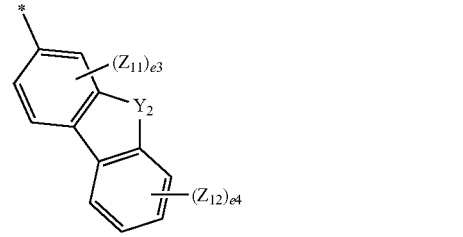

Formula 5-4

-continued

Formula 5-5
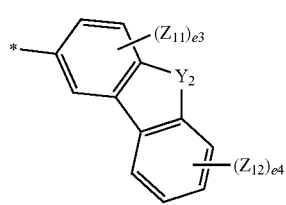

Formula 5-6
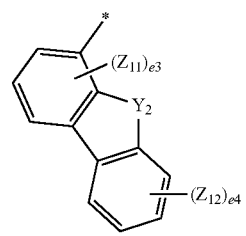

Formula 5-7
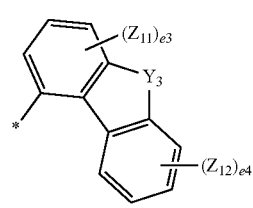

Formula 5-8
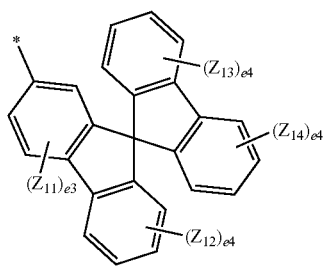

Formula 5-9
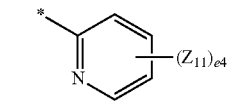

Formula 5-10
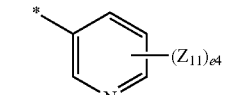

Formula 5-11
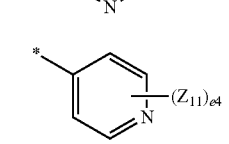

Formula 5-12
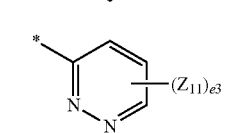

Formula 5-13
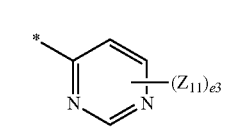

Formula 5-14
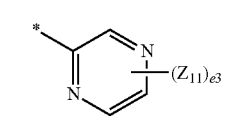

-continued

Formula 5-15
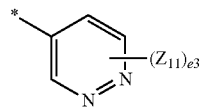

Formula 5-16
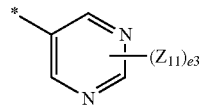

Formula 5-17
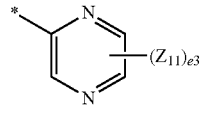

Formula 5-18
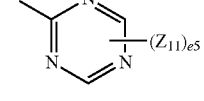

Formula 5-19
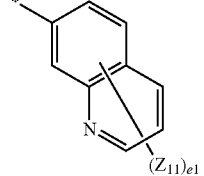

Formula 5-20
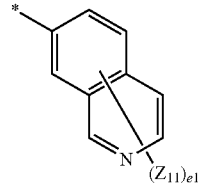

Formula 5-21
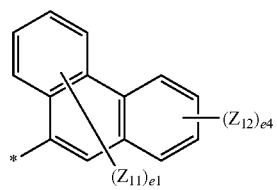

Formula 5-22
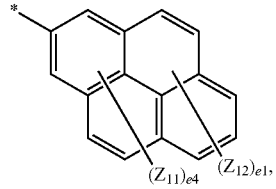

$Y_2$ in Formula 5-1 to 5-22 being one of O, S, C($R_{25}$)($R_{26}$) and N($R_{27}$);

$Z_{11}$ to $Z_{14}$, and $R_{25}$ to $R_{27}$ in Formula 5-1 to 5-22 each being independently selected from among:

a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phoshoric acid group or a salt thereof;

a $C_6$-$C_{20}$ aryl group, and a $C_2$-$C_{20}$ heteroaryl group;

a $C_6$-$C_{20}$ aryl group and a $C_2$-$C_{20}$ heteroaryl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and —$N(Q_{11})(Q_{12})$ and —$Si(Q_{13})(Q_{14})(Q_{15})$ (where $Q_{11}$ to $Q_{15}$ are each independently one of a $C_1$-$C_{20}$ alkyl group, a $C_1$-$C_{20}$ alkoxy group, a $C_6$-$C_{20}$ aryl group and a $C_2$-$C_{20}$ heteroaryl group);

e1 in Formula 5-1 to 5-22 being an integer from 1 to 5;
e2 in Formula 5-1 to 5-22 being an integer from 1 to 7;
e3 in Formula 5-1 to 5-22 being an integer from 1 to 3;
e4 in Formula 5-1 to 5-22 being an integer from 1 to 4; and
e5 in Formula 5-1 to 5-22 being an integer from 1 or 2.

8. The organic light-emitting diode of claim 7, $Z_{11}$ to $Z_{14}$, and $R_{25}$ to $R_{27}$ each being independently selected from among:

a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phoshoric acid group or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and —$N(Q_{11})(Q_{12})$ and —$Si(Q_{13})(Q_{14})(Q_{15})$ (where $Q_{11}$ to $Q_{15}$ are each independently one of a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group and an isoquinolyl group).

9. The organic light-emitting diode of claim 1, $R_{101}$ in Formula 1 being a group represented by one of Formulae 6-1 to 6-8 below, $R_{109}$ in Formula 1 being a group represented by one of Formulae Formula 6-1 to 6-11 below:

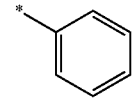

Formula 6-1

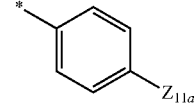

Formula 6-2

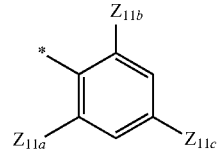

Formula 6-3

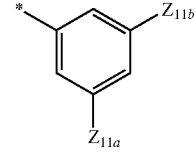

Formula 6-4

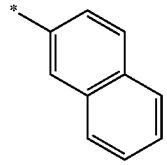

Formula 6-5

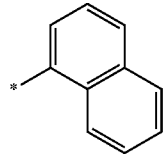

Formula 6-6

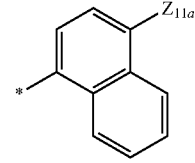

Formula 6-7

-continued

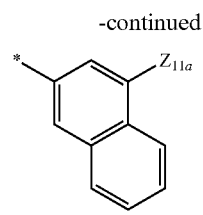

Formula 6-8

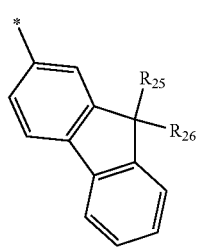

Formula 6-9

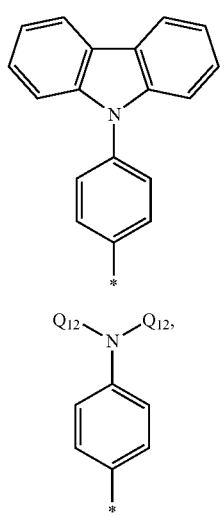

Formula 6-10

Formula 6-11

$Z_{11a}$ to $Z_{11c}$, $R_{25}$, and $R_{26}$ in Formulae 6-1 to 6-11 each being independently selected from among:

a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phoshoric acid group or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group; and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and $Q_{11}$ and $Q_{12}$ in Formulae 6-1 to 6-11 each being independently one of a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group and an isoquinolyl group.

10. The organic light-emitting diode of claim 1, $R_1$ and $R_2$ in Formula 2 each being independently a group represented by one of Formulae 6-1 to 6-17 below:

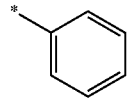

Formula 6-1

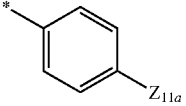

Formula 6-2

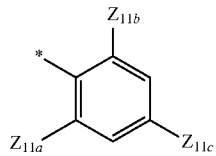

Formula 6-3

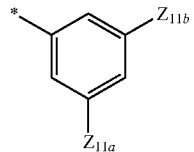

Formula 6-4

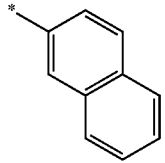

Formula 6-5

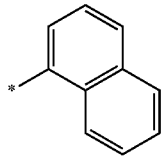

Formula 6-6

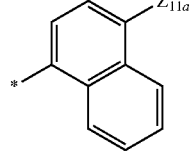

Formula 6-7

-continued

Formula 6-8
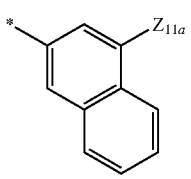

Formula 6-9
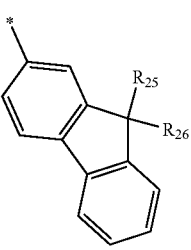

Formula 6-10
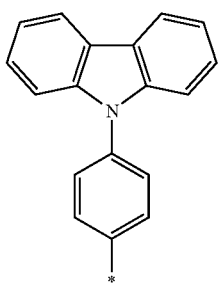

Formula 6-11
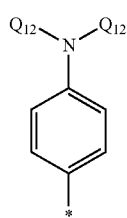

Formula 6-12
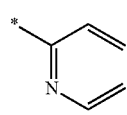

Formula 6-13
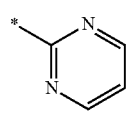

Formula 6-14
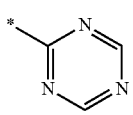

Formula 6-15
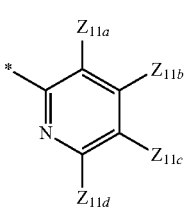

-continued

Formula 6-16
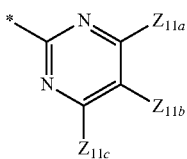

Formula 6-17
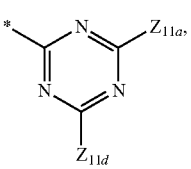

$Z_{11a}$ to $Z_{11d}$, and $R_{25}$ and $R_{26}$ in Formula 6-1 to 6-17 each being independently selected from among:

a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phoshoric acid group or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group; and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and $Q_{11}$ and $Q_{12}$ in Formula 6-1 to 6-17 each being independently one of a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group and an isoquinolyl group.

11. The organic light-emitting diode of claim 1, $R_{111}$ and $R_{112}$ in Formula 1 each being independently selected from among a $C_1$-$C_{20}$ alkyl group; a $C_1$-$C_{20}$ alkyl group that is substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phoshoric acid group or a salt thereof; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group; and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group.

12. The organic light-emitting diode of claim 1, the first compound being a compound represented by one of Formulae 1A, 1B and 1C below, and the second compound is a compound represented by one of Formulae 2A, 2B and 2C below:

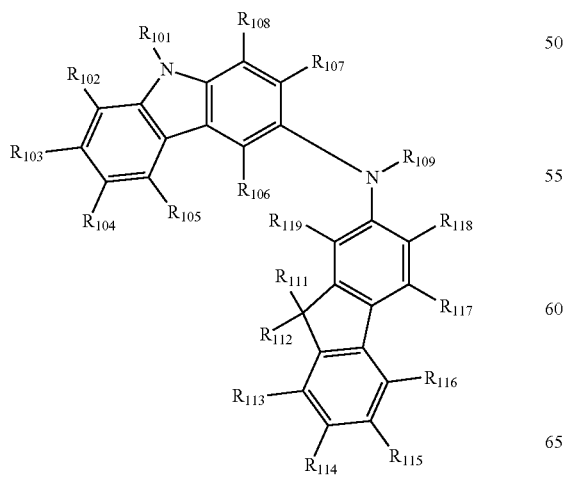

<Formula 1A>

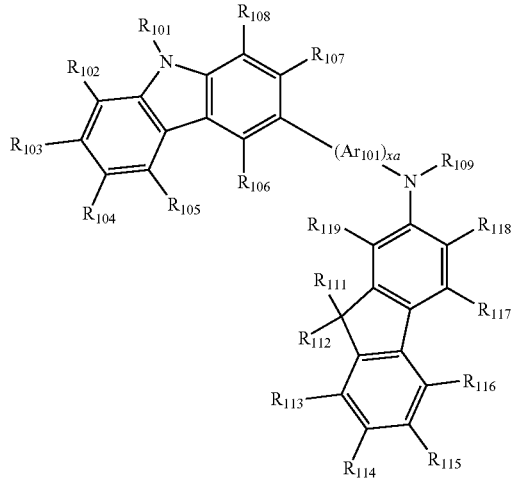

<Formula 1B>

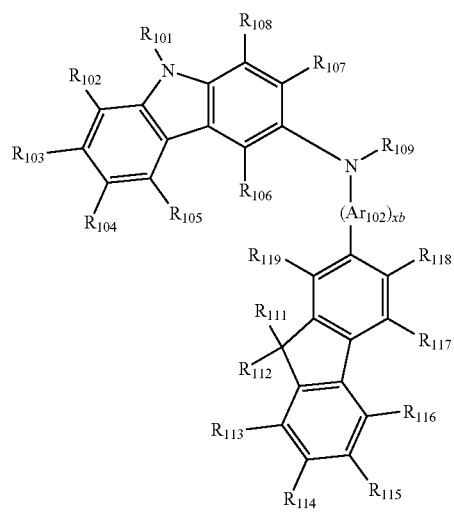

<Formula 1C>

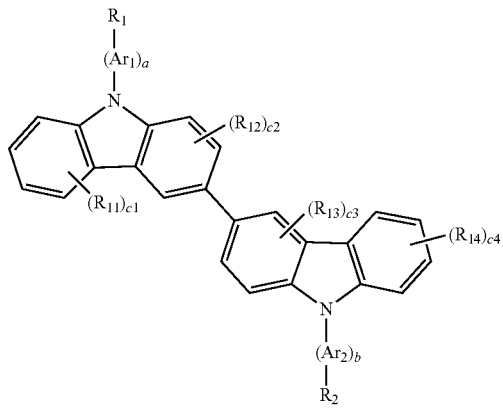

<Formula 2A>

<Formula 2B>
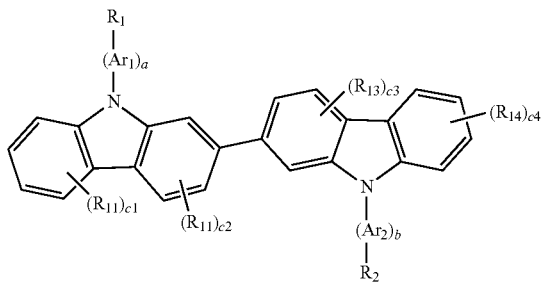
<Formula 2C>
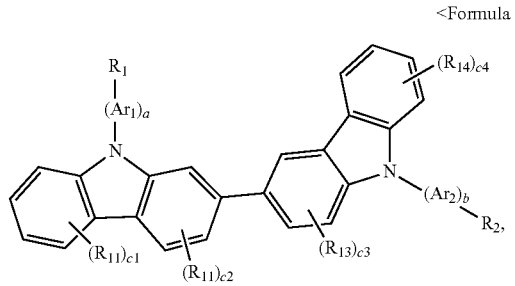
$Ar_{101}, Ar_{102}, xa, xb, R_{101}$ to $R_{109}, R_{111}$ to $R_{119}, R_1, R_2, R_{11}$ to $R_{14}$, a, b, c1, c2, c3, and c4 in Formulae 1A, 1B, 1C, 2A, 2B, and 2C being the same as defined in claim 1.
13. The organic light-emitting diode of claim 1, the first compound comprising one of Compounds 1-1 to 1-19 below, the second compound comprising one of Compounds 2-1 to 2-25:
1-1
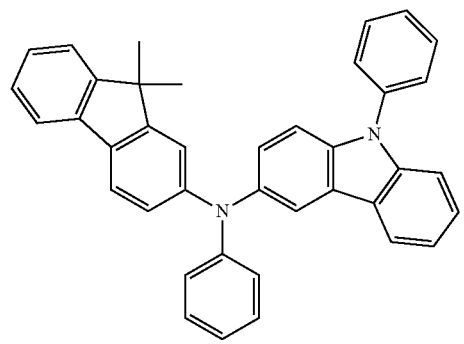
1-2
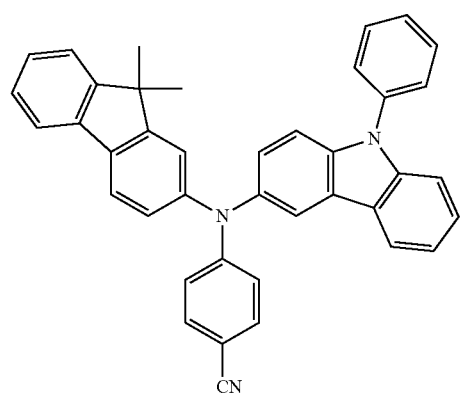
1-3
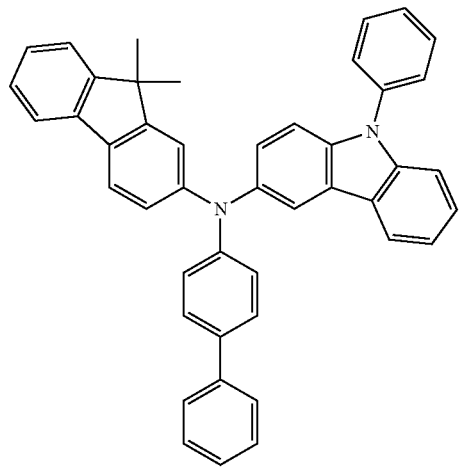
1-4
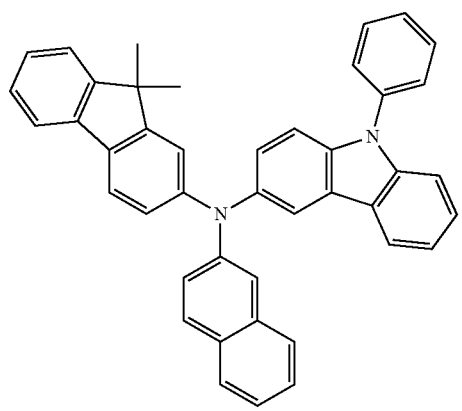
1-5
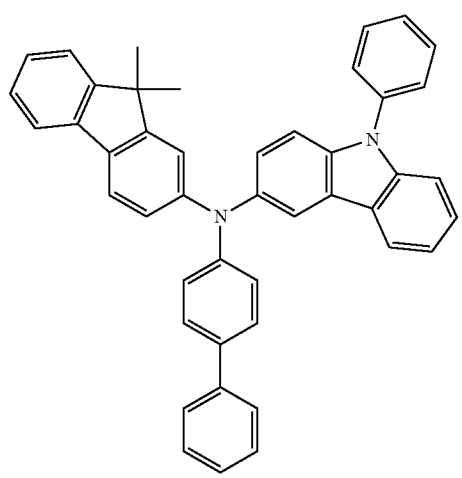

-continued
1-6
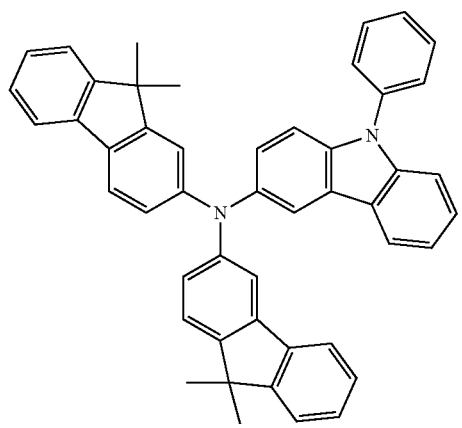
1-7
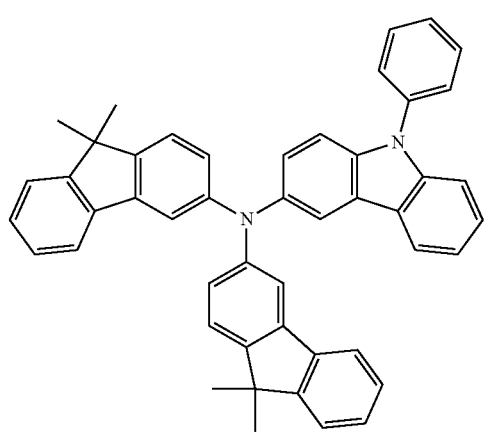
1-8
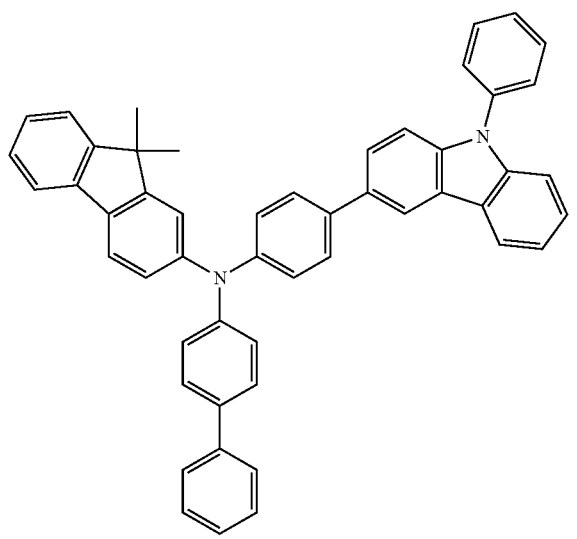
-continued
1-9
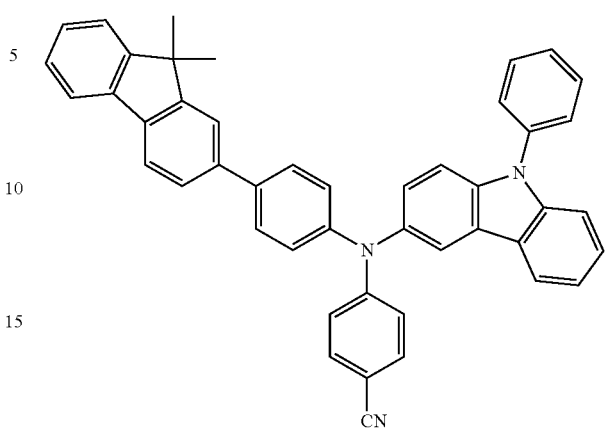
1-10
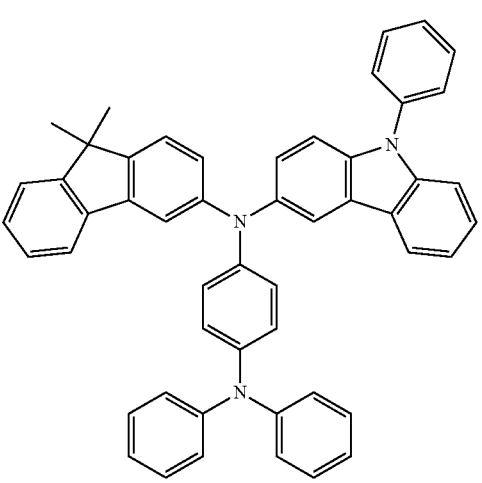
1-11
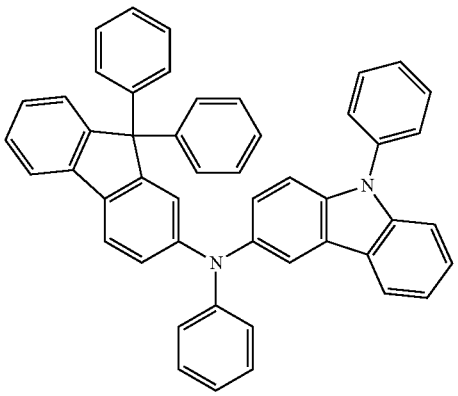

1-12
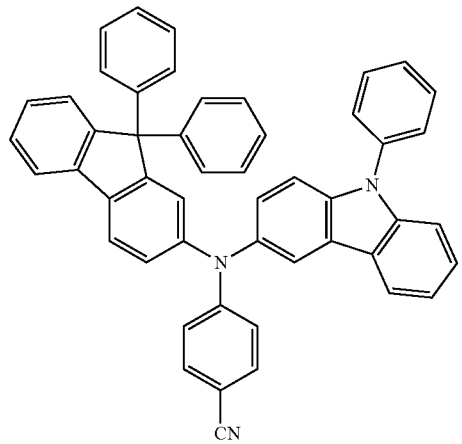
1-15
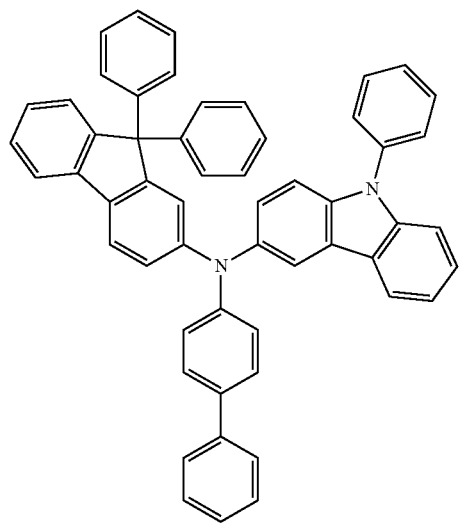
1-13
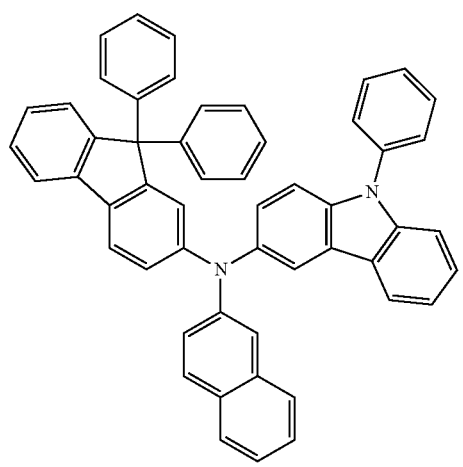
1-16
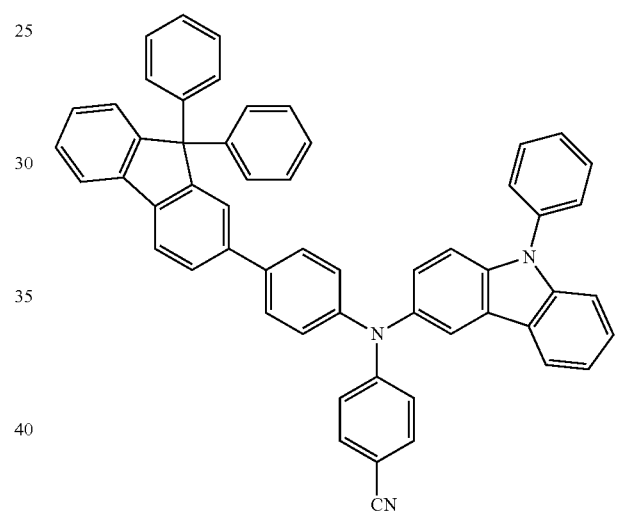
1-14
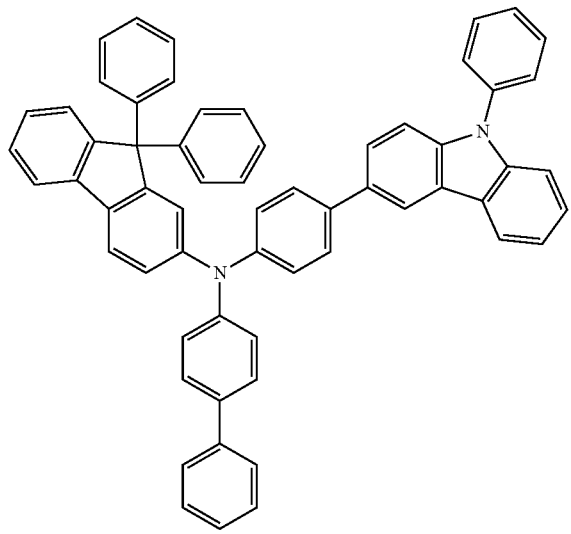
1-17
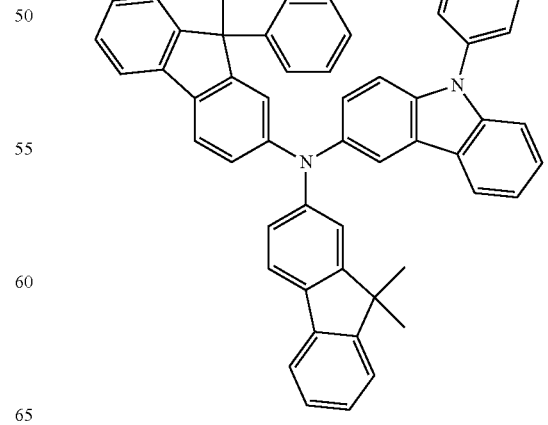

1-18
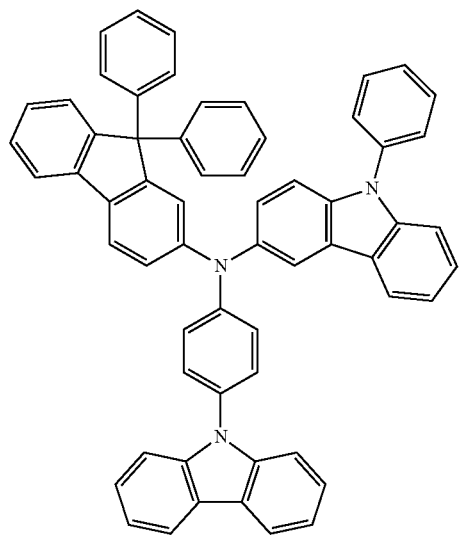
1-19
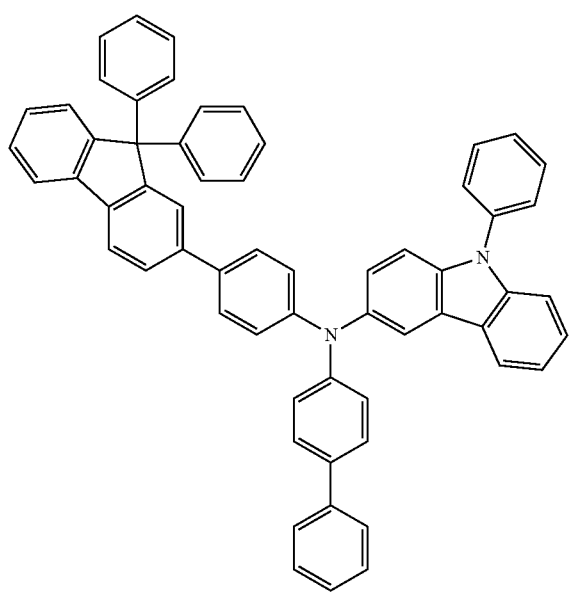
2-1
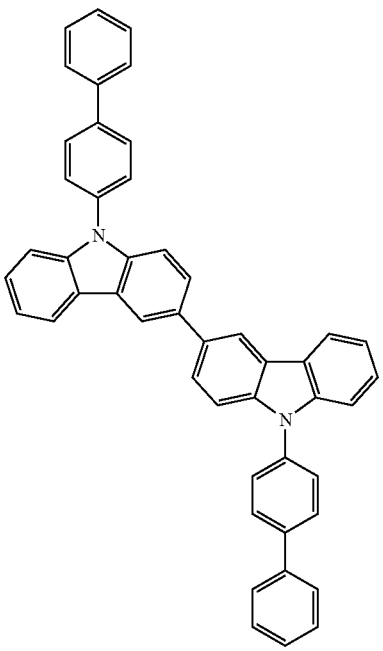
2-2
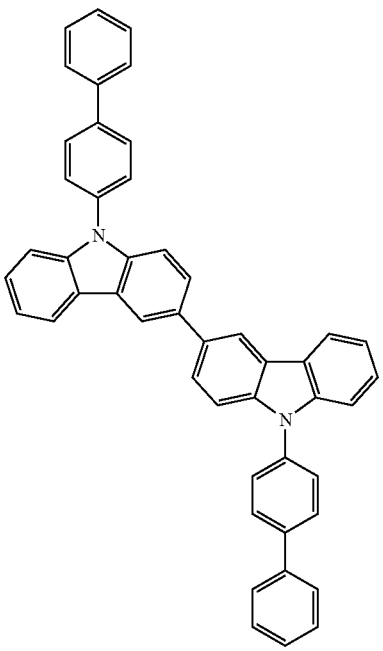
2-3
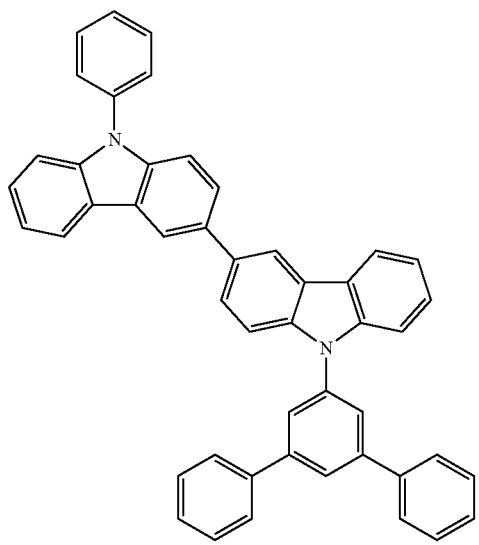

2-4
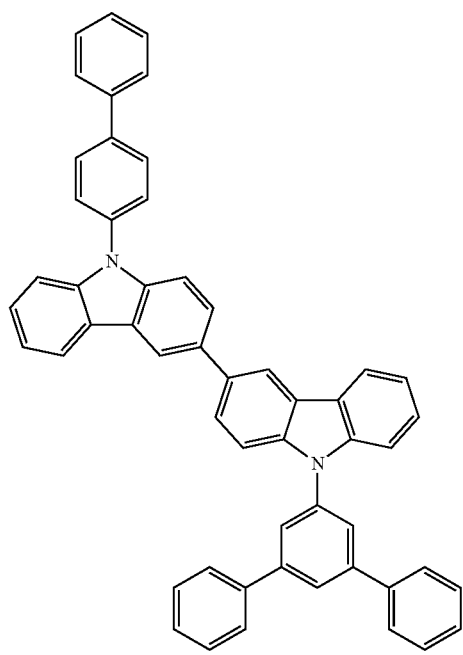
2-6
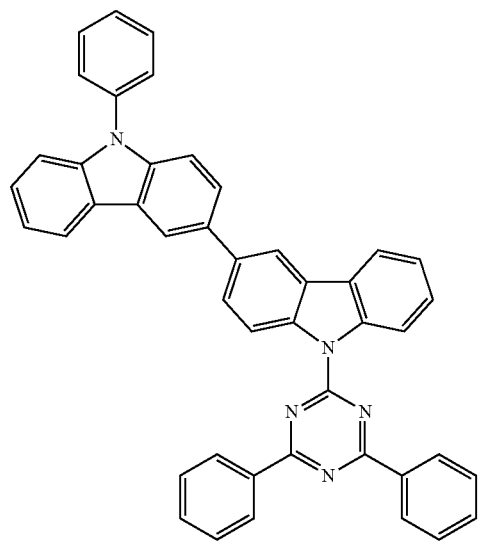
2-4
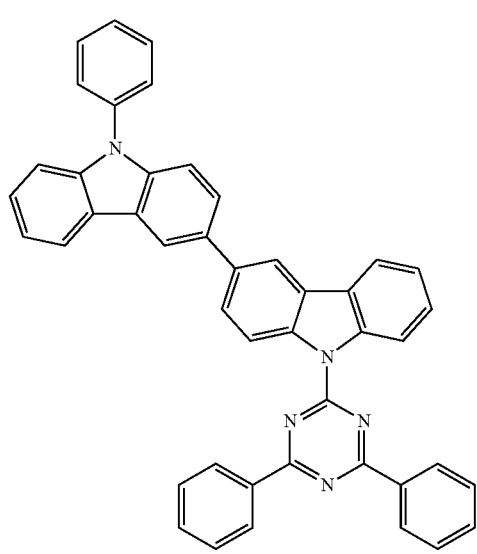
2-7
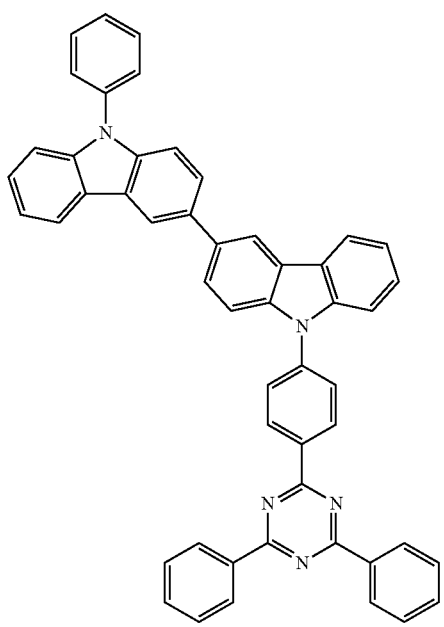

2-8
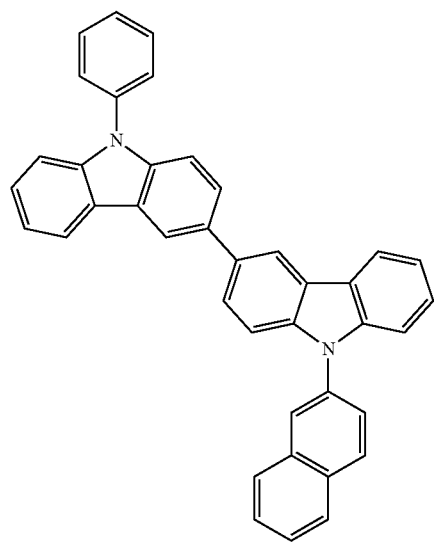
2-9
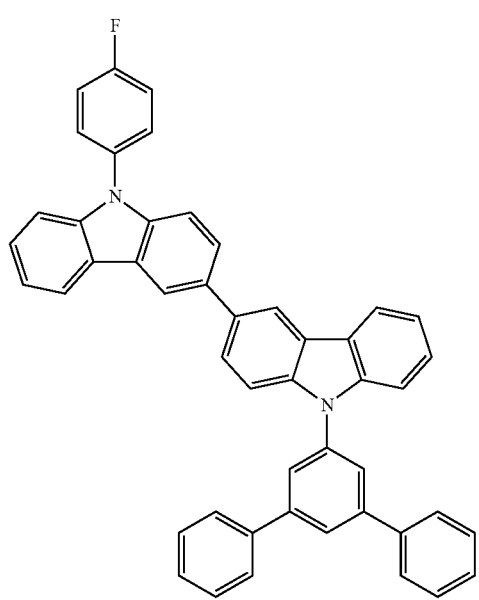
2-10
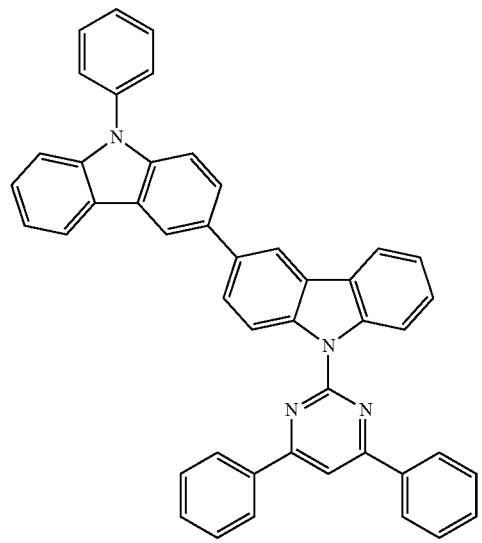
2-11
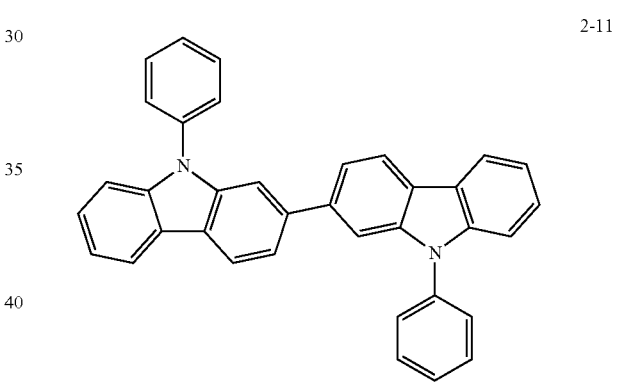
2-12
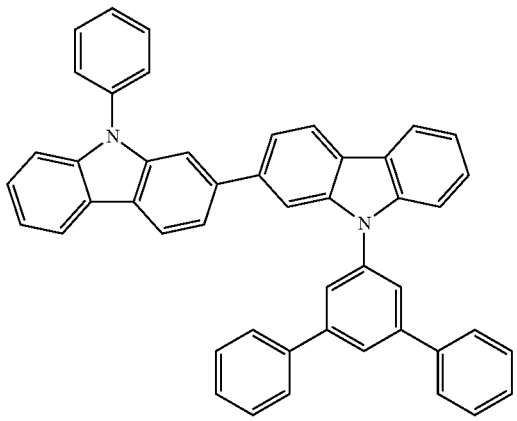

2-13
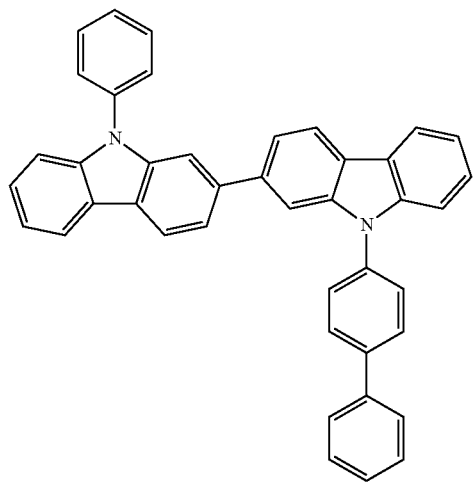
2-14
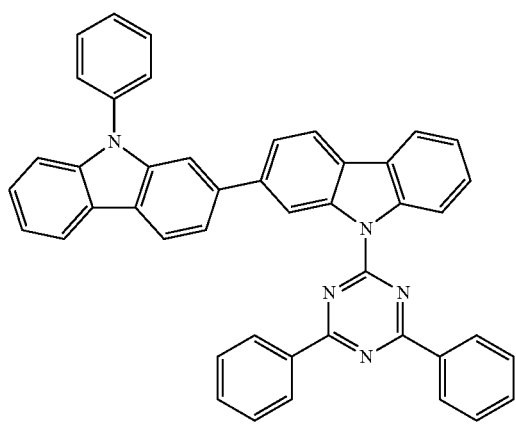
2-15
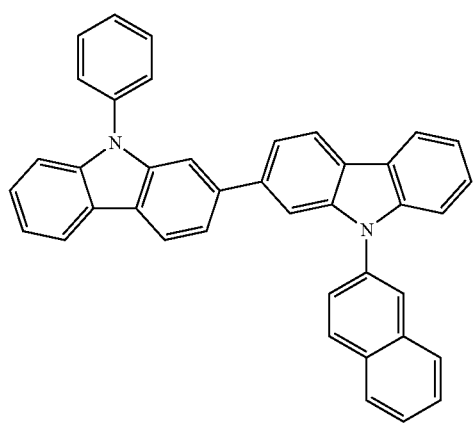
2-16
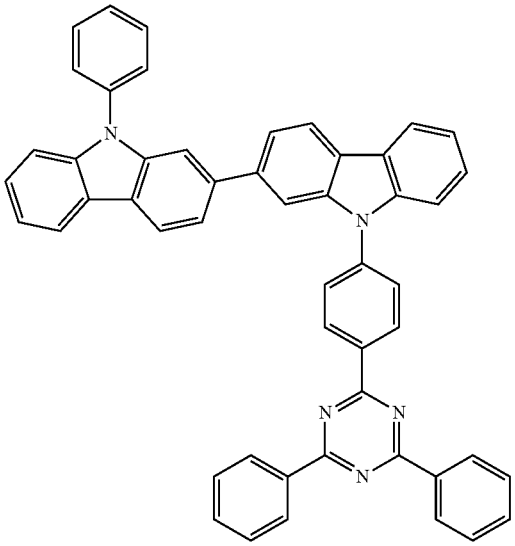
2-17
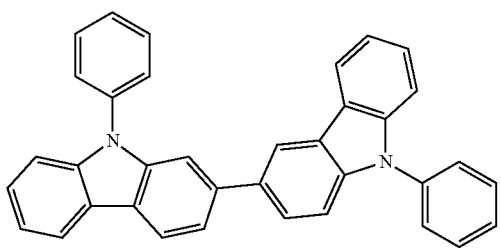
2-18
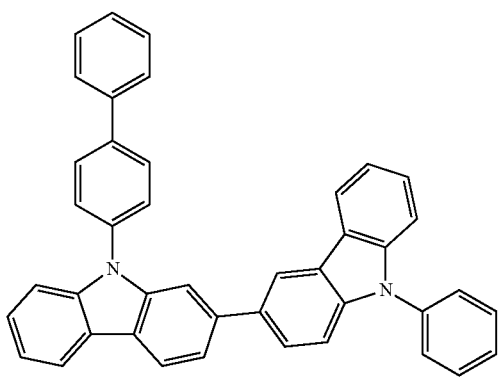
2-19
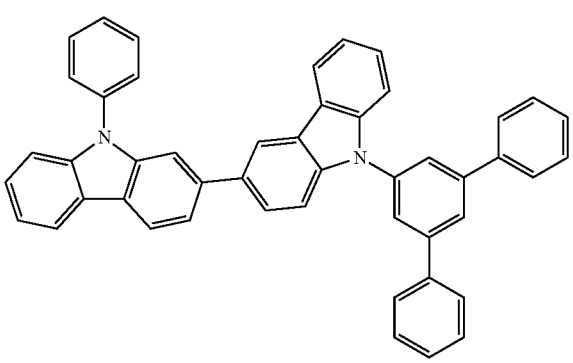

2-20

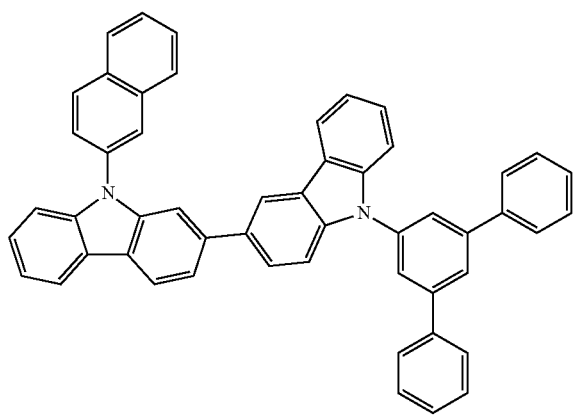

2-21

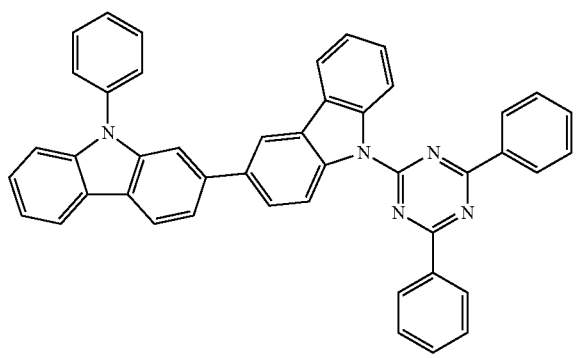

2-22

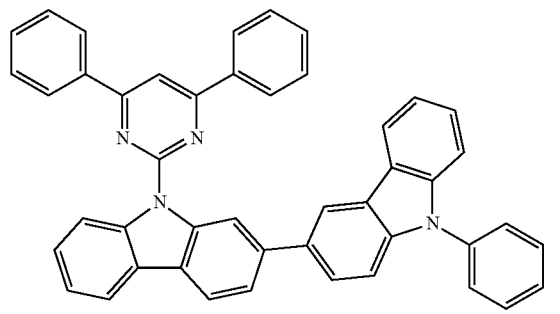

2-23

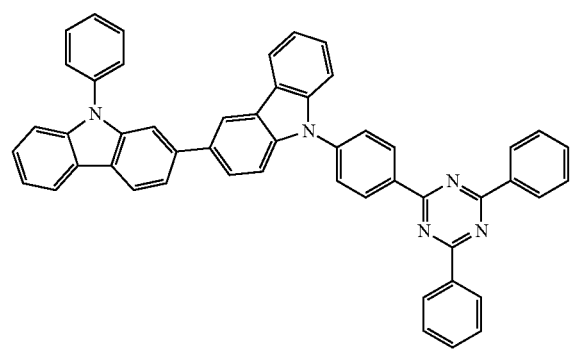

2-24

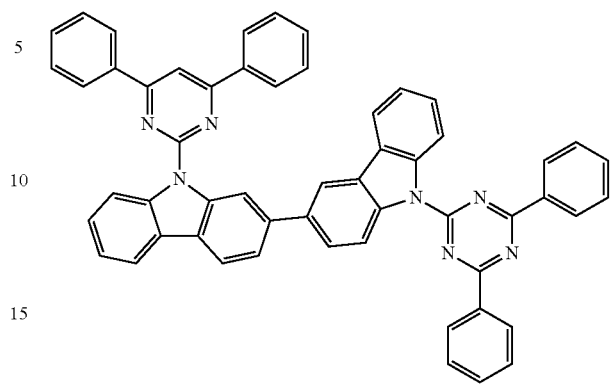

2-25

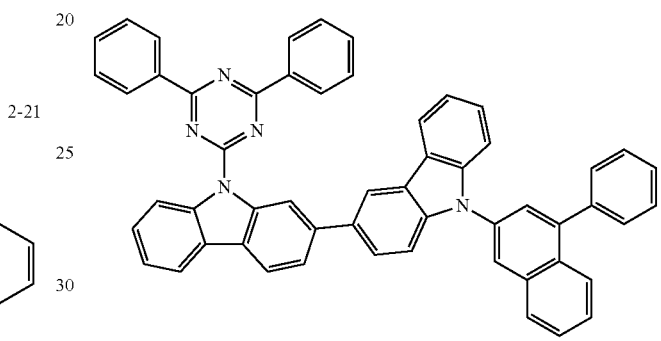

14. The organic light-emitting diode of claim 1, the hole migration region comprising a hole transport layer, the first compound being in the hole transport layer, the second compound being in the emission layer.

15. The organic light-emitting diode of claim 14, the first compound being a compound represented by one of Formulae 1A, 1B and 1C below, the second compound being a compound represented by one of Formulae 2A, 2B and 2C below:

<Formula 1A>

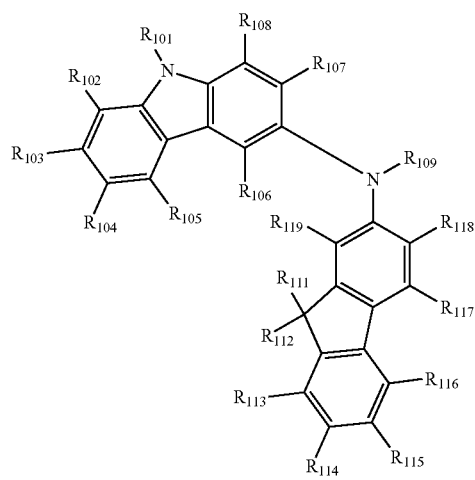

-continued

<Formula 1B>

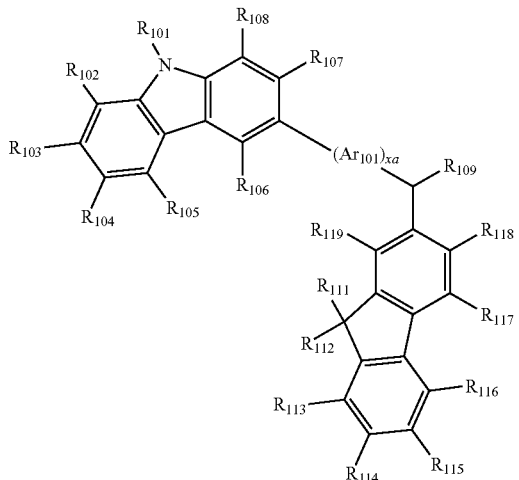

<Formula 1C>

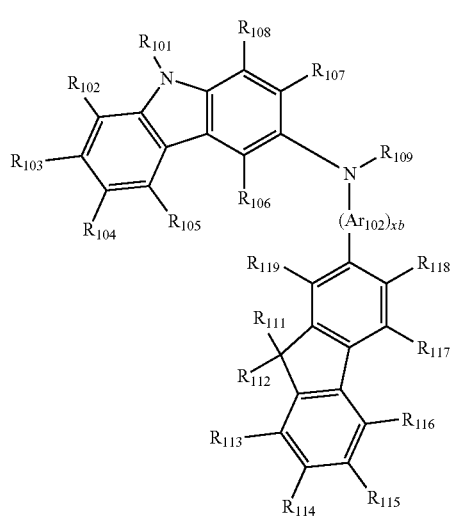

<Formula 2A>

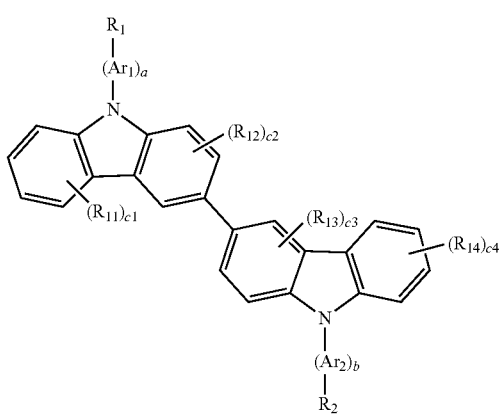

-continued

<Formula 2B>

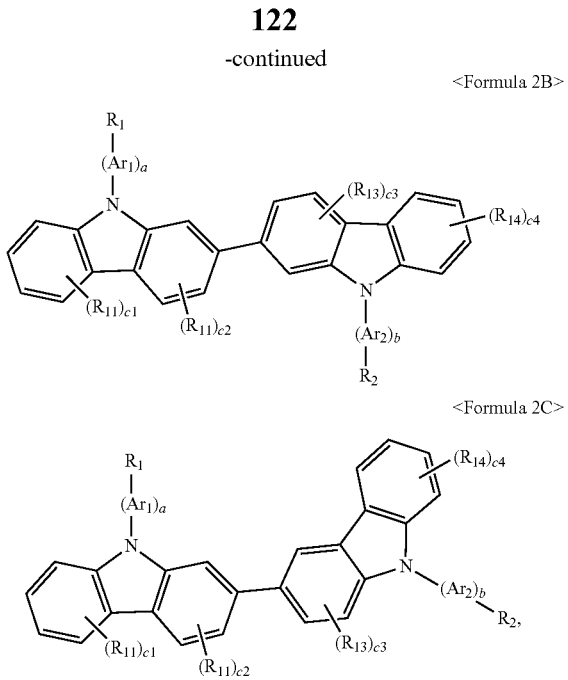

Ar$_{101}$ and Ar$_{102}$ in Formula 1A, 1B, and 1C each being independently a group represented by one of Formulae 4-1 to 4-7;

xa and xb in Formula 1A, 1B, and 1C each being independently 1 or 2;

R$_{101}$ in Formula 1A, 1B, and 1C being a group represented by one of Formulae 6-1 to 6-8;

R$_{109}$ in Formula 1A, 1B, and 1C being a group represented by one of Formulae 6-1 to 6-11;

R$_{111}$ and R$_{112}$ in Formula 1A, 1B, and 1C each being independently selected from a C$_1$-C$_{20}$ alkyl group; a C$_1$-C$_{20}$ alkyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phoshoric acid group or a salt thereof; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group; and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a C$_1$-C$_{20}$ alkyl group, a C$_1$-C$_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and R$_{102}$ to R$_{108}$ and R$_{113}$ to R$_{119}$ in Formula 1A, 1B, and 1C being hydrogen atoms, and Ar₁ and Ar₂ in Formulae 2A, 2B, and 2C each being independently a group represented by one of Formulae 4-1 to 4-7;

a and b in Formulae 2A, 2B, and 2C being defined by one of i) a=0 and b=0, ii) a=1 and b=0, iii) a=0 and b=1 and iv) a=1 and b=1;

R₁ and R₂ in Formulae 2A, 2B, and 2C each being independently a group represented by one of Formulae 6-1 to 6-17; and R₁₁ to R₁₄ in Formulae 2A, 2B, and 2C being hydrogen atoms:

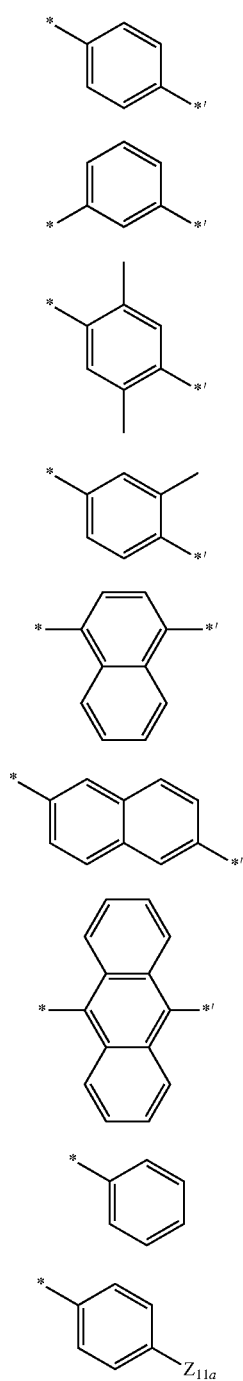

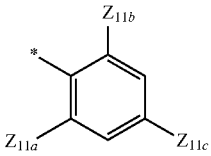

Formula 6-3

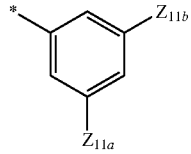

Formula 6-4

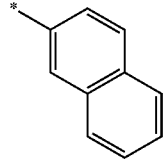

Formula 6-5

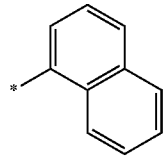

Formula 6-6

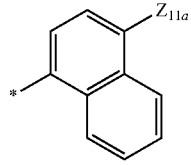

Formula 6-7

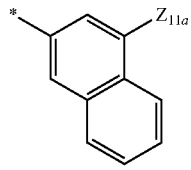

Formula 6-8

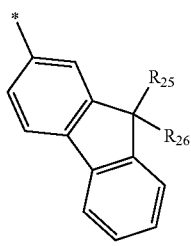

Formula 6-9

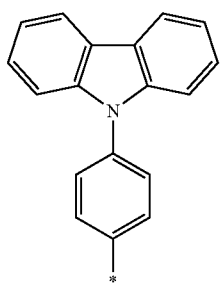

Formula 6-10

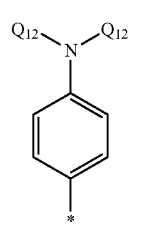

Formula 6-11

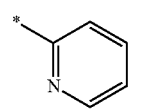

Formula 6-12

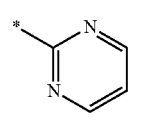

Formula 6-13

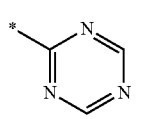

Formula 6-14

Formula 6-15

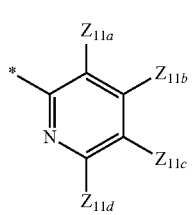

Formula 6-16

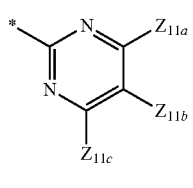

Formula 6-17

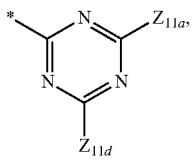

$Z_{11a}$ to $Z_{11d}$, and $R_{25}$ and $R_{26}$ in Formulae 6-1 to 6-17 each being independently selected from among:
a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;
a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phoshoric acid group or a salt thereof;
a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group; and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and $Q_{11}$ and $Q_{12}$ in Formula 6-11 each being independently one of a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group and an isoquinolyl group.

16. The organic light-emitting diode of claim 14, the first compound comprising one of Compounds 1-1 to 1-19 below, the second compound comprising one of Compounds 2-1 to 2-25 below:

1-1

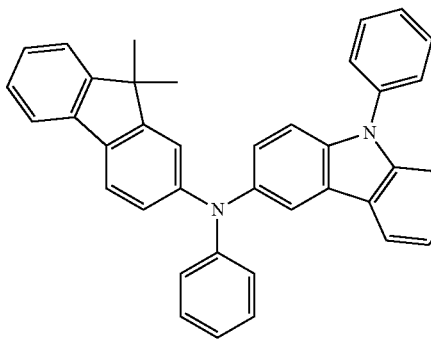

1-2

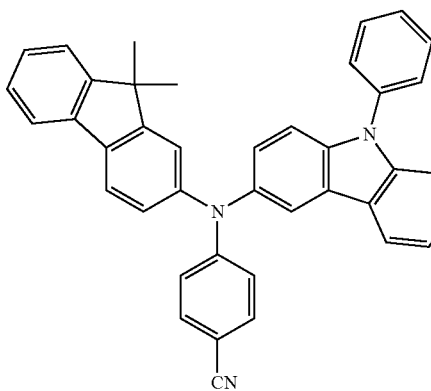

-continued
1-3
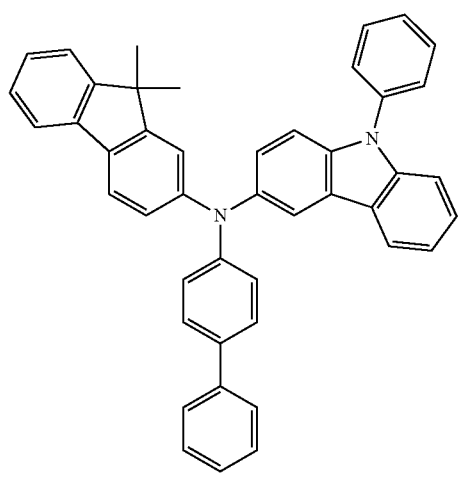
1-4
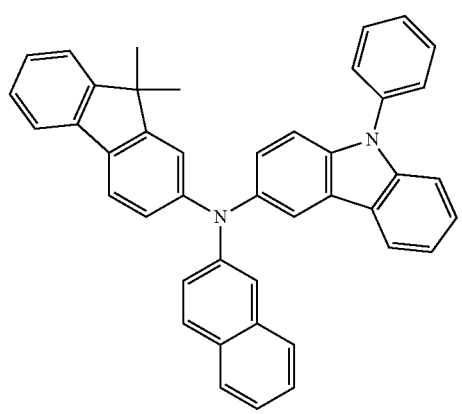
1-5
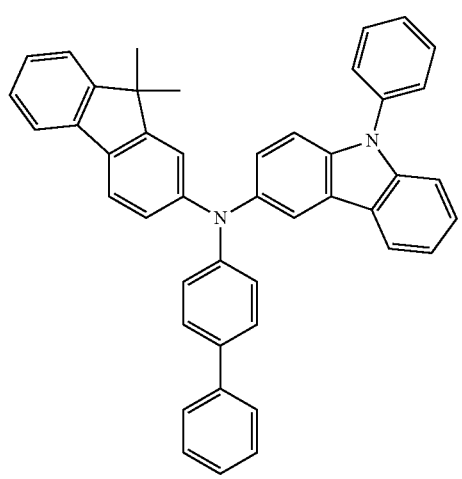
-continued
1-6
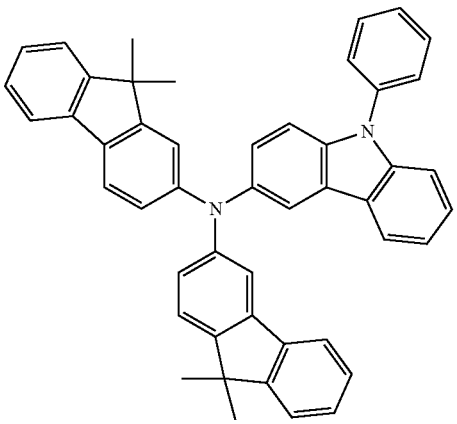
1-7
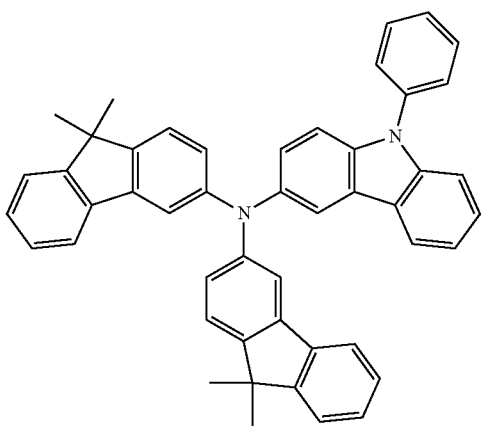
1-8
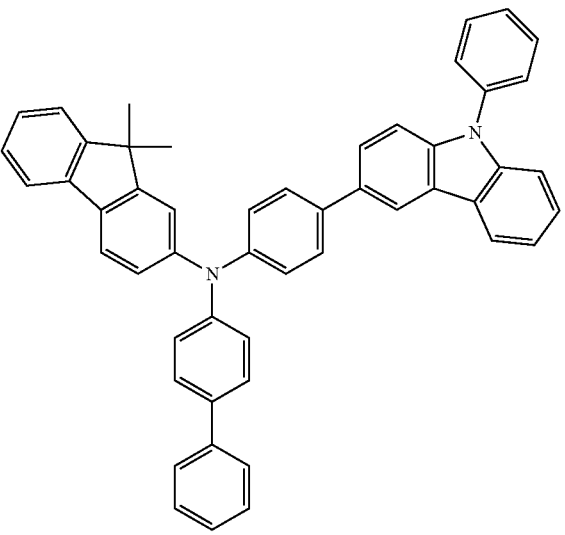

1-9
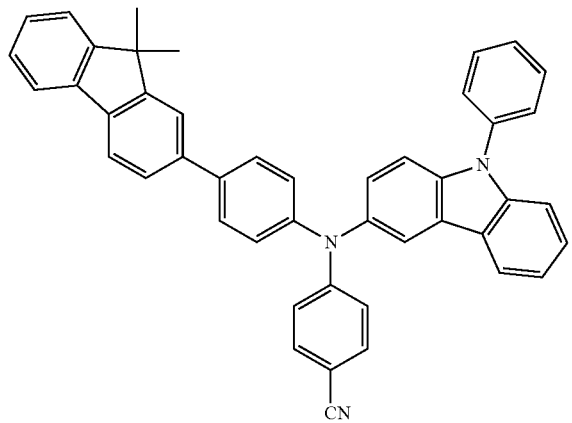
1-12
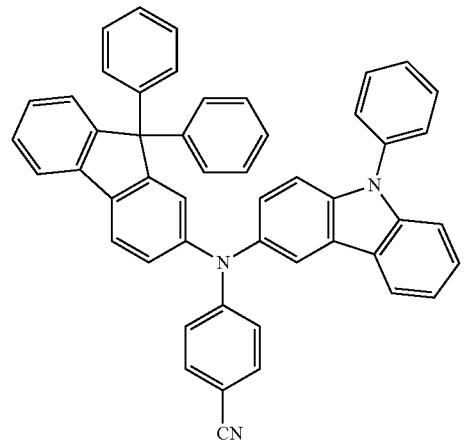
1-10
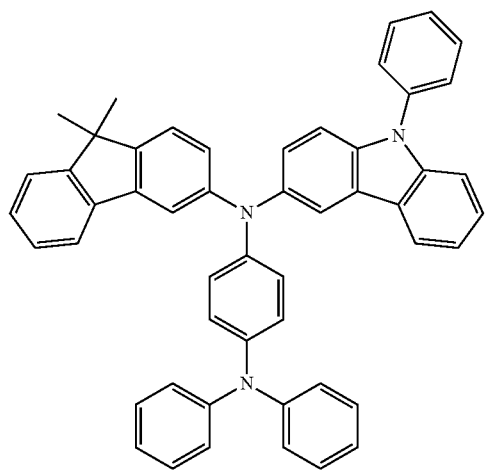
1-13
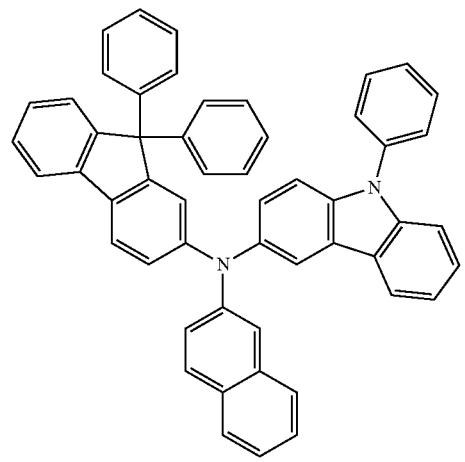
1-11
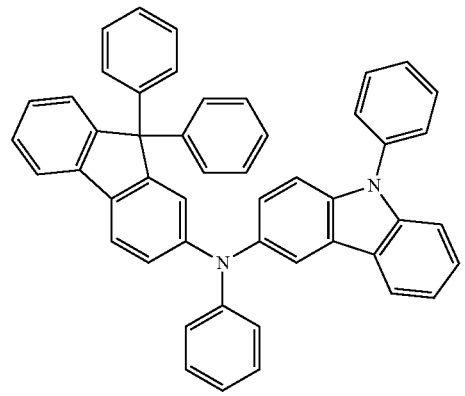
1-14
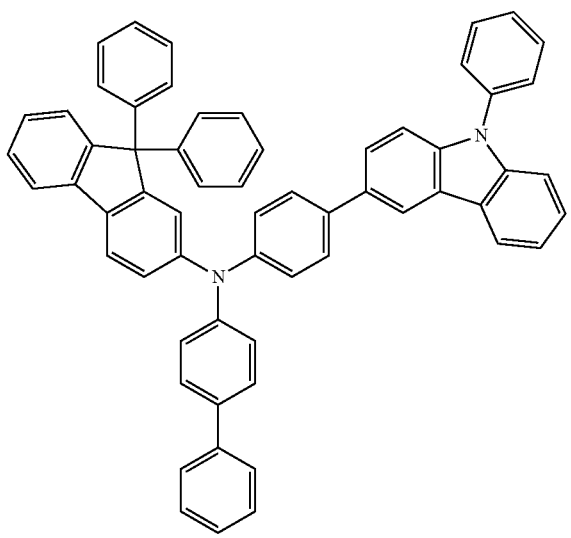

1-15
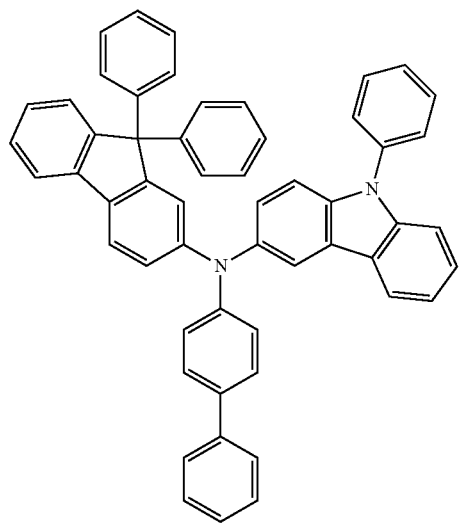
1-16
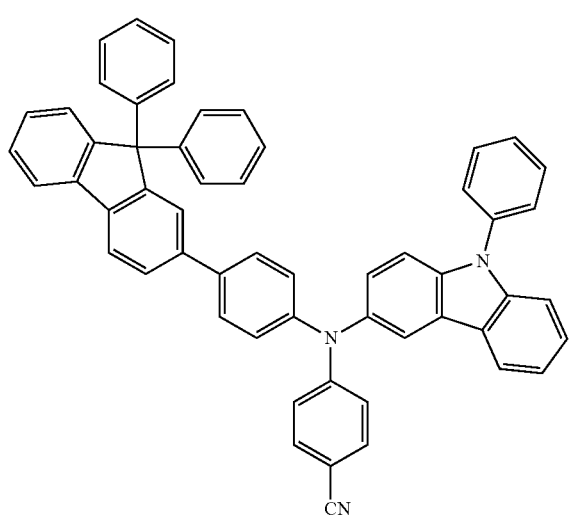
1-17
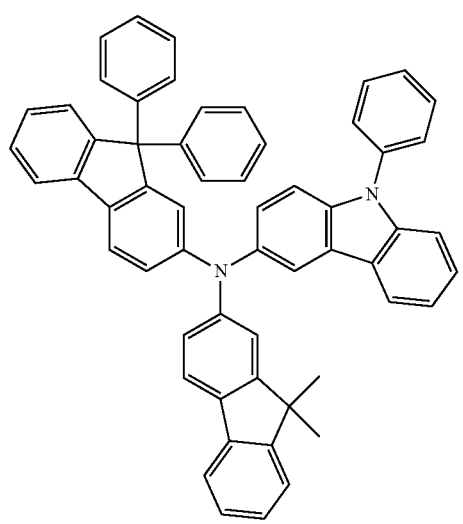
1-18
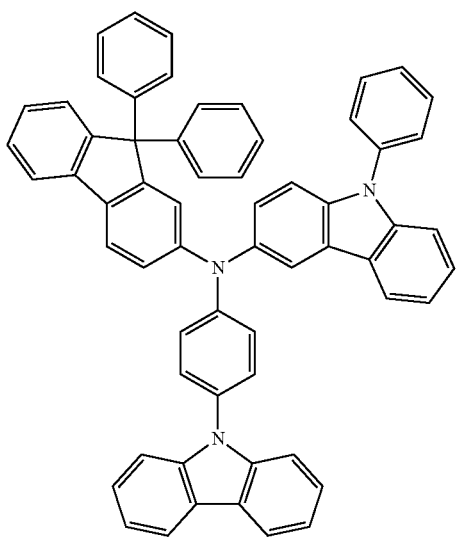
1-19
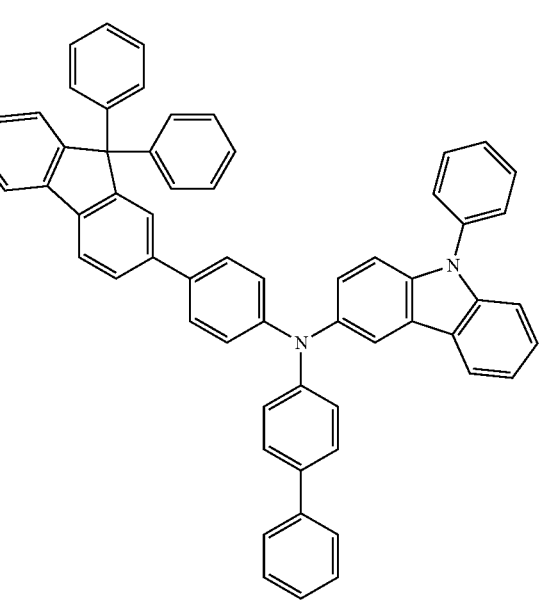
2-1
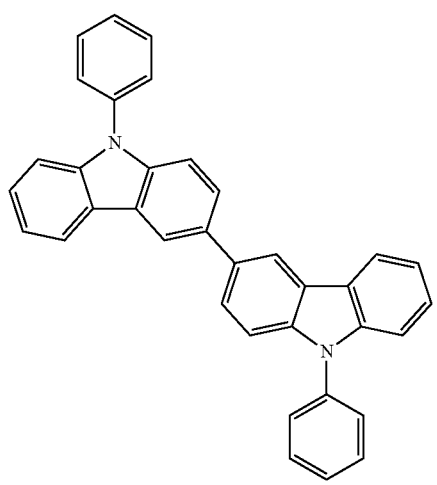

-continued
2-2
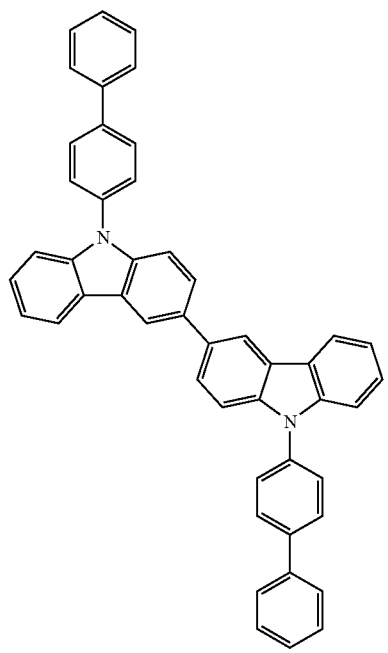
2-4
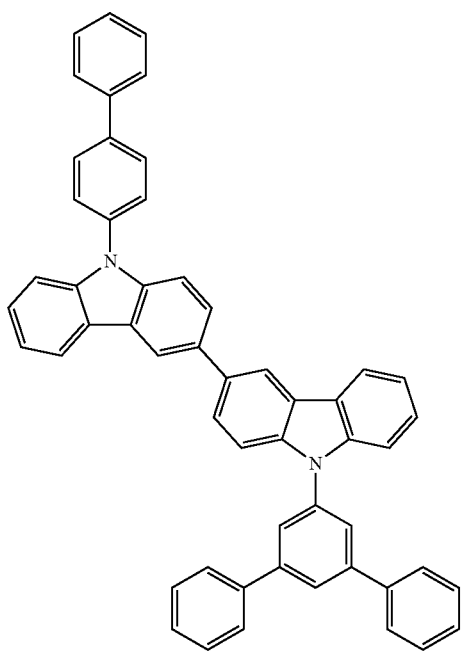
2-3
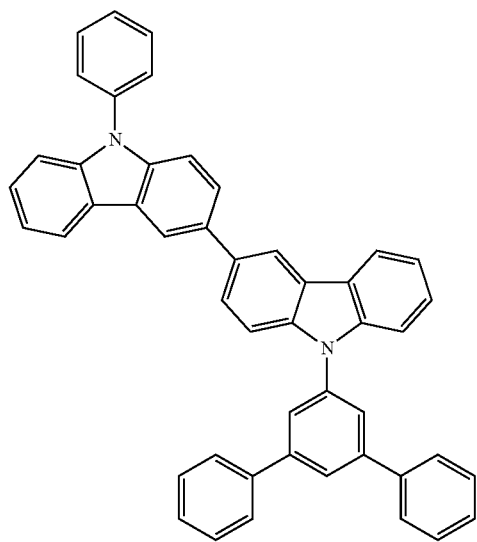
2-4
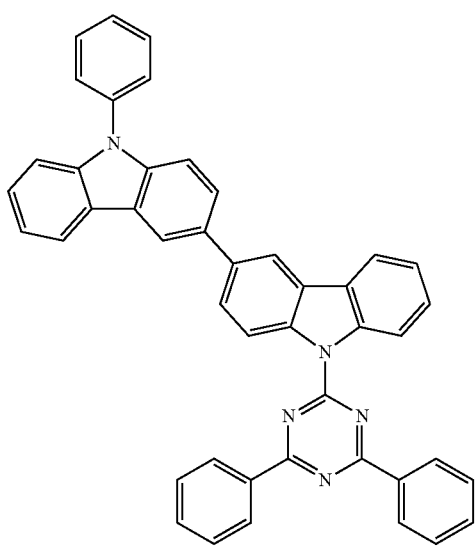

2-6
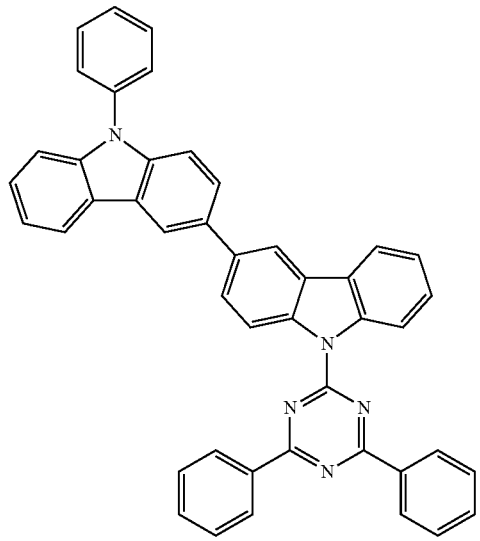
2-7
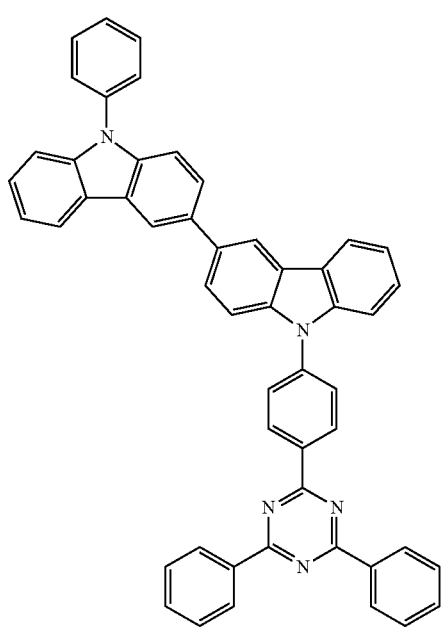
2-8
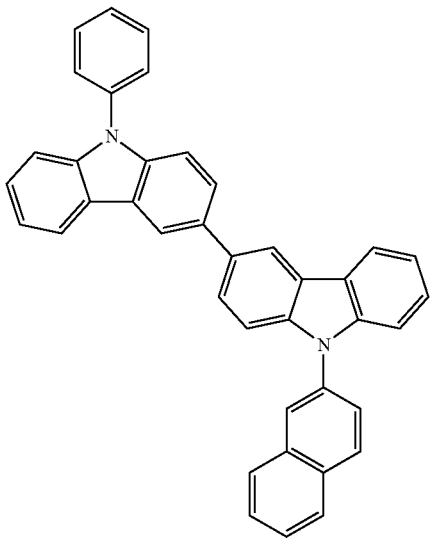
2-9
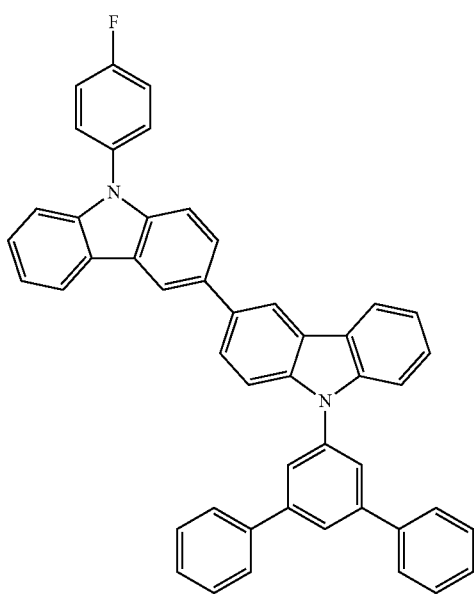

2-10
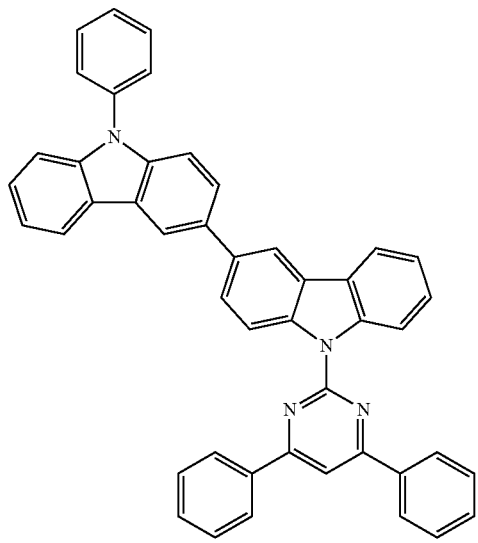
2-11
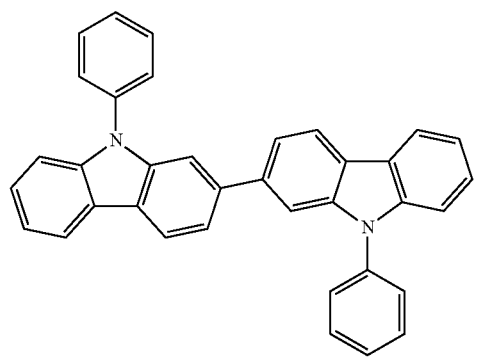
2-12
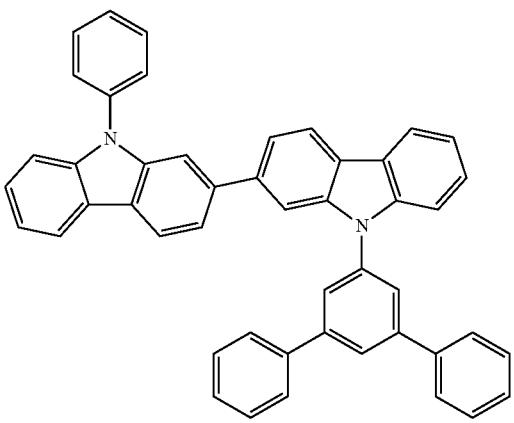
2-13
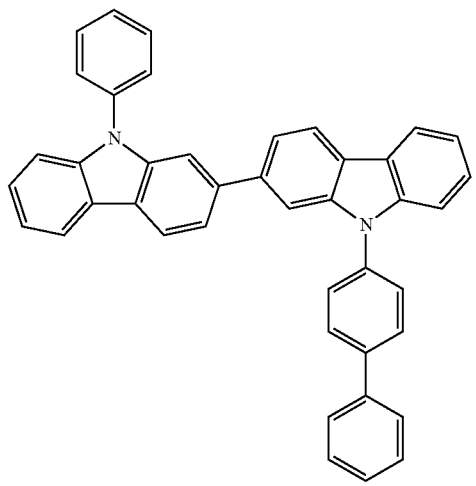
2-14
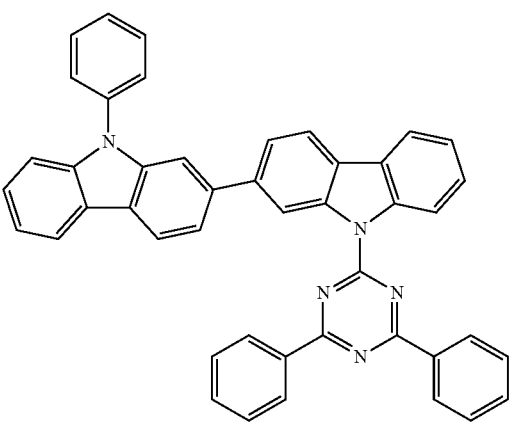
2-15
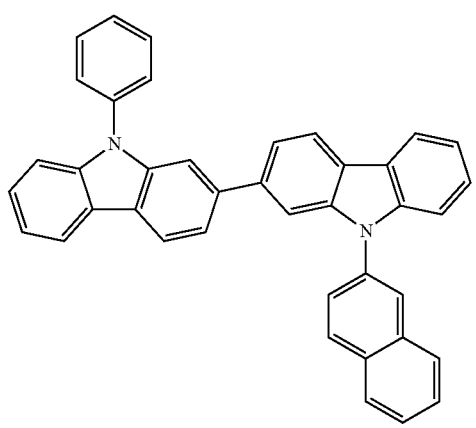

2-16
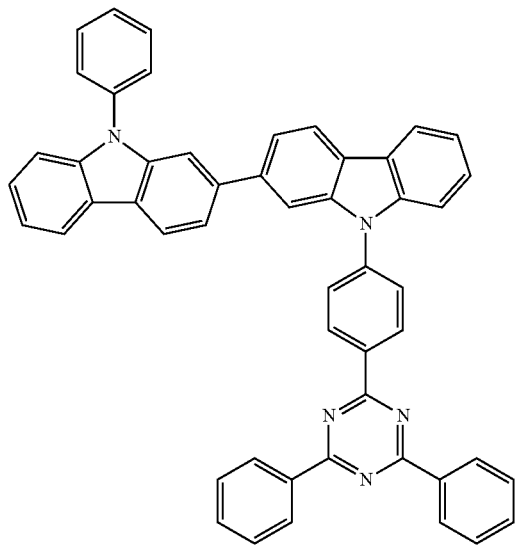
2-17
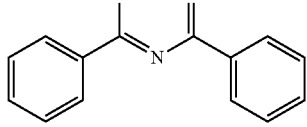
2-18
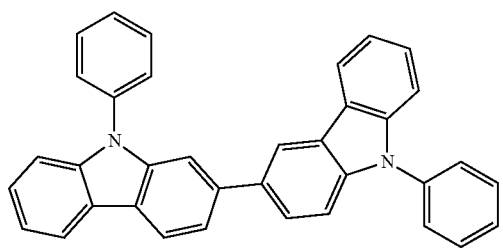
2-19
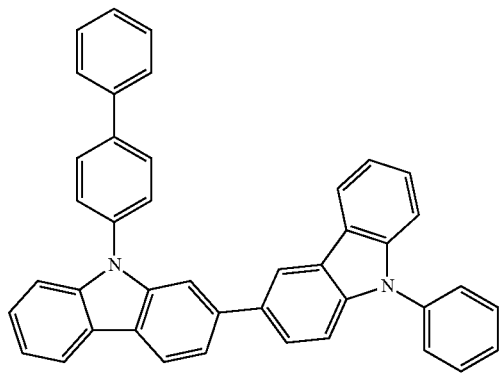
2-20
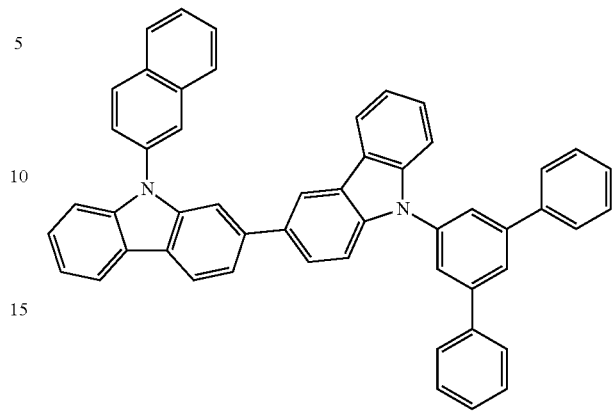
2-21
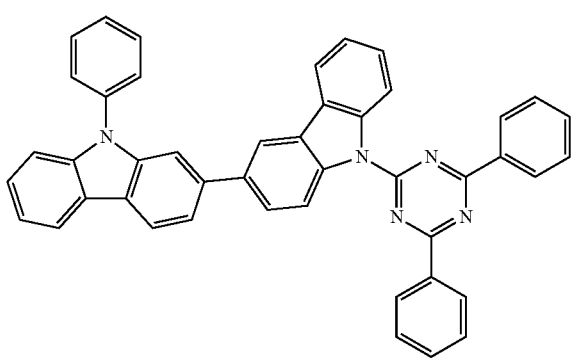
2-22
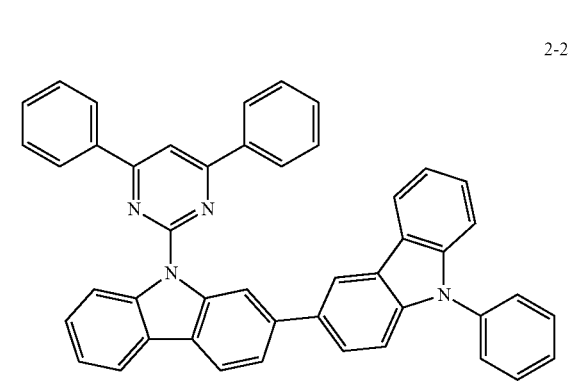
2-23
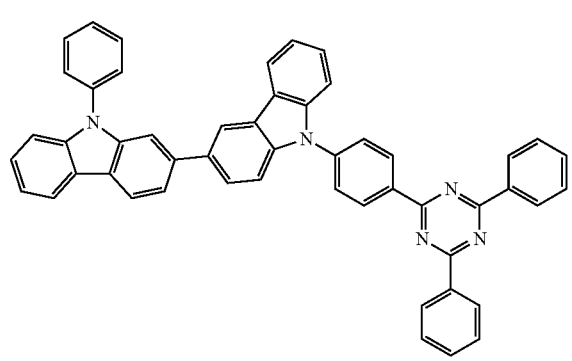

-continued 2-24

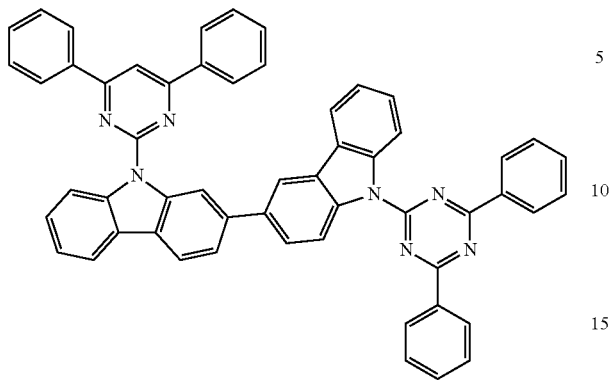

2-25

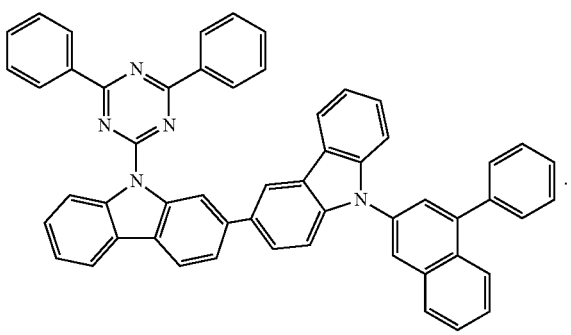

17. An organic light-emitting diode comprising:

a substrate; a first electrode on the substrate; a second electrode disposed opposite to the first electrode; an emission layer disposed between the first electrode and the second electrode; a hole migration region disposed between the first electrode and the emission layer; and an electron migration region disposed between the emission layer and the second electrode, the hole migration region comprising: i) a first hole transport layer, and ii) a second hole transport layer disposed between the first hole transport layer and the emission layer, the hole migration region comprising a first compound represented by Formula 1 below, the first compound being in the first hole transport layer, a second compound represented by Formula 2 below being in the second hole transport layer:

<Formula 1>

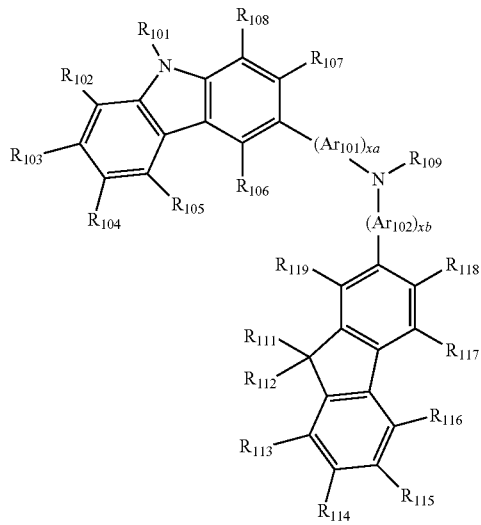

<Formula 2>

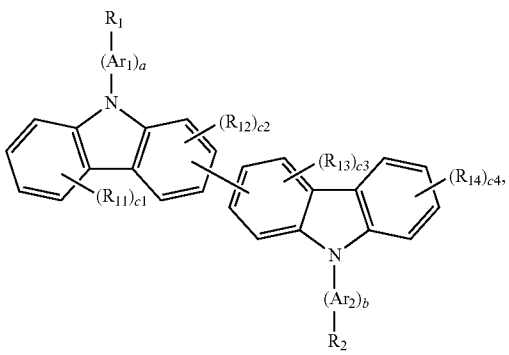

$Ar_{101}$, $Ar_{102}$, $Ar_1$, and $Ar_2$ in Formulae 1 and 2 each being independently selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, and a substituted or unsubstituted $C_2$-$C_{60}$ heteroarylene group;

xa, xb, a, and b in Formulae 1 and 2 each being independently an integer from 0 to 5;

$R_{101}$, $R_{109}$, $R_1$, and $R_2$ in Formulae 1 and 2 each being independently selected from a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{10}$ aryl group, and a substituted or unsubstituted $C_2$-$C_{60}$ heteroaryl group;

$R_{102}$ to $R_{108}$, $R_{111}$ to $R_{119}$, and $R_{11}$ to $R_{14}$ in Formulae 1 and 2 each being independently selected from: a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, —N($Q_1$)($Q_2$), and —Si($Q_3$)($Q_4$)($Q_5$) (where $Q_1$ to $Q_5$ are each independently one of a $C_1$-$C_{60}$ alkyl group, a $C_1$-$C_{60}$ alkoxy group, a $C_6$-$C_{60}$ aryl group, and a $C_2$-$C_{60}$ heteroaryl group);

c1 and c4 in Formula 2 each being independently an integer from 1 to 4; and c2 and c3 in Formula 2 each being independently an integer from 1 to 3.

18. The organic light-emitting diode of claim 17, the second compound being in the emission layer.

19. The organic light-emitting diode of claim 17, the first compound being a compound represented by one of Formulae 1A, 1B and 1C below, the second compound being a compound represented by one of Formulae 2A, 2B and 2C below:

<Formula 1A>

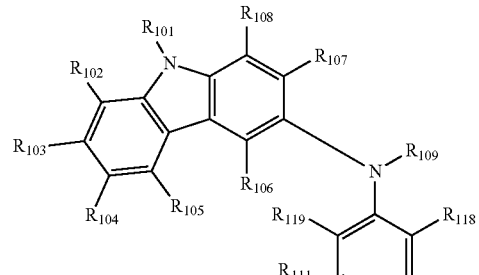

<Formula 1B>

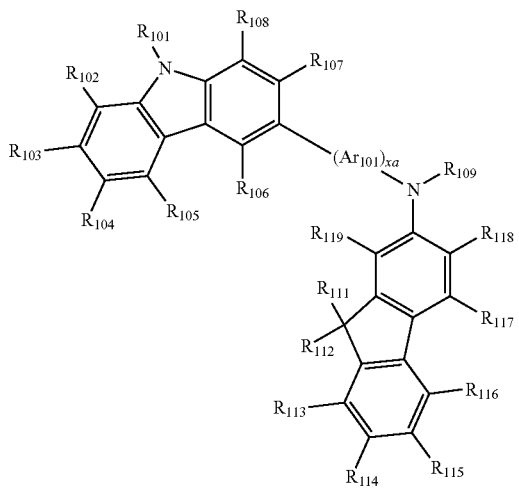

<Formula 1C>

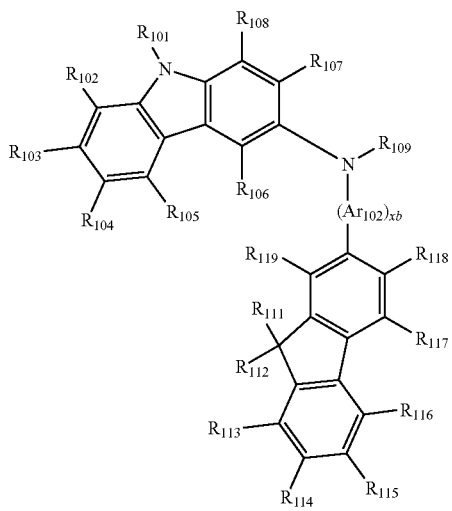

<Formula 2A>

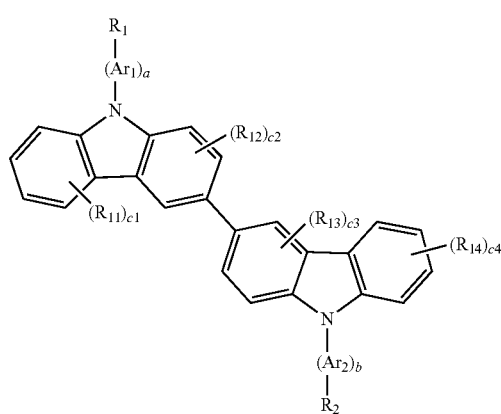

<Formula 2B>

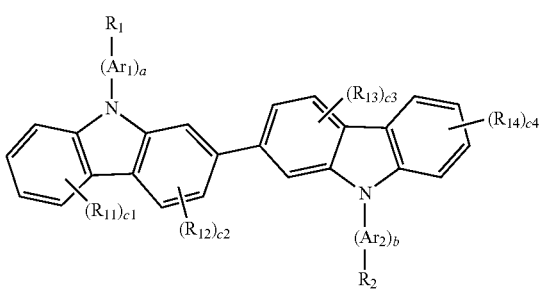

<Formula 2C>

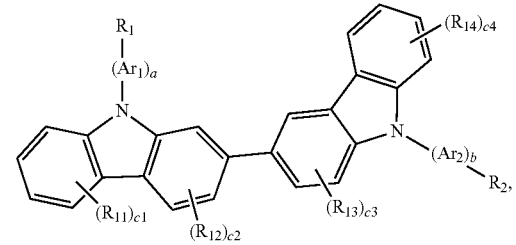

$Ar_{101}$ and $Ar_{102}$ in Formula 1A, 1B, and 1C each being independently a group represented by one of Formulae 4-1 to 4-7;

xa and xb in Formula 1A, 1B, and 1C each being independently 1 or 2;

$R_{101}$ in Formula 1A, 1B, and 1C being a group represented by one of Formulae 6-1 to 6-8;

$R_{109}$ in Formula 1A, 1B, and 1C being a group represented by one of Formulae 6-1 to 6-11;

$R_{111}$ and $R_{112}$ in Formula 1A, 1B, and 1C each being independently selected from a $C_1$-$C_{20}$ alkyl group; a $C_1$-$C_{20}$ alkyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phoshoric acid group or a salt thereof; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group; and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and $R_{102}$ to $R_{108}$ and $R_{113}$ to $R_{119}$ in Formula 1A, 1B, and 1C being hydrogen atoms, and, $Ar_1$ and $Ar_2$ in Formulae 2A, 2B, and 2C each being independently a group represented by one of Formulae 4-1 to 4-7;

a and b in Formulae 2A, 2B, and 2C being defined by one of i) a=0 and b=0, ii) a=1 and b=0, iii) a=0 and b=1 and iv) a=1 and b=1;

$R_1$ and $R_2$ in Formulae 2A, 2B, and 2C each being independently a group represented by one of Formulae 6-1 to 6-17; and $R_{11}$ to $R_{14}$ being hydrogen atoms:

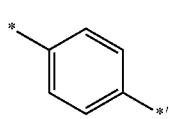

Formula 4-1

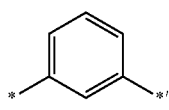

Formula 4-2

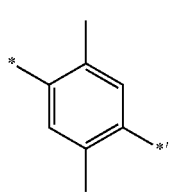

Formula 4-3

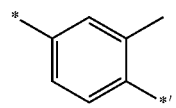

Formula 4-4

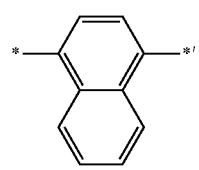

Formula 4-5

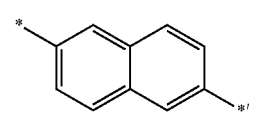

Formula 4-6

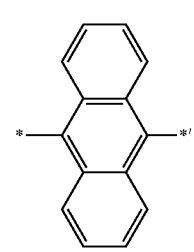

Formula 4-7

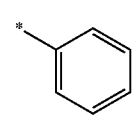

Formula 6-1

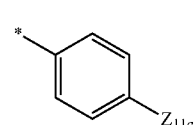

Formula 6-2

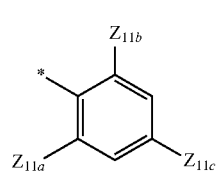

Formula 6-3

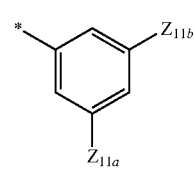

Formula 6-4

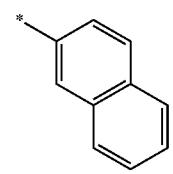

Formula 6-5

Formula 6-6

-continued

Formula 6-7

Formula 6-8

Formula 6-9

Formula 6-10

Formula 6-11

Formula 6-12

Formula 6-13

Formula 6-14

-continued

Formula 6-15

Formula 6-16

Formula 6-17

$Z_{11a}$, to $Z_{11d}$, and $R_{25}$ and $R_{26}$ in Formulae 6-1 to 6-17 each being independently selected from among:

a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phoshoric acid group or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group; and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and $Q_{11}$ and $Q_{12}$ are each independently one of a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group and an isoquinolyl group.
20. The organic light-emitting diode of claim 17, the first compound comprising one of Compounds 1-1 to 1-19 below, the second compound comprising one of Compounds 2-1 to 2-25 below:
1-1
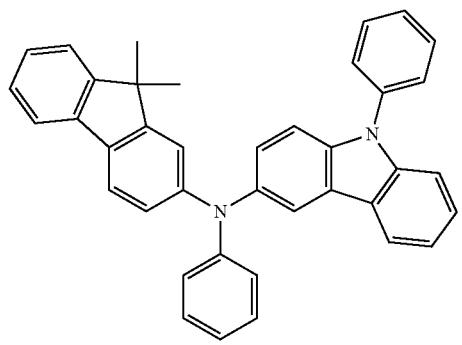
1-2
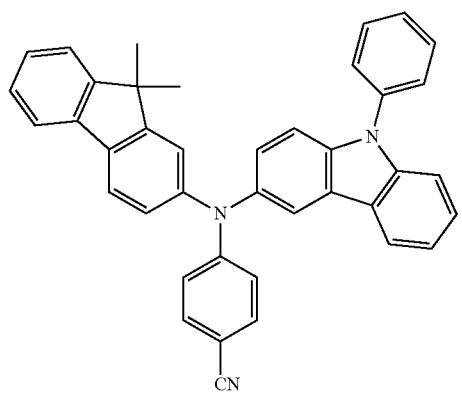
1-3
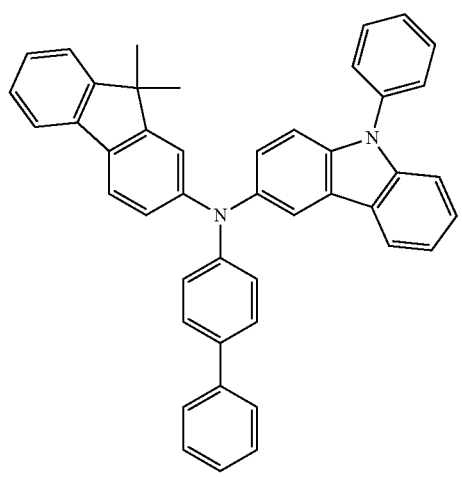
1-4
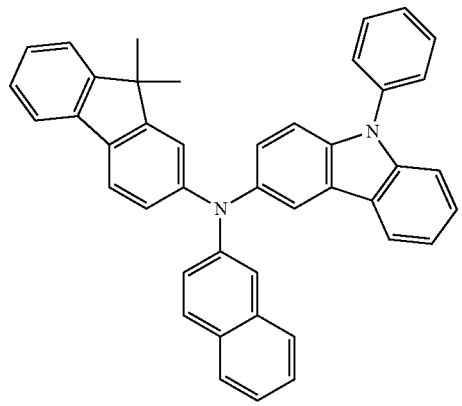
1-5
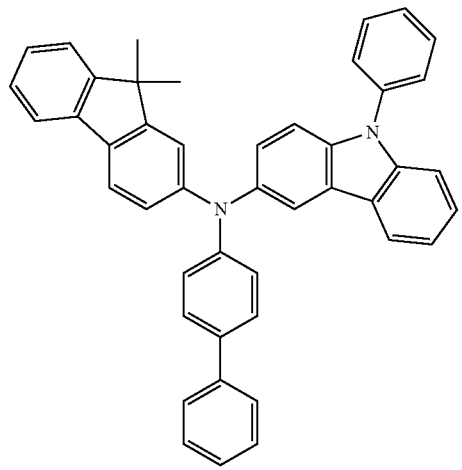
1-6
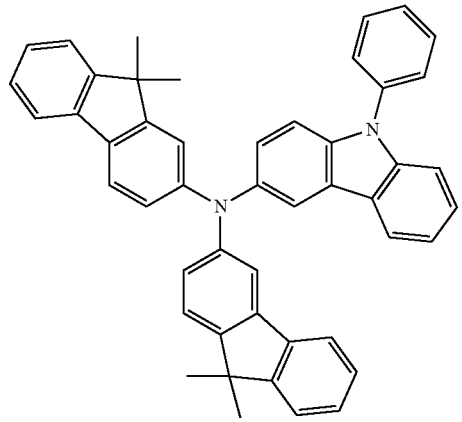

-continued
1-7
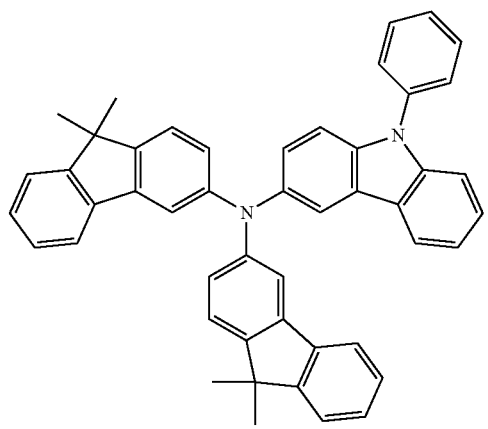
1-8
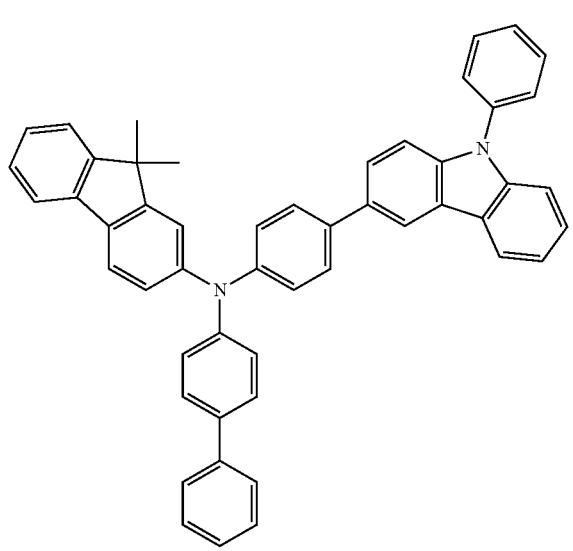
1-9
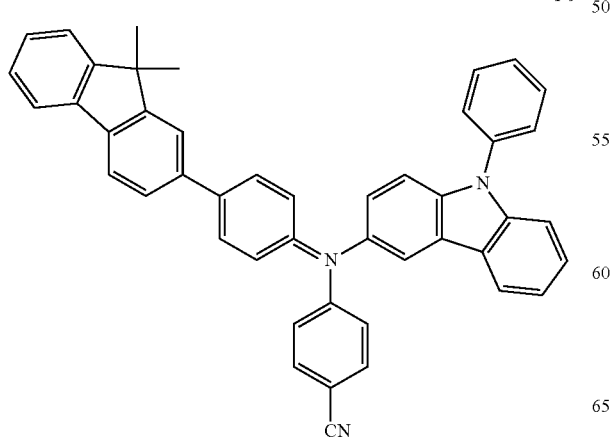
-continued
1-10
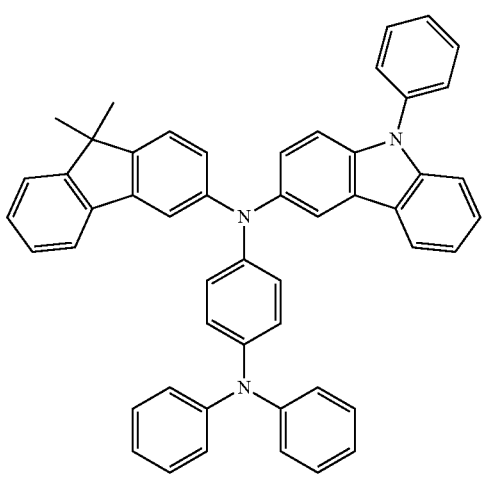
1-11
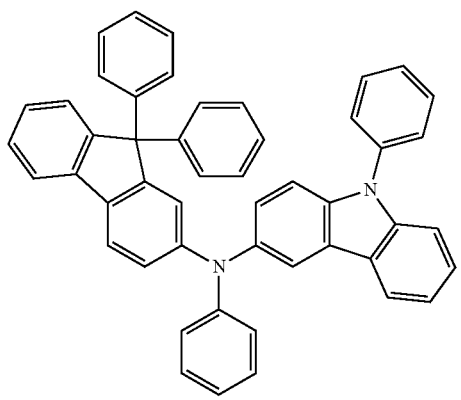
1-12
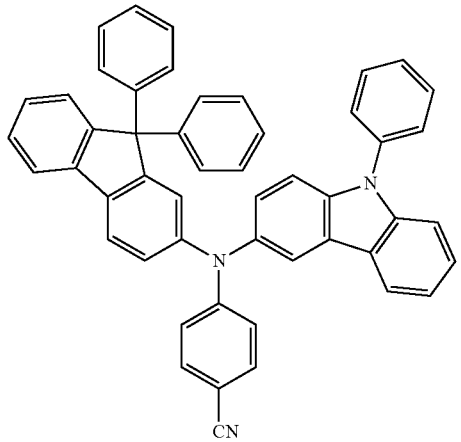

1-13
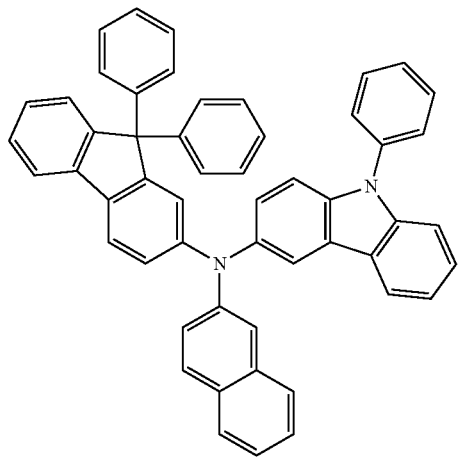
1-16
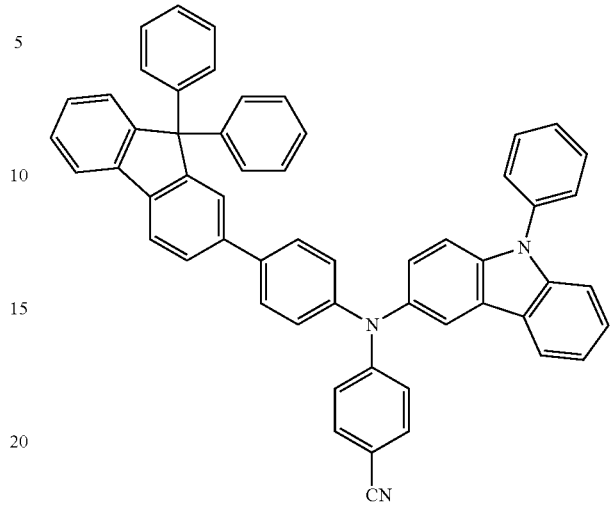
1-14
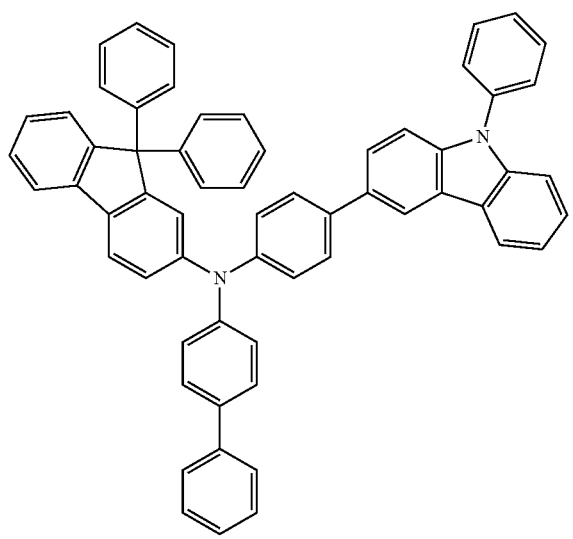
1-17
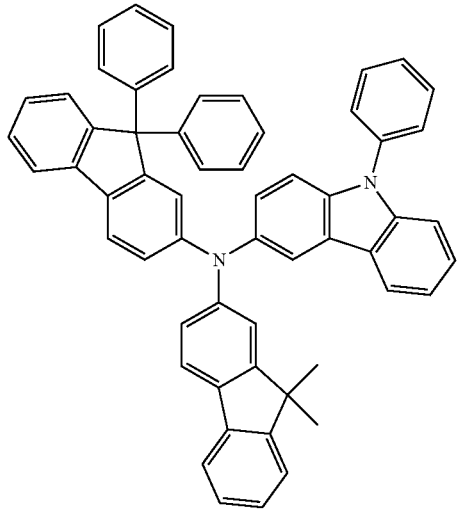
1-15
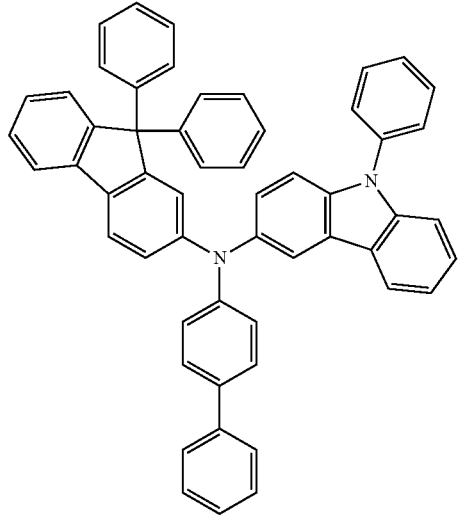
1-18
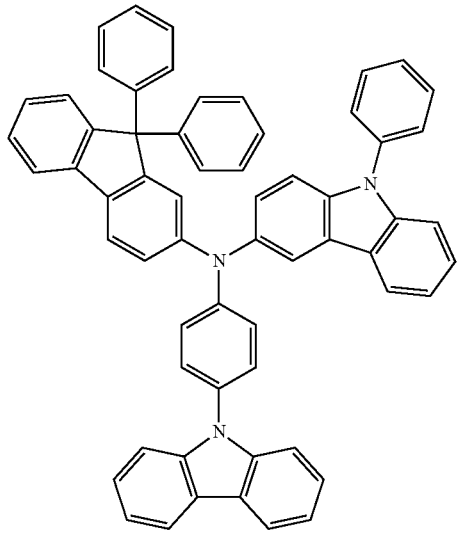

1-19
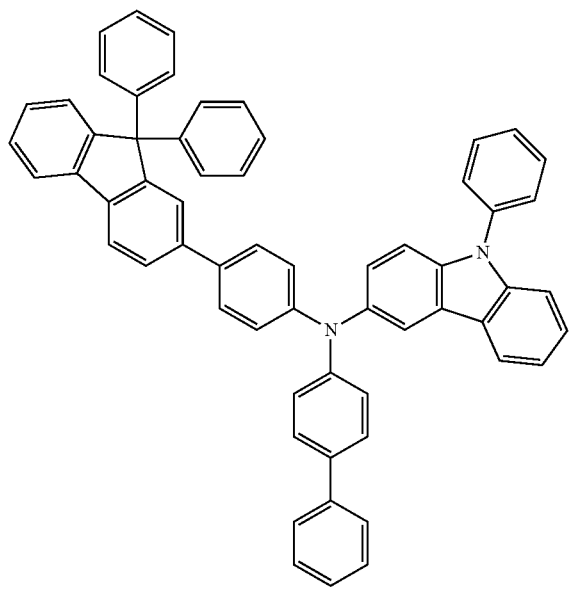
2-2
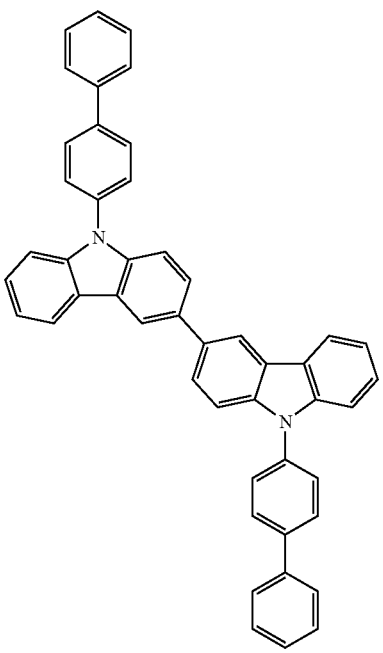
2-1
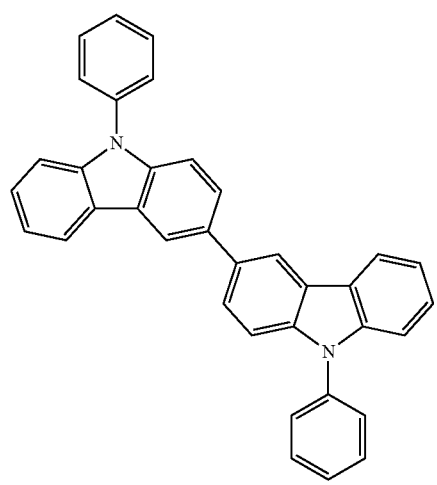
2-3
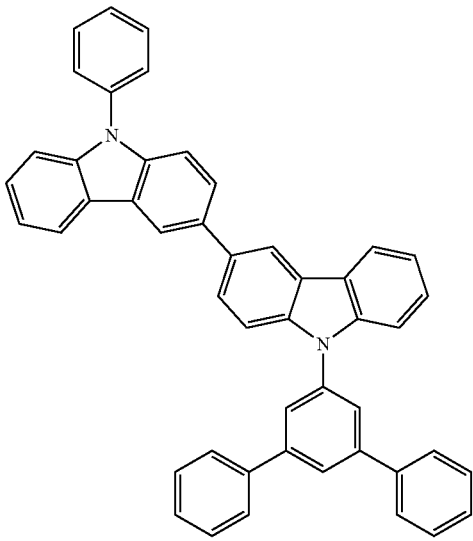

2-4
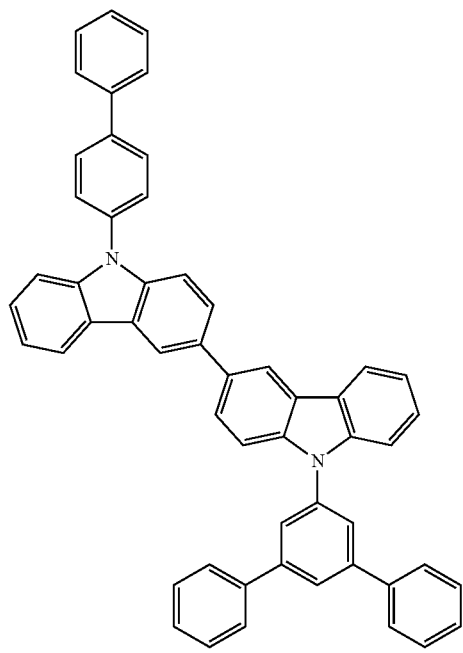
2-6
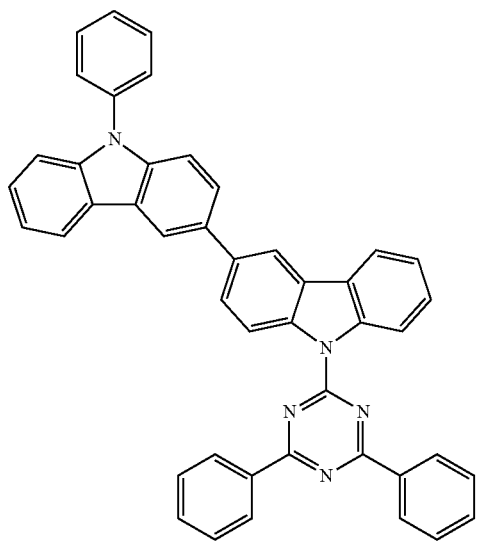
2-4
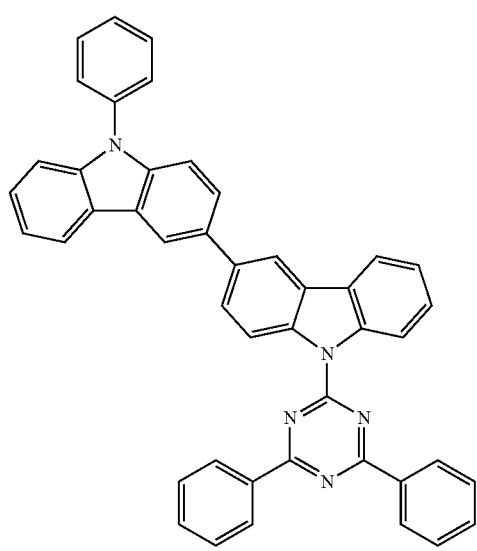
2-7
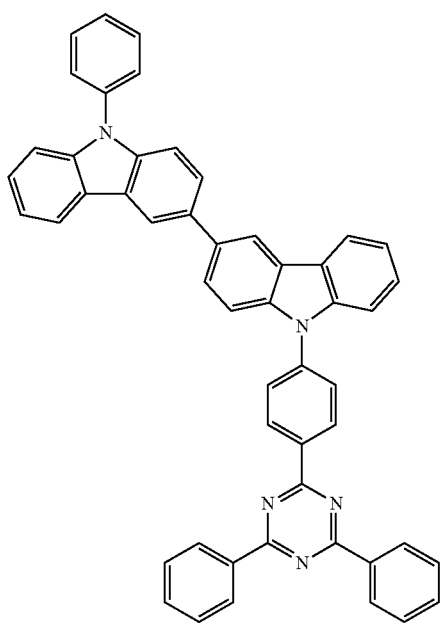

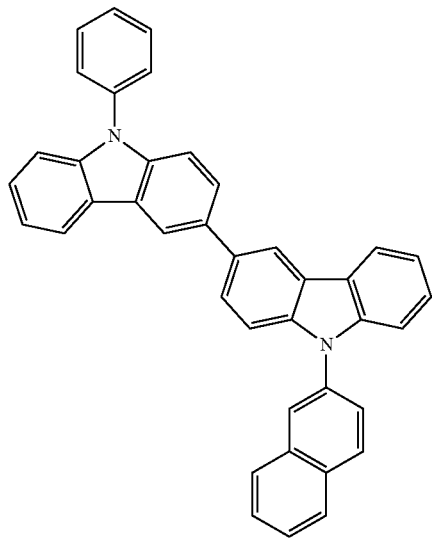
2-8
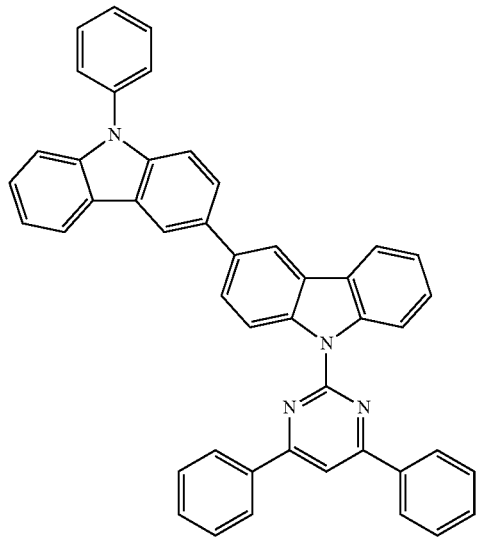
2-10
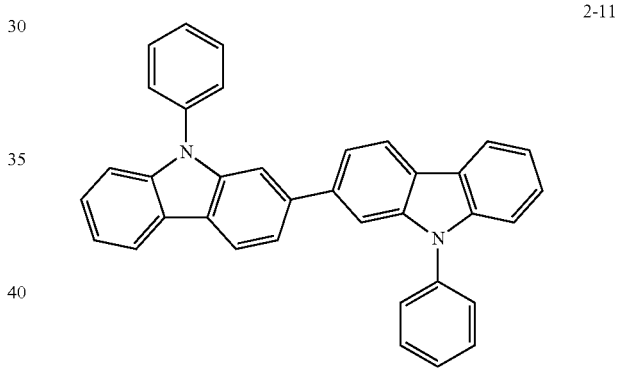
2-11
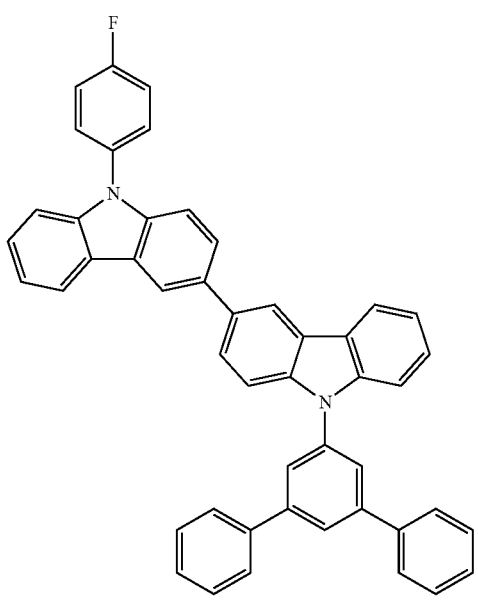
2-9
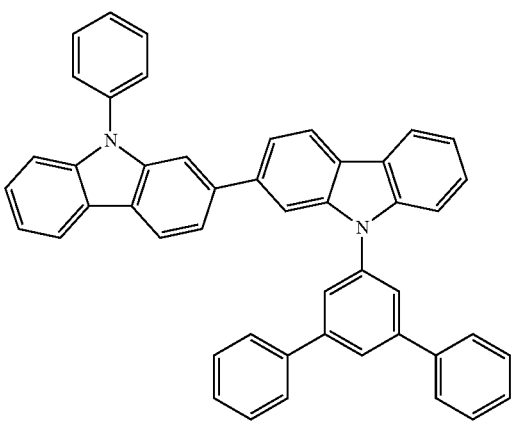
2-12

2-13
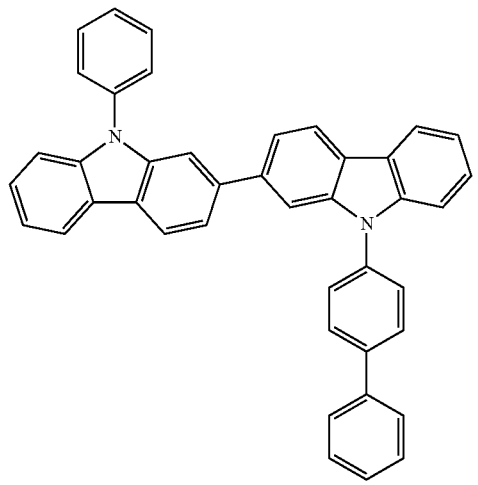
2-14
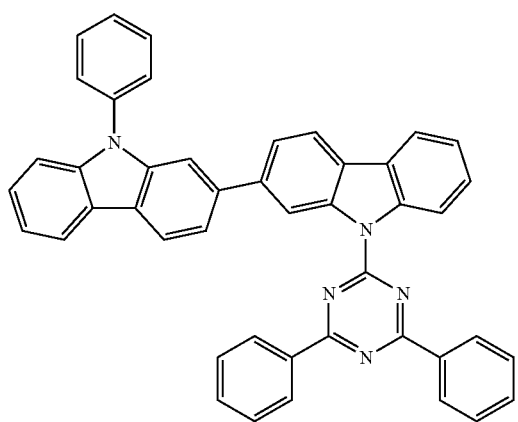
2-15
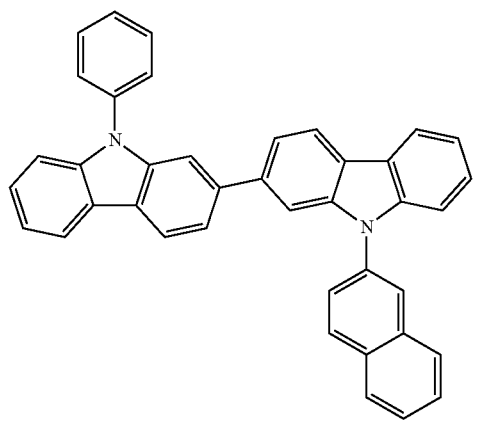
2-16
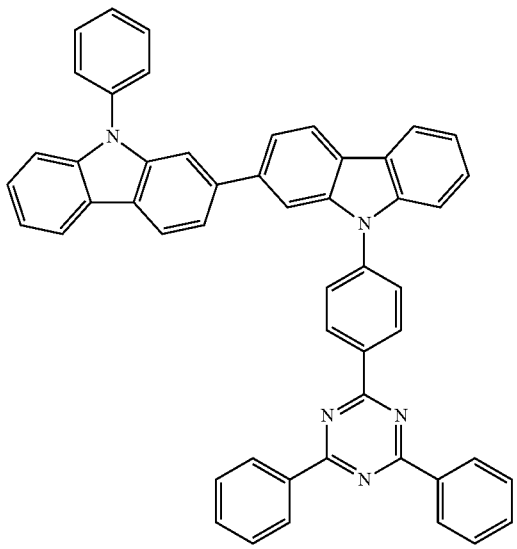
2-17
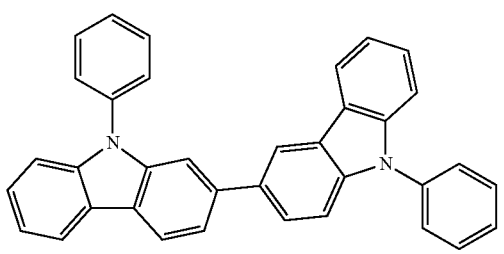
2-18
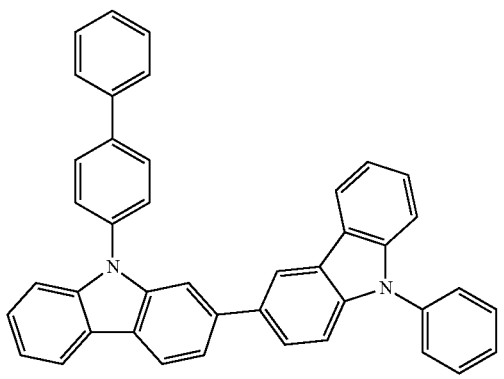
2-19
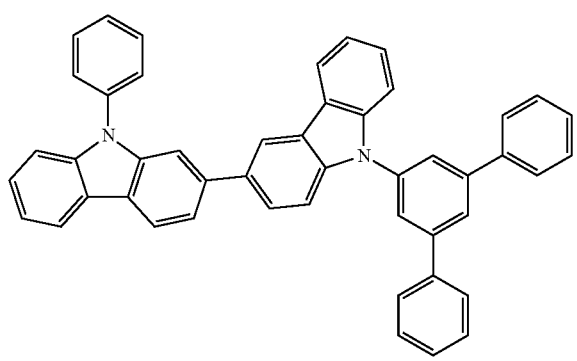

2-20
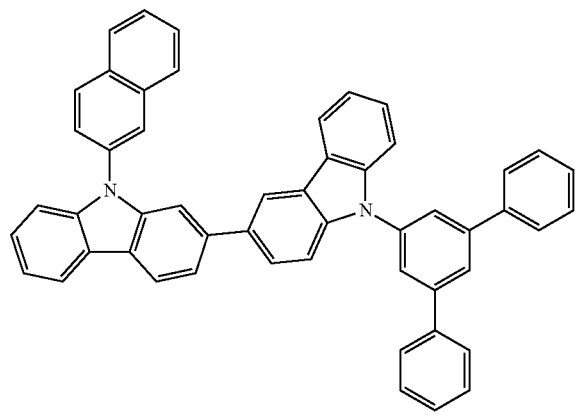
2-23
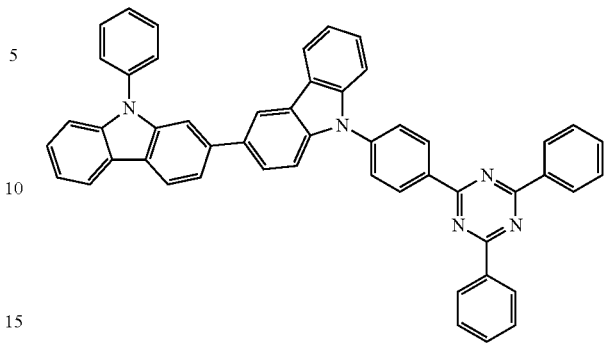
2-21
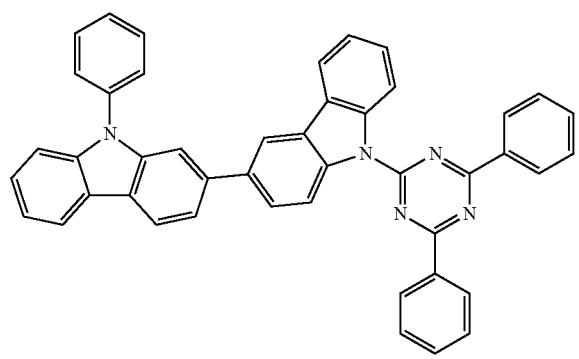
2-24
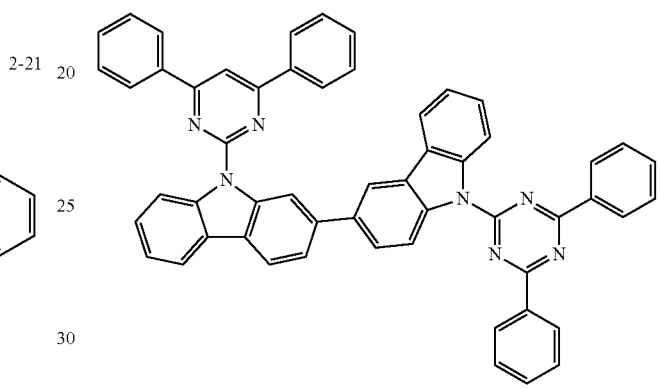
2-22
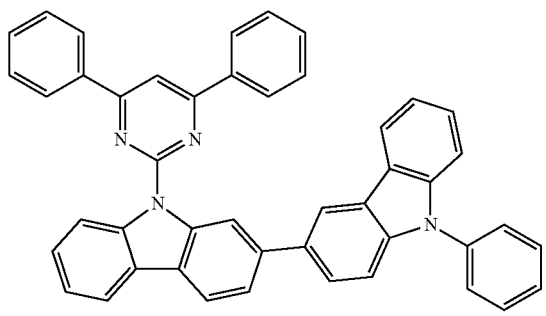
2-25
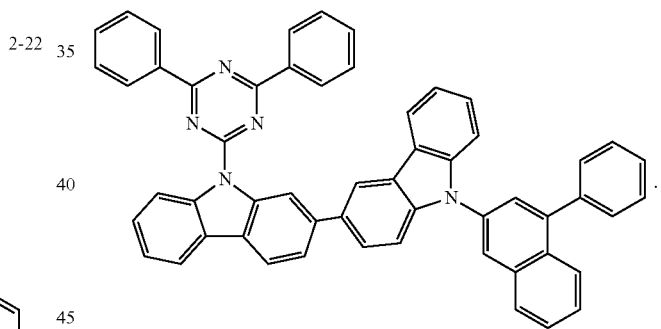
* * * * *